US008828782B2

(12) United States Patent
Fujdala et al.

(10) Patent No.: US 8,828,782 B2
(45) Date of Patent: Sep. 9, 2014

(54) ANNEALING PROCESSES FOR PHOTOVOLTAICS

(75) Inventors: Kyle L. Fujdala, San Jose, CA (US);
Zhongliang Zhu, San Jose, CA (US);
David Padowitz, Mountain View, CA (US); Paul R. Markoff Johnson, Sunnyvale, CA (US); Wayne A. Chomitz, Santa Monica, CA (US);
Matthew C. Kuchta, San Francisco, CA (US)

(73) Assignee: Precursor Energetics, Inc., Santa Clara, CA (US)

( * ) Notice: Subject to any disclaimer, the term of this patent is extended or adjusted under 35 U.S.C. 154(b) by 208 days.

(21) Appl. No.: 13/234,055

(22) Filed: Sep. 15, 2011

(65) Prior Publication Data
US 2012/0067424 A1    Mar. 22, 2012

Related U.S. Application Data

(60) Provisional application No. 61/383,292, filed on Sep. 15, 2010, provisional application No. 61/439,735, filed on Feb. 4, 2011, provisional application No. 61/498,383, filed on Jun. 17, 2011.

(51) Int. Cl.
| | |
|---|---|
| *H01L 31/18* | (2006.01) |
| *H01L 21/02* | (2006.01) |
| *H01L 27/142* | (2014.01) |
| *H01L 31/0224* | (2006.01) |
| *H01L 31/0392* | (2006.01) |
| *H01L 31/032* | (2006.01) |
| *H01L 31/0272* | (2006.01) |

(52) U.S. Cl.
CPC .. *H01L 31/022425* (2013.01); *H01L 21/02581* (2013.01); *H01L 21/02601* (2013.01); *H01L 21/02568* (2013.01); *Y02E 10/541* (2013.01); *H01L 21/02491* (2013.01); *Y02E 10/52* (2013.01); *H01L 27/1423* (2013.01); *H01L 31/03923* (2013.01); *H01L 21/02579* (2013.01); *H01L 21/02576* (2013.01); *H01L 21/02485* (2013.01); *H01L 31/0322* (2013.01); *H01L 21/02628* (2013.01); *H01L 21/0237* (2013.01); *H01L 21/0251* (2013.01)
USPC ............... 438/84; 136/264; 257/E21.071

(58) Field of Classification Search
USPC ............... 438/84, 95; 136/264; 257/E21.068, 257/E21.071
See application file for complete search history.

(56) References Cited

U.S. PATENT DOCUMENTS

| | | | |
|---|---|---|---|
| 2,514,981 A | 7/1950 | Walker | |
| 2,739,079 A * | 3/1956 | Keck | ............... 427/76 |

(Continued)

FOREIGN PATENT DOCUMENTS

| | | |
|---|---|---|
| EP | 0534459 A2 | 3/1993 |
| JP | 10-273783 A | 10/1998 |

(Continued)

OTHER PUBLICATIONS

Han et al., Effect of Cu Deficiency on CuIn1-xGaxSe2 and High-efficiency Photovoltaic Solar Cells, Mater. Res. Soc. Symp. Proc., vol. 865, 2005, pp. F1.3.1-F1.3.6.*

(Continued)

*Primary Examiner* — Earl Taylor
(74) *Attorney, Agent, or Firm* — Eckman Basu LLP

(57) ABSTRACT

Processes for making a solar cell by depositing various layers of components on a substrate and converting the components into a thin film photovoltaic absorber material. Processes of this disclosure can be used to control the stoichiometry of metal atoms in making a solar cell for targeting a particular concentration and providing a gradient of metal atom concentration. A selenium layer can be used in annealing a thin film photovoltaic absorber material.

19 Claims, 17 Drawing Sheets

(56) References Cited

U.S. PATENT DOCUMENTS

| | | | |
|---|---|---|---|
| 4,259,122 A * | 3/1981 | Purwin et al. ............. | 136/258 |
| 4,335,266 A | 6/1982 | Mickelsen | |
| 4,721,539 A | 1/1988 | Ciszek | |
| 5,436,204 A | 7/1995 | Albin | |
| 5,441,897 A | 8/1995 | Noufi | |
| 5,626,688 A * | 5/1997 | Probst et al. ............. | 136/265 |
| 5,681,975 A | 10/1997 | Brennan | |
| 5,871,630 A | 2/1999 | Bhattacharya | |
| 5,882,722 A | 3/1999 | Kydd | |
| 5,976,614 A | 11/1999 | Bhattacharya | |
| 5,981,868 A | 11/1999 | Kushiya | |
| 5,985,691 A | 11/1999 | Basol | |
| 6,066,196 A | 5/2000 | Kaloyeros | |
| 6,126,740 A | 10/2000 | Schulz | |
| 6,325,490 B1 | 12/2001 | Yang | |
| 6,368,892 B1 | 4/2002 | Arya | |
| 6,372,538 B1 | 4/2002 | Wendt | |
| 6,500,733 B1 | 12/2002 | Stanbery | |
| 6,518,086 B2 | 2/2003 | Beck | |
| 6,635,307 B2 | 10/2003 | Huang | |
| 6,797,874 B2 | 9/2004 | Stanbery | |
| 6,830,778 B1 | 12/2004 | Schulz | |
| 6,852,920 B2 | 2/2005 | Sager | |
| 6,875,661 B2 | 4/2005 | Mitzi | |
| 6,967,115 B1 | 11/2005 | Sheats | |
| 6,974,976 B2 | 12/2005 | Hollars | |
| 6,987,071 B1 | 1/2006 | Bollman | |
| 6,992,202 B1 | 1/2006 | Banger | |
| 7,026,258 B2 | 4/2006 | Taunier | |
| 7,094,651 B2 | 8/2006 | Mitzi | |
| 7,109,520 B2 | 9/2006 | Yu | |
| 7,179,677 B2 | 2/2007 | Ramanathan | |
| 7,194,197 B1 | 3/2007 | Wendt | |
| 7,235,736 B1 | 6/2007 | Buller | |
| 7,247,346 B1 | 7/2007 | Sager | |
| 7,259,322 B2 | 8/2007 | Gronet | |
| 7,306,823 B2 | 12/2007 | Sager | |
| 7,341,917 B2 | 3/2008 | Milliron | |
| 7,384,680 B2 | 6/2008 | Bi | |
| 7,494,841 B2 | 2/2009 | Mitzi | |
| 7,517,718 B2 | 4/2009 | Mitzi | |
| 7,563,392 B1 | 7/2009 | Hsu | |
| 7,618,841 B2 | 11/2009 | Mitzi | |
| 7,663,057 B2 | 2/2010 | Yu | |
| 7,935,558 B1 | 5/2011 | Juliano | |
| 7,964,434 B2 * | 6/2011 | Wieting ............. | 438/78 |
| 8,057,850 B2 * | 11/2011 | Curtis et al. ............. | 427/74 |
| 8,198,123 B2 | 6/2012 | Britt | |
| 8,277,894 B2 * | 10/2012 | Mosley et al. ............. | 427/256 |
| 8,308,973 B2 * | 11/2012 | Mosley et al. ............. | 438/102 |
| 8,426,241 B2 * | 4/2013 | Ahmed et al. ............. | 438/98 |
| 8,436,445 B2 * | 5/2013 | Wieting ............. | 257/463 |
| 2003/0123167 A1 | 7/2003 | Kolberg | |
| 2004/0063320 A1 | 4/2004 | Hollars | |
| 2004/0250848 A1 | 12/2004 | Sager | |
| 2005/0121068 A1 | 6/2005 | Sager | |
| 2005/0183767 A1 | 8/2005 | Yu | |
| 2006/0060237 A1 | 3/2006 | Leidholm | |
| 2006/0062902 A1 | 3/2006 | Sager | |
| 2006/0157103 A1 | 7/2006 | Sheats | |
| 2007/0163383 A1 | 7/2007 | Van Duren | |
| 2007/0163637 A1 | 7/2007 | Robinson | |
| 2007/0163638 A1 | 7/2007 | Van Duren | |
| 2007/0163639 A1 | 7/2007 | Robinson | |
| 2007/0163640 A1 | 7/2007 | Van Duren | |
| 2007/0163641 A1 | 7/2007 | Duren | |
| 2007/0163642 A1 | 7/2007 | Van Duren | |
| 2007/0163643 A1 | 7/2007 | Van Duren | |
| 2007/0163644 A1 | 7/2007 | Van Duren | |
| 2007/0169812 A1 | 7/2007 | Robinson | |
| 2007/0169813 A1 | 7/2007 | Robinson | |
| 2007/0178620 A1 | 8/2007 | Basol | |
| 2007/0207565 A1 | 9/2007 | Kodas | |
| 2007/0264488 A1 | 11/2007 | Lee | |
| 2008/0023336 A1 * | 1/2008 | Basol ............. | 205/182 |
| 2008/0057203 A1 | 3/2008 | Robinson | |
| 2008/0057616 A1 | 3/2008 | Robinson | |
| 2008/0124833 A1 | 5/2008 | Ruiz | |
| 2008/0135099 A1 | 6/2008 | Yu | |
| 2008/0135811 A1 | 6/2008 | Yu | |
| 2008/0135812 A1 | 6/2008 | Yu | |
| 2008/0138501 A1 | 6/2008 | Yu | |
| 2008/0142072 A1 | 6/2008 | Yu | |
| 2008/0142080 A1 | 6/2008 | Yu | |
| 2008/0142081 A1 | 6/2008 | Yu | |
| 2008/0142082 A1 | 6/2008 | Yu | |
| 2008/0142083 A1 | 6/2008 | Yu | |
| 2008/0142084 A1 | 6/2008 | Yu | |
| 2008/0145633 A1 | 6/2008 | Kodas | |
| 2008/0149176 A1 | 6/2008 | Sager | |
| 2008/0175982 A1 | 7/2008 | Robinson | |
| 2008/0213467 A1 | 9/2008 | Yu | |
| 2008/0257201 A1 | 10/2008 | Harris | |
| 2009/0084427 A1 | 4/2009 | Anderson | |
| 2009/0107550 A1 | 4/2009 | Van Duren | |
| 2009/0169723 A1 | 7/2009 | Hanket | |
| 2009/0253227 A1 | 10/2009 | Defries | |
| 2009/0260670 A1 | 10/2009 | Li | |
| 2009/0280598 A1 | 11/2009 | Curtis | |
| 2009/0280624 A1 | 11/2009 | Curtis | |
| 2010/0029036 A1 | 2/2010 | Robinson | |
| 2010/0203668 A1 * | 8/2010 | Schmid et al. ............. | 438/84 |
| 2010/0255660 A1 * | 10/2010 | Singh et al. ............. | 438/478 |
| 2010/0291758 A1 * | 11/2010 | Robinson et al. ............. | 438/478 |
| 2010/0294346 A1 | 11/2010 | Frolov | |
| 2011/0014377 A1 * | 1/2011 | Mosley ............. | 427/256 |
| 2011/0020978 A1 * | 1/2011 | Wieting ............. | 438/93 |
| 2011/0020981 A1 * | 1/2011 | Mosley et al. ............. | 438/102 |
| 2011/0030784 A1 * | 2/2011 | Fujdala et al. ............. | 136/258 |
| 2011/0030785 A1 * | 2/2011 | Fujdala et al. ............. | 136/258 |
| 2011/0030786 A1 * | 2/2011 | Fujdala et al. ............. | 136/258 |
| 2011/0030787 A1 * | 2/2011 | Fujdala et al. ............. | 136/258 |
| 2011/0030788 A1 * | 2/2011 | Fujdala et al. ............. | 136/258 |
| 2011/0030795 A1 * | 2/2011 | Fujdala et al. ............. | 136/262 |
| 2011/0030796 A1 * | 2/2011 | Fujdala et al. ............. | 136/262 |
| 2011/0030797 A1 * | 2/2011 | Fujdala et al. ............. | 136/262 |
| 2011/0030798 A1 * | 2/2011 | Fujdala et al. ............. | 136/262 |
| 2011/0030799 A1 * | 2/2011 | Fujdala et al. ............. | 136/262 |
| 2011/0030800 A1 * | 2/2011 | Fujdala et al. ............. | 136/262 |
| 2011/0041918 A1 * | 2/2011 | Fujdala et al. ............. | 136/262 |
| 2011/0065228 A1 | 3/2011 | Li | |
| 2011/0076798 A1 * | 3/2011 | Calzia et al. ............. | 438/102 |
| 2011/0120343 A1 | 5/2011 | Calzia | |
| 2011/0146789 A1 * | 6/2011 | Fujdala et al. ............. | 136/258 |
| 2011/0146790 A1 * | 6/2011 | Fujdala et al. ............. | 136/258 |
| 2011/0152554 A1 | 6/2011 | Fox | |
| 2011/0287610 A1 | 11/2011 | Calzia | |
| 2011/0287614 A1 | 11/2011 | Calzia | |
| 2012/0018828 A1 * | 1/2012 | Shao ............. | 257/431 |
| 2012/0061790 A1 * | 3/2012 | Ahmed et al. ............. | 257/459 |
| 2012/0067407 A1 * | 3/2012 | Fujdala et al. ............. | 136/252 |
| 2012/0067424 A1 * | 3/2012 | Fujdala et al. ............. | 136/262 |
| 2012/0073633 A1 * | 3/2012 | Fujdala et al. ............. | 136/252 |
| 2012/0073637 A1 * | 3/2012 | Fujdala et al. ............. | 136/255 |
| 2012/0073659 A1 * | 3/2012 | Fujdala et al. ............. | 136/262 |
| 2012/0082794 A1 | 4/2012 | Calzia | |
| 2012/0094431 A1 | 4/2012 | Curtis | |
| 2012/0302002 A1 * | 11/2012 | Wieting ............. | 438/93 |
| 2012/0318357 A1 * | 12/2012 | Fujdala et al. ............. | 136/262 |
| 2013/0025680 A1 * | 1/2013 | Fujdala et al. ............. | 136/262 |
| 2013/0087744 A1 * | 4/2013 | Fujdala et al. ............. | 252/501.1 |

FOREIGN PATENT DOCUMENTS

| | | |
|---|---|---|
| JP | 2000-058893 A | 2/2000 |
| JP | 200283824 | 3/2002 |
| JP | 2008-56511 A | 3/2008 |
| KR | 10-2009-0029495 A | 3/2009 |
| KR | 10-2009-0050558 A | 5/2009 |
| KR | WO2009064056 A1 | 5/2009 |
| KR | 10-2010-0048043 | 5/2010 |
| KR | 10-2011-0037519 | 4/2011 |
| KR | 10-2011-0060211 | 6/2011 |
| KR | 10-2011-0065596 | 6/2011 |

(56) References Cited

FOREIGN PATENT DOCUMENTS

| KR | 10-2011-0128532 | 11/2011 |
| --- | --- | --- |
| KR | 10-2012-0036476 | 4/2012 |
| WO | WO9304212 A1 | 3/1993 |
| WO | WO2007082080 A1 | 7/2007 |
| WO | WO2008057119 A1 | 5/2008 |
| WO | WO2008063190 A2 | 5/2008 |
| WO | WO2008104087 A1 | 9/2008 |

OTHER PUBLICATIONS

Zhong, Chem. Mater. 2008, vol. 20, pp. 6434-6443.
Chandra, Mat. Sci. and Engineering vol. B86, 2001, p. 60-63.
Suh, Inorg. Chem. 1998, 37, p. 5832-5826.
Wuller, Inorg. Chem. 1995, 34, p. 4854-4861.
Banger, Applied Organometallic Chemistry, 2002, vol. 16, pp. 617-627.
Banger, Inorg Chem, 2003, vol. 42(24), pp. 7713-7715.
Chen, Chem Mater 2007, vol. 19, pp. 5256-5261.
Dennier, Adv Mater, 2009, vol. 21, pp. 1323-1338.
Kaelin, Solar Energy, 2004, vol. 77, pp. 749-756.
Kundu, Thin Solid Films, 2006, vol. 515, pp. 2625-2631.
Yoon, Bull Korean Chem Soc, 2006, vol. 27(12), pp. 2071-2073.
Ahn, J. Phys. Chem. C 2010, 114, 8108-8113, CuInSe2 (CIS) Thin Film Solar Cells by Direct Coating and Selenization of Solution Precursors.
Su, 978-1-4673-0066-7/12, 2011 IEEE, Investigation of Sodium Effects on CIGS Thin Films Deposited by Sputtering From a Single Quaternary, p. 2644-2646.
Wu, 978-1-4673-0066-7/12, 2011 IEEE, The Effect of Na Ion Implantation on the Polycrystalline CuInl-xGaxSe2, p. 185-187.
Palm, Thin Solid Films 431-432 (2003) 514-522, CIS module pilot processing applying concurrent rapid selenization and sulfurization of large area thin film precursors.
Tarrant, National Renewable Energy Laboratory, Final Technical Report Oct. 2005-Jun. 2006, Thin-Film Photovoltaic Partnership Program CIS Module Process R&D, p. 1-64.
Sites, National Renewable Energy Laboratory, Jan. 2002, NREL/SR-520-31458, Final Report Feb. 1998-Aug. 2001, Device Physics of Thin-Film Polycrystalline Cells and Modules, p. 1-47.
Rau, Solar Energy Materials & Solar Cells 67 (2001) 137}143, Electrical characterization of Cu(In,Ga)Se2 thin-film solar cells and the role of defects for the device performance.
Sites, National Renewable Energy Laboratory, Dec. 1999, NREL/SR-520-27663, Phase I Annual Report, Feb. 1998-Jan. 1999, Device Physics of Thin-Film Polycrystalline Cells and Modules, p. 1-22.
Kwon, Journal of the Korean Physical Society, vol. 39, No. 4, Oct. 2001, pp. 655-660, Characterization of Cu (In1-xGax)Se2 Films Prepared by Three-Stage Coevaporation and Their Application to CIGS Solar Cells for a 14.48 % Efficiency.
Hedstrom, 0-7803-1220-1/93,1993 IEEE, ZnO/CdS/Cu(In,Ga)Se, Thin Film Solar Cells With Improved Performance, p. 364-371.
Dawson-Elli, CH3365-449440000-0152,1994 IEEE, First WCPEC; Dec. 5-9, 1994; Hawaii, Substrate Influences on CIS Device Performance, p. 152-155.
Contreras, 26th PVSC; Sept. 30Oct. 3,1997; Anaheim, CA, On the Role of Na and Modifications to Cu (In,Ga)Se, Absorber Materials Using Thin-MF: (M=Na, K, Cs) Precursor Layers, p. 359-362.
Basol, CH3365-4/94/0000-0148,1994 IEEE, First WCPEC; Dec. 5-9, 1994; Hawaii, Studies on Substrates and Contacts for CIS Films and Devices, p. 148-151.
Eichofer, J. Chem. Soc., Dalton Trans., 2000, 941-944.
Chen, Physical Review B 79, 165211, 1-10 (2009).
Beachley, Organometallics 1996, 15, 3653-3658.
Borisova, Organometallics 2002, 21, 4005-4008.
Deivaraj, Inorg. Chem. 2002, 41, 3755-3760.
Deivaraj, Chem. Mater. 2003, 15, 2383-2391.
Kuckmann, Inorg. Chem. 2005, 44, 3449-3458.
Lazell, Chem. Mater. 1999, 11, 3430-3432.
Malik, Chem. Mater. 2001, 13, 913-920.
McAleese, Chem. Vap. Deposition 1998, 4, No. 3, 94-96.
Nguyen, Chem. Commun., 2006, 2182-2184.
Nomura, Polyhedron 1989, vol. 8, No. 15, 1891-1896.
Nomura, J. Mater. Chem., 1992,2(7), 765-766.
Stoll, Chem. Mater. 1998, 10, 650-657.
Tian, Inorg. Chem. 2006, 45, 8258-8263.
Tran, Organometallics 2000, 19, 5202-5208.
Wallbank, Organometallics 2005, 24, 788-790.
Kumar, J. Chem. Soc. Dalton Trans. 1988, p. 1045-1047, Reactions of Some Main Group Metals with Diphenyl Disulphide and Diphenyl Diselenide.
Green, Inorg. Chem. 1989, V28, 123-127.
Nomura, Polyhedron vol. 9, No. 2/3, pp. 361-366, 1990.
Nomura, Applied Organometallic Chemistry, vol. 6, 685-691 (1992).
Hirpo, J. Am. Chem. Soc. 1993, V115, 1597-1599.
Ohlmann, J. Chem. Soc., Chem. Commun., 1995, p. 1011-1012.
Beck, Thin Solid Films 272 ( 1996) 71-82.
Grigsby, J. Chem. Soc., Dalton Trans., 1998, pp. 2547-2556.
Suh, Inorg. Chem. 1999, 38, 1627-1633.
Banger, Chem. Mater. 2001, 13, 3827-3829.
Deivaraj, Chem. Commun., 2001, 2304-2305.
Kapur, Thin Solid Films 431-432 (2003) 53-57.
Ahlrichs, Eur. J. Inorg. Chem. 2006, 345-350.
Milliron, Chem. Mater., vol. 18, No. 3, 2006, p. 587-590.
Vittal, Acc. Chem. Res. 2006, 39, 869-877.
Yamada, Science and Technology of Advanced Materials 7 (2006) 42-45.
Borecki, Inorg. Chem. 2007, 46, 2478-2484.
Schneider, Chem. Mater. 2007, 19, 2780-2785.
Merdes, Thin Solid Films 516 (2008) 7335-7339.
Panthani, J. Am. Chem. Soc. 2008, 130, 16770-16777.
Hepp, Solution Processing of Inorganic Materials, edited by David Mitzi, 2009, Chapter 6, p. 157-198.
Hou, Thin Solid Films (2009) pp. 1-4, Low-temperature processing of a solution-deposited CuInSSe thin-film solar cell.
Malik, J. Mater. Res., vol. 24, No. 4, Apr. 2009, p. 1375-1387.
Mitzi, Thin Solid Films 517 (2009) 2158-2162.
Park, Journal ofCrystalGrowth 311 (2009) 2621-2625.
Dwyer, Solar Energy Materials & Solar Cells 94 (2010) 598-605.
Hibberd, Prog. Photovolt: Res. Appl. 2010; 18:434-452.
Niki, Prog. Photovolt: Res. Appl. 2010; 18:453-466.
Yuan, Chem. Mater. 2010, 22, 285-287.

* cited by examiner

Fig. 1

BABABABABABABABABABABABABAB $\{Cu_{0.95}\ In_{0.70}\ Ga_{0.30}\ Se_{3.95}\ Bu_{3.95}\}$ $(RE)_2BABABB$

[BA]$_4$ cyclic

ANNEALING PROCESSES FOR PHOTOVOLTAICS

CROSS REFERENCE TO RELATED APPLICATIONS

This application claims the benefit of U.S. Provisional Application No. 61/498,383, filed Jun. 17, 2011, U.S. Provisional Application No. 61/439,735, filed Feb. 4, 2011, and U.S. Provisional Application No. 61/383,292, filed Sep. 15, 2010, each of which is hereby incorporated by reference in its entirety.

BACKGROUND

One way to produce a solar cell product involves depositing a thin, light-absorbing, solid layer of the material copper indium gallium diselenide, known as "CIGS," on a substrate. A solar cell having a thin film CIGS layer can provide low to moderate efficiency for conversion of sunlight to electricity.

Making a CIGS semiconductor generally requires using several source compounds and/or elements which contain the atoms needed for CIGS. The source compounds and/or elements must be formed or deposited in a thin, uniform layer on a substrate. For example, deposition of the CIGS sources can be done as a co-deposition, or as a multistep deposition. The difficulties with these approaches include lack of uniformity, purity and homogeneity of the CIGS layers, leading ultimately to limited light conversion efficiency.

For example, some methods for solar cells are disclosed in U.S. Pat. Nos. 5,441,897, 5,976,614, 6,518,086, 5,436,204, 5,981,868, 7,179,677, 7,259,322, U.S. Patent Publication No. 2009/0280598, and PCT International Application Publication Nos. WO2008057119 and WO2008063190.

Other disadvantages in the production of thin film devices are limited ability to control product properties through process parameters and low yields for commercial processes. Absorber layers suffer from the appearance of different solid phases, as well as imperfections in crystalline particles and the quantity of voids, cracks, and other defects in the layers. In general, CIGS materials are complex, having many possible solid phases. Moreover, methods for large scale manufacturing of CIGS and related thin film solar cells can be difficult because of the chemical processes involved. In general, large scale processes for solar cells are unpredictable because of the difficulty in controlling numerous chemical and physical parameters involved in forming an absorber layer of suitable quality on a substrate, as well as forming the other components of an efficient solar cell assembly, both reproducibly and in high yield.

For example, there is a general need for the use of selenium in the processing of CIGS materials for a solar cell. The presence and concentration of selenium in annealing, for example, is a chemical parameter that should be controlled in a solar cell manufacturing process.

In another example, introducing alkali ions at a controlled concentration into various layers and compositions of a CIGS-based solar cell has not been achieved in a general way. Conventional methods for introducing sodium do not readily provide homogenous concentration levels or control over sodium location in a CIGS film. The presence and level of alkali ions in various layers is a chemical parameter that should be controlled in a solar cell manufacturing process.

A significant problem is the inability in general to precisely control the stoichiometric ratios of metal atoms and Group 13 atoms in the layers. Because several source compounds and/or elements must be used, there are many parameters to control in making and processing uniform layers to achieve a particular stoichiometry. Many semiconductor and optoelectronic applications are dependent on the ratios of certain metal atoms or Group 13 atoms in the material. Without direct control over those stoichiometric ratios, processes to make semiconductor and optoelectronic materials can be less efficient and less successful in achieving desired compositions and properties. For example, no single source compound is currently known that can be used to prepare a layer or film of any arbitrary stoichiometry from which CIGS materials can be made. Compounds or compositions that can fulfill this goal have long been needed.

What is needed are compounds, compositions and processes to produce materials for photovoltaic layers, especially thin film layers for solar cell devices and other products.

BRIEF SUMMARY

Embodiments of this disclosure include the following:

A process for making a thin film solar cell on a substrate by (a) providing a thin film coated on a back contact on a first substrate; (b) depositing a selenium layer onto a second substrate; (c) arranging the first and second substrates so that the thin film is parallel to, and facing the selenium layer, wherein the thin film and the selenium layer are spaced apart; and (d) heating the first and second substrates.

The thin film can be CIS or CIGS, or CIGS film that is deficient in copper atoms, or CIGS film that contains sodium ions.

The thin film may be spaced apart from the selenium layer by a distance of from 10 to 3000 micrometers, or from 10 to 500 micrometers, or from 50 to 150 micrometers.

The selenium layer can be deposited by vapor deposition, or by spraying, printing or coating a selenium-containing ink.

The heating step may be at a temperature of from 300° C. to 650° C., or at a temperature of from 300° C. to 650° C. for a time period of from 10 seconds to 10 minutes, or at a temperature of from 450° C. to 550° C. for a time period of from 30 seconds to five minutes. The heating step can anneal the thin film.

The thin film may contain from 0.01 to 2.0 atom percent alkali ions, or from 0.1 to 1.0 atom percent alkali ions.

The space between the thin film and the selenium layer may be enclosed.

The thin film can be crystalline. The back contact may contain molybdenum. The back contact on a first substrate can be a conducting substrate.

Embodiments of this invention include a solar cell made by any of the processes herein.

BRIEF DESCRIPTION OF THE DRAWINGS

FIG. 1: FIG. 1 shows an embodiment of a CIGS polymeric precursor compound that is soluble in organic solvents. As shown in FIG. 1, the structure of the polymeric precursor compound can be represented as a polymer chain of repeating units: A, which is $\{M^A(ER)(ER)\}$, and B, which is $\{M^B(ER)(ER)\}$, where $M^A$ is a Group 11 atom, $M^B$ is a Group 13 atom, E is a chalcogen, and R is a functional group. The structure of the polymer can be represented by the formula shown in FIG. 1 that tallies the stoichiometry of the atoms and groups in the chain.

As shown in FIG. 4, a precursor layer 105 can be deposited on a substrate 100. The precursor layer 105 can be heated to form a thin film photovoltaic material layer (not shown, same position). An enclosure may comprise a top plate 110, which encloses the space around the surface of the photovoltaic material layer. The inner surface of the top plate, which is the surface facing the substrate, can be in close contact with the surface of the photovoltaic material layer. A chalcogen-containing layer 115 can be deposited on the inner surface of the top plate.

FIG. 9 shows an embodiment of a polymeric precursor compound. As shown in FIG. 9, the structure of the compound can be represented by the formula $(RE)_2BA\text{-}BABB$.

FIG. 10 shows an embodiment of a polymeric precursor compound. As shown in FIG. 10, the structure of the compound can be represented by the formula $(RE)_2BA\text{-}BABBABAB$.

FIG. 11 shows an embodiment of a polymeric precursor compound. As shown in FIG. 11, the structure of the compound can be represented by the formula $(RE)_2BA(BA)_nBB$.

FIG. 12 shows an embodiment of a polymeric precursor compound. As shown in FIG. 12, the structure of the compound can be represented by the formula $(RE)_2BA(BA)_nB(BA)_mB$.

FIG. 13 shows an embodiment of a polymeric precursor compound. As shown in FIG. 13, the structure of the compound can be represented by the formula $^{cyclic}(BA)_4$.

FIG. 14 shows a top view micrograph of a CIGS thin film of a solar cell.

FIG. 15 shows a cross sectional view micrograph of a finished solar cell embodiment.

FIG. 16 shows the I-V curve of a finished solar cell embodiment.

FIG. 17 shows results of methods for controlling the stoichiometry of the composition of a bulk, crystalline CIGS material. In these results, the ratio of indium to gallium was controlled. FIG. 17 shows an analysis by X-ray diffraction of the structure of the crystalline phase of bulk CIGS materials made with various polymeric precursors. The ratio of indium to gallium in the crystals of CIGS materials was detected by the relative positions of the 2-theta-(112) peaks in the X-ray diffraction patterns. The CIGS materials were each made from a polymeric precursor having a percent indium corresponding to the value on the x-axis, where percent indium is $100*In/(In+Ga)$.

DETAILED DESCRIPTION

Figure 2:
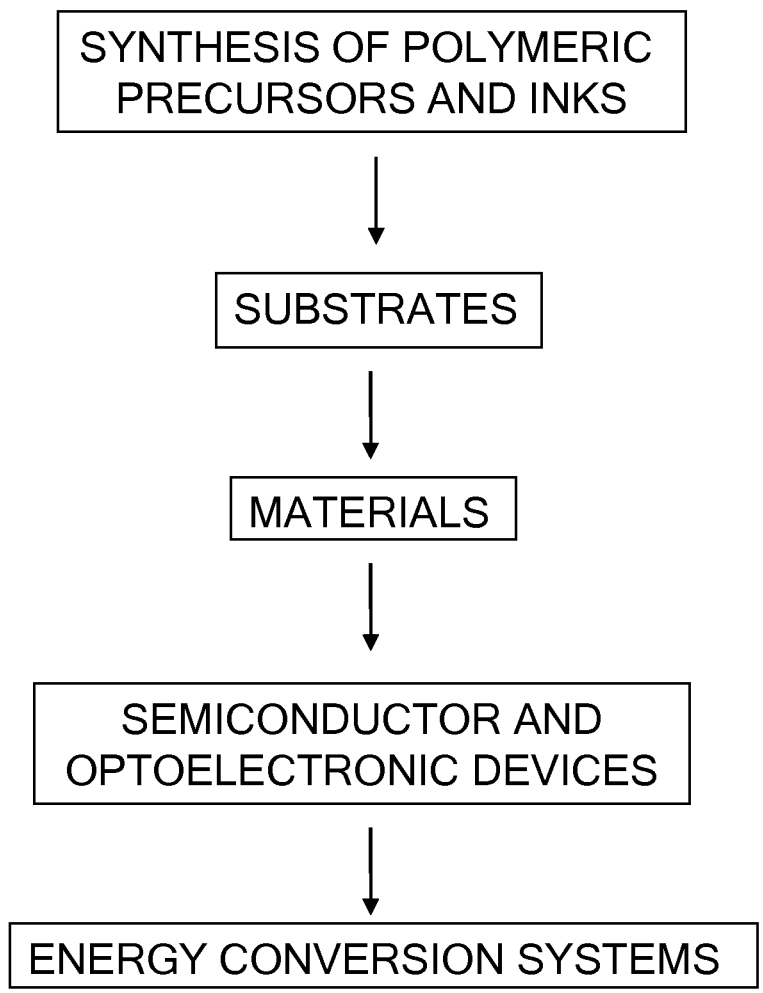
FIG. 2: Schematic representation of embodiments of this invention in which polymeric precursors and ink compositions are deposited onto particular substrates by methods including spraying, coating, and printing, and are used to FIG. 3: Schematic representation of a solar cell embodiment of this invention.

This disclosure provides methods and compositions for photovoltaic absorber layers for photovoltaic and electrooptical devices. In one aspect, this disclosure provides processes to make a photovoltaic absorber layer by forming various layers of components on a substrate and converting the components to a material such as a thin film material. A component can be an element, a compound, a precursor, a polymeric precursor, or a material composition.

In certain aspects, a photovoltaic absorber layer may be fabricated using a layer of a polymeric precursor compound. The polymeric precursor compound can contain all the elements needed for the photovoltaic absorber material composition. A polymeric precursor compound can be deposited on a substrate and converted to a photovoltaic material.

For example, polymeric precursors for photovoltaic materials are described in PCT/US2010/044055, PCT/US2010/044056, PCT/US2010/044054, PCT/US2010/044035, and PCT/US2010/044057, each of which is hereby incorporated by reference in its entirety for all purposes.

In further aspects, this disclosure provides processes for making a photovoltaic material by varying the composition of components in layers on a substrate. Variations in the stoichiometry of layers of components can be made by using multiple layers of different precursor compounds having different, yet fixed stoichiometry. In some embodiments, the stoichiometry of layers can be varied by using one or more polymeric precursor compounds that can have an arbitrary, predetermined stoichiometry. In certain embodiments, the stoichiometry of layers of precursors on a substrate can represent a gradient of the composition of one or more elements with respect to distance from the surface of the substrate or the ordering of layers on the substrate.

The layers of precursors on a substrate can be converted to a material composition by applying energy to the layered substrate article. Energy can be applied using heat, light, or radiation, or by applying chemical energy. In some embodiments, a layer may be converted to a material individually, before the deposition of a succeeding layer. In certain embodiments, a group of layers can be converted at the same time.

In some aspects, this disclosure provides a solution to a problem in making a photovoltaic absorber layer for an optoelectronic application such as a solar cell. The problem is the inability in general to precisely control the stoichiometric quantities and ratios of metal atoms and atoms of Group 13 in a process using conventional source compounds and/or elements for making a photovoltaic absorber layer.

This disclosure provides a range of polymeric precursors, where each precursor can be used alone to readily prepare a layer from which a photovoltaic layer or material of any arbitrary, predetermined stoichiometry can be made.

A polymeric precursor compound of this disclosure is one of a range of polymer chain molecules. In one embodiment, a polymeric precursor compound is a chain molecule as shown in FIG. 1. FIG. 1 shows an embodiment of a CIGS polymeric precursor compound that is soluble in organic solvents. As shown in FIG. 1, the structure of the polymeric precursor compound can be represented as a polymer chain of repeating units: A, which is $\{M^A(ER)(ER)\}$, and B, which is $\{M^B(ER)(ER)\}$, where $M^A$ is a Group 11 atom, $M^B$ is a Group 13 atom, E is a chalcogen, and R is a functional group. The structure of the polymer can be represented by the formula shown in FIG. 1 that tallies the stoichiometry of the atoms and groups in the chain.

A polymeric precursor of this disclosure may be used to make a photovoltaic layer or material having any arbitrary, desired stoichiometry, where the stoichiometry can be selected in advance and is therefore specifically controlled or predetermined Photovoltaic materials of this disclosure include CIGS, AIGS, CAIGS, CIGAS, AIGAS and CAIGAS materials, including materials that are enriched or deficient in the quantity of a certain atom, where CAIGAS refers to Cu/Ag/In/Ga/Al/S/Se, and further definitions are given below.

In general, the ability to select a predetermined stoichiometry in advance means that the stoichiometry is controllable.

As shown in FIG. 2, embodiments of this invention may further provide optoelectronic devices and energy conversion systems. Following the synthesis of polymeric precursor compounds, the compounds can be sprayed, deposited, or printed onto substrates and formed into absorber materials and semiconductor layers. Absorber materials can be the basis for optoelectronic devices and energy conversion systems.

A process for making a photovoltaic absorber material having a predetermined stoichiometry on a substrate may in general require providing a precursor having the predetermined stoichiometry. The photovoltaic absorber material is prepared from the precursors by one of a range of processes disclosed herein. The photovoltaic absorber material can retain the precise, predetermined stoichiometry of the metal atoms of the precursors. The processes disclosed herein therefore allow a photovoltaic absorber material or layer having a specific target, predetermined stoichiometry to be made using precursors of this invention.

In general, the precursor having the predetermined stoichiometry for making a photovoltaic absorber material can be any precursor.

This disclosure provides a range of precursors having predetermined stoichiometry for making semiconductor and optoelectronic materials and devices including thin film photovoltaics and various semiconductor band gap materials having a predetermined composition or stoichiometry.

This disclosure provides a range of novel polymeric compounds, compositions, materials and methods for semiconductor and optoelectronic materials and devices including thin film photovoltaics and various semiconductor band gap materials.

Among other advantages, the polymeric compounds, compositions, materials and methods of this invention can provide a precursor compound for making semiconductor and optoelectronic materials, including CIS, CIGS, AIS, AIGS, CAIS, CAIGS, CIGAS, AIGAS and CAIGAS absorber layers for solar cells and other devices. In some embodiments, the source precursor compounds of this invention can be used alone, without other compounds, to prepare a layer from which CIS, CIGS, AIS, AIGS, CAIS, CAIGS, CIGAS, AIGAS and CAIGAS and other materials can be made. Polymeric precursor compounds may also be used in a mixture with additional compounds to control stoichiometry of a layer or material.

This invention provides polymeric compounds and compositions for photovoltaic applications, as well as devices and systems for energy conversion, including solar cells.

Figure 3:
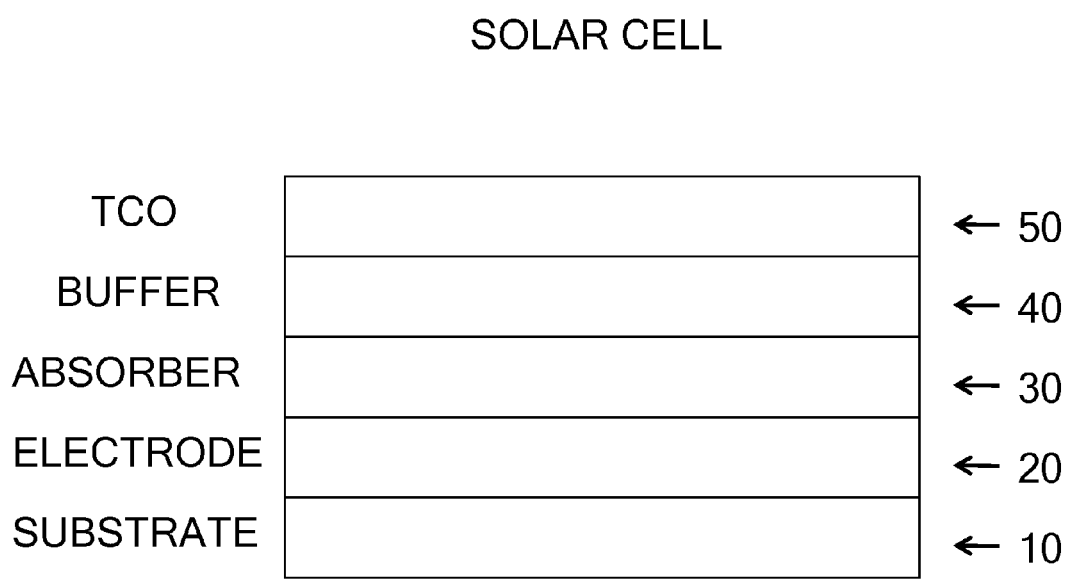

As shown in FIG. 3, a solar cell device of this disclosure may have a substrate 10, an electrode layer 20, an absorber layer 30, a buffer layer 40, and a transparent conductive layer (TCO) 50.

As used herein, converting refers to a process, for example a heating or thermal process, which converts one or more precursor compounds into a semiconductor material.

As used herein, annealing refers to a process, for example a heating or thermal process, which transforms a semiconductor material from one form into another form.

The polymeric compounds and compositions of this disclosure include polymeric precursor compounds and polymeric precursors for materials for preparing novel semiconductor and photovoltaic materials, films, and products. Among other advantages, this disclosure provides stable polymeric precursor compounds for making and using layered materials and photovoltaics, such as for solar cells and other uses.

Polymeric precursors can advantageously form a thin, uniform film. In some embodiments, a polymeric precursor is an oil or liquid that can be processed and deposited in a uniform layer on a substrate. This invention provides polymeric precursors that can be used neat to make a thin film, or can be processed in an ink composition for deposition on a substrate. The polymeric precursors of this invention can have superior processability to form a thin film for making photovoltaic absorber layers and solar cells.

In general, the structure and properties of the polymeric compounds, compositions, and materials of this invention provide advantages in making photovoltaic layers, semiconductors, and devices regardless of the morphology, architecture, or manner of fabrication of the semiconductors or devices.

The polymeric precursor compounds of this invention are desirable for preparing semiconductor materials and compositions. A polymeric precursor may have a chain structure containing two or more different metal atoms which may be bound to each other through interactions or bridges with one or more chalcogen atoms of chalcogen-containing moieties.

With this structure, when a polymeric precursor is used in a process such as deposition, coating or printing on a substrate or surface, as well as processes involving annealing, sintering, thermal pyrolysis, and other semiconductor manufacturing processes, use of the polymeric precursors can enhance the formation of a semiconductor and its properties.

Transformation of Precursor Forms

The polymeric compounds and compositions of this disclosure may be transformed to chalcogenide forms and chalcogenide particle forms. Chalcogenide forms can advantageously include M-E-M' bonding, or chalcogenide bonding.

In certain aspects, polymeric precursor compounds can be used to form nanoparticles that can be used in various methods to prepare semiconductor materials. Embodiments of this invention may further provide processes using nanoparticles made from polymeric precursors to enhance the formation and properties of a semiconductor material.

Chalcogenide forms and chalcogenide particle forms of a polymeric precursor can be used to prepare photovoltaic absorber layers, films and solar cells. In some embodiments, chalcogenide forms and chalcogenide particle forms can be admixed or combined with one or more polymeric precursors and deposited on a substrate.

In some aspects, a chalcogenide form of a polymeric precursor can be made by applying heat, light, or radiation, or by adding chemical or crosslinking reagents to the polymeric precursor. In this process, the polymeric precursor remains a soluble polymeric precursor with a structure that is transformed to include chalcogenide bridging, for example M-E-M' bonding. The soluble chalcogenide form of a polymeric precursor can be used as a component to prepare a material, semiconductor or photovoltaic absorber. The soluble chalcogenide form of a polymeric precursor can also be used in combination with one or more polymeric precursors to prepare a material, semiconductor or photovoltaic absorber.

In certain embodiments, the soluble chalcogenide form of a polymeric precursor can be made by adding a crosslinking agent such as those described hereinbelow.

Embodiments of this disclosure may further provide particles or nanoparticles of a material, where the material is suitable for use in a process to prepare a semiconductor or photovoltaic layer. The material particles, or material nanoparticles can be formed by transforming a component or components by applying heat, light, or radiation, or by adding chemical or crosslinking reagents. In some aspects, material particles or material nanoparticles can be formed by transforming a polymeric precursor. The transformation of one or more polymeric precursors into material particles or material nanoparticles can be done with the polymeric precursors in solid form, or in a solution or ink form. In the transformation, the polymeric precursor becomes a particle.

Particles or nanoparticles formed from a polymeric precursor can be used in a process to prepare a semiconductor or photovoltaic layer by depositing the particles or nanoparticles in a layer. The particles or nanoparticles can be deposited by any suitable method. In some embodiments, the particles or nanoparticles can be deposited by suspending the particles in a solution or ink form which is deposited on a substrate. An ink suitable for depositing the material particles or material nanoparticles can contain other components, including for example one or more polymeric precursors.

Particles or nanoparticles formed from a polymeric precursor can have a precisely controlled and predetermined stoichiometry.

In certain embodiments, particles or nanoparticles composed at least partially of a polymeric precursor can be formed for use in a process to prepare a semiconductor or photovoltaic layer. The polymeric precursor particles can be formed by at least partially transforming one or more polymeric precursors by applying heat, light, or radiation, or by applying chemical energy. The partial transformation of one or more polymeric precursors can be done with the polymeric precursors in solid form, or in a solution or ink form.

Particles formed from a polymeric precursor can be used in a process to prepare a semiconductor or photovoltaic layer by depositing the particles in a layer. The particles can be deposited by any suitable method. In some embodiments, the particles can be deposited by suspending the particles in a solution or ink form which is deposited on a substrate. An ink suitable for depositing the particles can contain other components, including for example one or more polymeric precursors.

Particles formed by at least partially transforming a polymeric precursor can have a precisely controlled and predetermined stoichiometry, at least with respect to metal atoms.

The use of a polymeric precursor in semiconductor manufacturing processes can enhance the formation of M-E-M' bonding, such as is required for chalcogen-containing semiconductor compounds and materials, wherein M is an atom of one of Groups 3 to 12, M' is an atom of Group 13, and E is a chalcogen.

In some aspects, a polymeric precursor contains M-E-M' bonds, and the M-E-M' connectivity may be retained in formation of a semiconductor material.

A polymeric precursor compound may advantageously contain linkages between atoms, where the linkages are desirably found in a material of interest, such as CIS, CIGS, AIS, AIGS, CAIS, CAIGS, CIGAS, AIGAS and CAIGAS materials, which can be made from the polymeric precursor, or a combination of polymeric precursors.

The polymeric precursor compounds of this disclosure are stable in inert atmosphere and advantageously allow control of the stoichiometry, structure, and ratios of the atoms in a semiconductor material or layer, in particular, metal atoms and atoms of Group 13.

Using polymeric precursor compounds in any particular semiconductor manufacturing process, the stoichiometry of monovalent metal atoms and Group 13 atoms can be determined and controlled. For processes operating at relatively low temperatures, such as certain printing, spraying, and deposition methods, the polymeric precursor compounds can maintain the desired stoichiometry. As compared to processes involving multiple sources for semiconductor preparation, the polymeric precursors of this invention can provide enhanced control of the uniformity, stoichiometry, and properties of a semiconductor material.

These advantageous features allow enhanced control over the structure of a semiconductor material made with the polymeric precursor compounds of this invention. The polymeric precursors of this disclosure are superior building blocks for semiconductor materials because they may provide atomic-level control of semiconductor structure.

The polymeric precursor compounds, compositions and methods of this disclosure may allow direct and precise control of the stoichiometric ratios of metal atoms. For example, in some embodiments, a polymeric precursor can be used alone, without other compounds, to readily prepare a layer from which CIS, CIGS, AIS, AIGS, CAIS, CAIGS, CIGAS, AIGAS and CAIGAS materials of any arbitrary stoichiometry can be made.

In aspects of this invention, chemically and physically uniform semiconductor layers can be prepared with polymeric precursor compounds.

In further embodiments, solar cells and other products can advantageously be made in processes operating at relatively low temperatures using the polymeric precursor compounds and compositions of this disclosure.

The polymeric precursor compounds and compositions of this disclosure can provide enhanced processability for solar cell production.

Certain polymeric precursor compounds and compositions of this disclosure provide the ability to be processed at relatively low temperatures, as well as the ability to use a variety of substrates including flexible polymers in solar cells.

Controlling Alkali Ions

Embodiments of this invention may further provide methods and compositions for introducing alkali ions at a controlled concentration into various layers and compositions of a solar cell. Alkali ions can be provided in various layers and the amount of alkali ions can be precisely controlled in making a solar cell.

In some aspects, the ability to control the precise amount and location of alkali ions advantageously allows a solar cell to be made with substrates that do not contain alkali ions. For example, glass, ceramic or metal substrates without sodium, or with low sodium, inorganic substrates, as well as polymer substrates without alkali ions can be used, among others.

This disclosure provides compounds which are soluble in organic solvents and can be used as sources for alkali ions. In some aspects, organic-soluble sources for alkali ions can be used as a component in ink formulations for depositing various layers. Using organic-soluble source compounds for alkali ions allows complete control over the concentration of alkali ions in inks for depositing layers, and for making photovoltaic absorber layers with a precisely controlled concentration of alkali ions.

In some aspects, an ink composition may advantageously be prepared to incorporate alkali metal ions. For example, an ink composition may be prepared using an amount of Na(ER), where E is S or Se and R is alkyl or aryl. R is preferably $^n$Bu, $^i$Bu, $^s$Bu, propyl, or hexyl.

In certain embodiments, an ink composition may be prepared using an amount of NaIn(ER)$_4$, NaGa(ER)$_4$, LiIn(ER)$_4$, LiGa(ER)$_4$, KIn(ER)$_4$, KGa(ER)$_4$, or mixtures thereof, where E is S or Se and R is alkyl or aryl. R is preferably $^n$Bu, $^i$Bu, $^s$Bu, propyl, or hexyl. These organic-soluble compounds can be used to control the level of alkali metal ions in an ink or deposited layer.

In certain embodiments, sodium can be provided in an ink at a concentration range of from about 0.01 to 5 atom percent, or from about 0.01 to 2 atom percent, or from about 0.01 to 1 atom percent by dissolving the equivalent amount of NaIn(Se$^n$Bu)$_4$, NaGa(Se$^n$Bu)$_4$ or NaSe$^n$Bu.

In further embodiments, sodium can be provided in the process for making a polymeric precursor compound so that the sodium is incorporated into the polymeric precursor compound.

Methods and Compositions for Photovoltaic Absorber Layers

Figure 4:
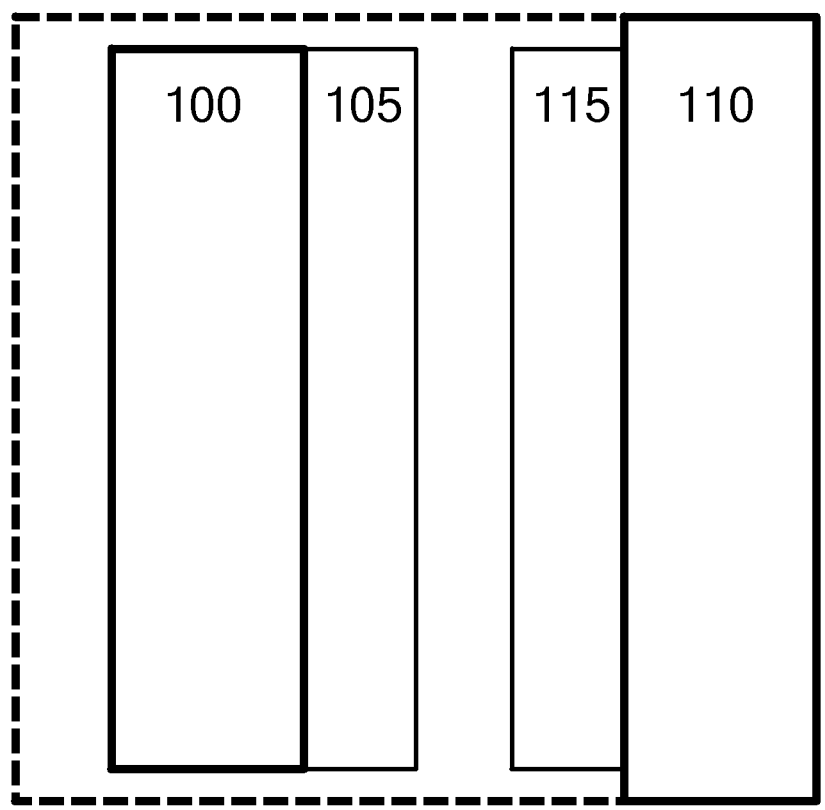
FIG. 4: Schematic representation of steps of a process to make a layered substrate in which a single layer of a polymeric precursor is deposited on a substrate.

In some aspects, a layered substrate can be made by depositing a layer of a polymeric precursor compound onto the substrate. The layer of the polymeric precursor compound can be a single thin layer of the compound, or a plurality of layers of the compound. As shown in FIG. 4, a process to make a layered substrate can have a step of depositing a single precursor layer 105 of a single polymeric precursor on a substrate 100. The average composition of the precursor layer 105 can be deficient in the quantity of a Group 11 atom relative to the quantity of a Group 13 atom. The precursor layer 105 can be heated to form a thin film material layer (not shown). The precursor layer 105 can optionally be composed of a plurality of layers of the polymeric precursor compound. Each of the plurality of layers can be heated to form a thin film material layer before the deposition of the next layer of the polymeric precursor compound.

Figure 5:
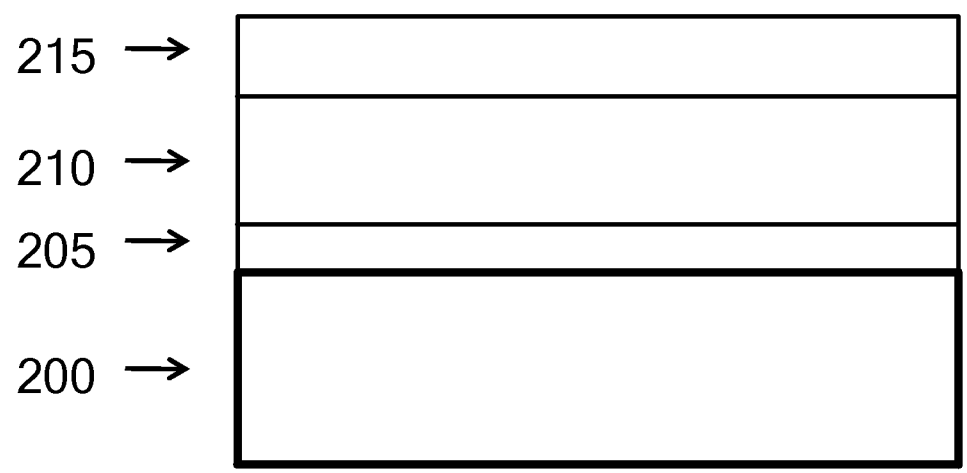
FIG. 5: Schematic representation of steps of a process to make a layered substrate in which an initial layer, a main layer, and a chalcogen layer are deposited on a substrate.

In further aspects, a layered substrate can have an initial layer deposited on a substrate, followed by deposition of a main layer, and optionally a chalcogen layer. As shown in FIG. 5, a process to make a layered substrate can have steps of depositing an initial layer 205 on a substrate 200, a main layer 210, and a chalcogen layer 215. The initial layer 205 can be composed of a single layer or a plurality of layers of one or more polymeric precursor compounds. Any of the layers of the initial layer 205 can be heated to form a thin film material layer before the deposition of the next layer. The initial layer 205 may be enriched in the quantity of a Group 11 atom. The main layer 210 is deposited onto the material layer formed from the initial layer 205, and can be composed of a plurality of layers of one or more polymeric precursor compounds. The main layer 210 may be deficient in the quantity of a Group 11 atom. Any of the layers of the main layer 210 can be heated to form a thin film material layer before the deposition of the next layer. The chalcogen layer 215 can be composed of one or more layers of one or more chalcogen sources, such as a chalcogen source compound or elemental source. The chalcogen layer 215 can be heated to form a thin film material layer.

In some embodiments, the initial layer 205 may be an adhesion promoting layer.

An initial layer 205 may have a thickness of from about 20 to 5000 nm. A main layer 210 may have a thickness of from about 20 to 5000 nm.

Each step of heating can transform any and all layers present on the substrate into a material layer. Thus, the schematic diagrams in FIGS. 4-8 represent the steps of a process to make a layered substrate which ultimately may be transformed into a single thin film material layer on the substrate. The schematic diagrams in FIGS. 4-8 do not necessarily directly represent a product material or a substrate article formed from the process.

Figure 6:
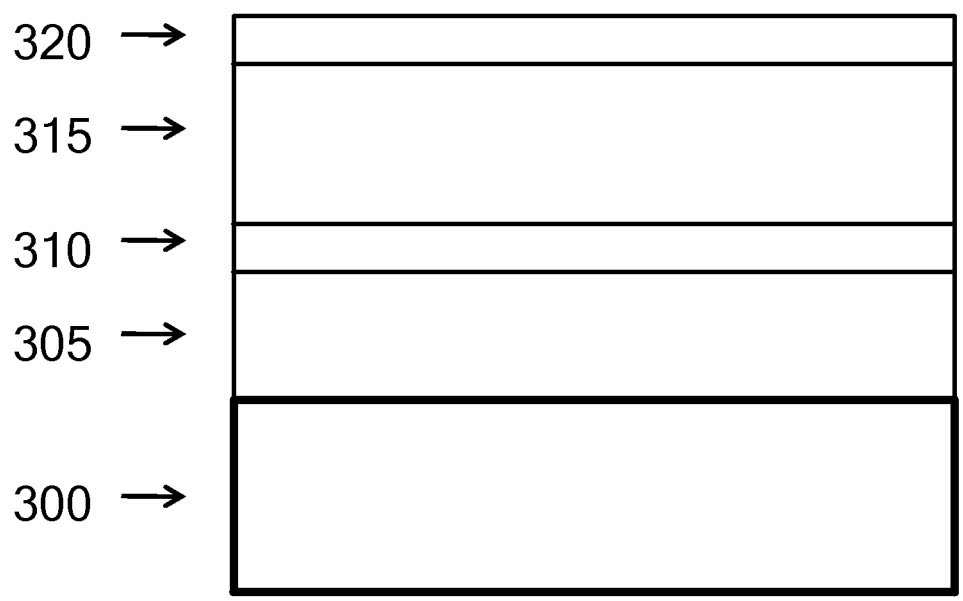
FIG. 6: Schematic representation of steps of a process to make a layered substrate in which a base layer, a chalcogen layer, a balance layer, and a second chalcogen layer are deposited on a substrate.

In additional aspects, a layered substrate can have a base layer deposited on a substrate, followed by deposition of an optional chalcogen layer, a balance layer, and an additional, optional chalcogen layer. As shown in FIG. 6, a process to make a layered substrate can have steps of depositing a base layer 305 on a substrate 300, an optional chalcogen layer 310, a balance layer 315, and an additional, optional chalcogen layer 320. The base layer 305 can be composed of a single layer or a plurality of layers of one or more polymeric precursor compounds. Any of the layers of the base layer 305 can be heated to form a thin film material layer before the deposition of the next layer. Any of the layers of the base layer 305 may be enriched in the quantity of a Group 11 atom. The balance layer 315 can be composed of a plurality of layers of one or more polymeric precursor compounds. Any of the layers of the balance layer 315 can be heated to form a thin film material layer before the deposition of the next layer. Any of the layers of the balance layer 315 may be deficient in the quantity of a Group 11 atom. The chalcogen layers 310 and 320 can be composed of one or more layers of one or more chalcogen sources, such as a chalcogen source compound or elemental source. The chalcogen layers 310 and 320 can be heated to form a thin film material layer. In some embodiments, the base layer 305 may be deficient in the quantity of a Group 11 atom and the balance layer 315 may be enriched in the quantity of a Group 11 atom.

A base layer 305 may have a thickness of from about 10 to 10,000 nm. A balance layer 315 may have a thickness of from about 10 to 5000 nm.

In certain embodiments, the order of the base layer 305 and the balance layer 315 in FIG. 6 may be reversed, so that the composition corresponding to the balance layer 315 may be adjacent to the substrate and between the substrate and a layer having the composition of the base layer 305.

Figure 7:
FIG. 7: Schematic representation of steps of a process to make a layered substrate in which a layer containing atoms of Group 13 and a chalcogen and a second layer containing atoms of Groups 11 and 13 are deposited on a substrate. The second layer can optionally contain atoms of a chalcogen.

In additional aspects, a layered substrate can have a first layer containing atoms of Groups 11 and 13 and atoms of a chalcogen deposited on a substrate, followed by deposition of a second layer containing atoms of Group 13 and atoms of a chalcogen. As shown in FIG. 7, a process to make a layered substrate can have steps of depositing a first layer 405 on a substrate 400, and a second layer 410. The first layer 405 can be composed of a plurality of layers of one or more polymeric precursor compounds, or any CIS or CIGS precursor compounds. Any of the layers of the first layer 405 can be heated to form a thin film material layer before the deposition of the next layer. Any of the layers of the first layer 405 may be enriched in the quantity of a Group 11 atom. An optional chalcogen layer may be deposited on the first layer 405. The optional chalcogen layer can be heated to form a thin film material layer. The first layer 405 can optionally be composed of a plurality of layers of one or more AIGS, CAIGS, CIGAS, AIGAS or CAIGAS precursor compounds. The second layer 410 can be composed of a single layer or a plurality of layers of one or more compounds containing atoms of Group 13 and atoms of a chalcogen. Any of the layers of the second layer 410 can be heated to form a thin film material layer before the deposition of the next layer.

In certain embodiments, the order of the second layer 410 and the first layer 405 in FIG. 7 may be reversed, so that the composition corresponding to the second layer 410 may be adjacent to the substrate and between the substrate and a layer having the composition of the first layer 405.

Figure 8:
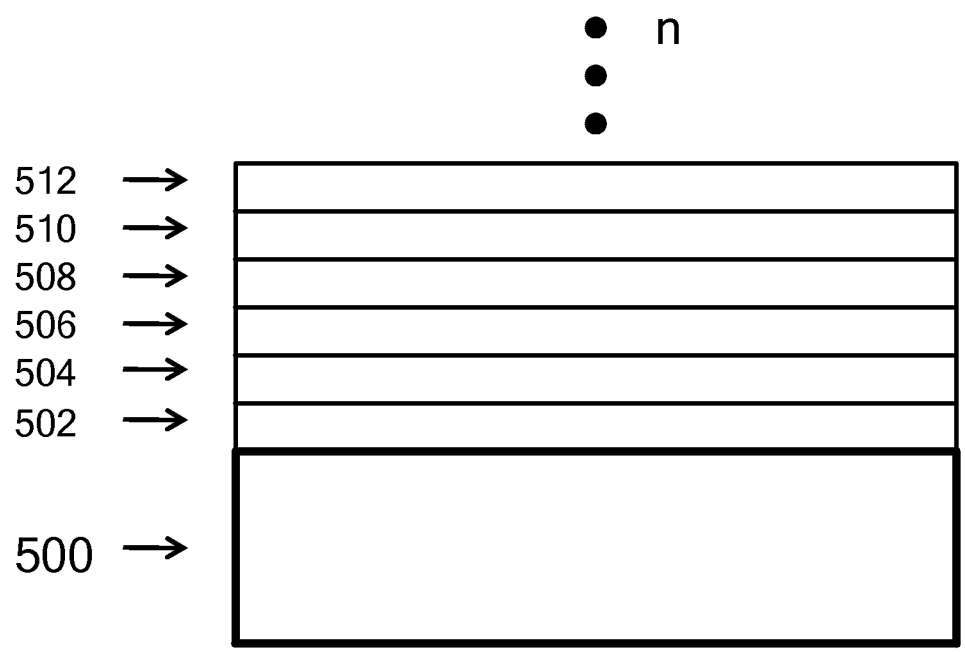
FIG. 8: Schematic representation of steps of a process to make a layered substrate in which a number of layers, n, are deposited on a substrate. Each deposited layer can contain atoms of any combination of Groups 11, 13, and chalcogen.

In some aspects, a layered substrate can have a number of layers, n, deposited on a substrate. As shown in FIG. 8, a process to make a layered substrate can have steps of depositing a number of layers 502, 504, 506, 508, 510, 512, and so on, up to n layers on a substrate 500. Each layer 502, 504, 506, 508, 510, 512, and so on, up to n layers can be composed of a single layer or a plurality of layers. Any of the layers can be heated to form a thin film material layer before the deposition of the next layer. The layers 502, 504, 506, 508, 510, 512, and so on, can each be composed of one or more polymeric precursor compounds. The polymeric precursor compounds can contain any combination of atoms of Groups 11 and 13 with arbitrarily predetermined stoichiometry. Any of the layers can be heated to form a thin film material layer before the deposition of the next layer. Any of the layers may be deficient or enriched in the quantity of a Group 11 atom. Some of the layers 502, 504, 506, 508, 510, 512, and so on, can be a chalcogen layer. The chalcogen layer can be heated to form a thin film material layer. In some embodiments, the layers 502, 504, 506, 508, 510, 512, and so on, are alternating layers of one or more polymeric precursor compounds and a chalcogen layer. Some of the layers 502, 504, 506, 508, 510, 512, and so on, may include a layer of a polymeric precursor compound between chalcogen layers. Some of the layers 502, 504, 506, 508, 510, 512, and so on, may include a layer of a polymeric precursor compound that is deficient in a Group 11 atom between layers that are enriched in a Group 11 atom.

In certain embodiments, sodium ions may be introduced into any of the layers.

Annealing Processes for Photovoltaic Absorber Materials

In some aspects, annealing of coated substrates may be performed for increasing the grain size of the photovoltaic absorber. For example, an annealing of coated substrates can be done to increase the grain size of a CIGS photovoltaic absorber material.

In some embodiments, the CIGS grain size can be increased by annealing a pre-formed CIGS material in the presence of selenium. Aspects of this invention including controlling the presence and concentration of selenium during the process for making a solar cell.

In certain aspects, an annealing process for coated substrates can be performed in the presence of a chalcogen, for example selenium.

In some embodiments, a process for annealing a coated substrate may be performed by arranging a thin film photovoltaic material on a substrate parallel to, and facing a selenium layer, where the thin film photovoltaic material and the selenium layer are spaced apart. Heating the substrate and the selenium layer can enhance the annealing of the thin film material because a flux of selenium vapor is rapidly generated close to the thin film photovoltaic material. In certain embodiments, alkali ions can be present in the thin film photovoltaic material prior to annealing. With alkali ions already present, annealing can proceed rapidly without the need for alkali ions to migrate from a different location or source in situ.

A selenium layer may be any layer containing atoms of selenium. A selenium layer can be formed from elemental selenium, or from selenium-containing compounds.

In some embodiments, the substrate is placed in an enclosure and selenium vapor is generated in the enclosure. The enclosure provides an increased concentration of selenium at the surface of the photovoltaic absorber material on the substrate.

In certain embodiments, the enclosure includes an injector head. Selenium vapor can be injected into the enclosure through the injector head. The injector head may optionally contain a reservoir for carrying a source of selenium.

In some embodiments, the selenium vapor can be generated in the enclosure. The enclosure may comprise a top plate 110 which encloses the space around the surface of the photovoltaic absorber material. The inner surface of the top plate, which is the surface facing the substrate 100, can be in close contact with the surface of the photovoltaic absorber material. The distance between the inner surface of the top plate and the surface of the photovoltaic absorber material 105 can be from about 10 to 3000 micrometers, or more. The distance between the inner surface of the top plate and the surface of the photovoltaic absorber material can be from about 20 to 500 micrometers, or from about 20 to 100 micrometers, or from about 50 to 150 micrometers. The top plate can be integral with the walls of the enclosure.

In one aspect, selenium vapor can be generated in the enclosure by vaporizing a chalcogen-containing layer 115 deposited on the inner surface of the top plate. The chalcogen-containing layer may be generated by depositing chalcogen vapor onto the inner surface of the top plate, for example selenium vapor. The deposition can be done by heating a selenium reservoir to generate selenium vapor, and exposing the inner surface of the top plate to the selenium vapor. In some embodiments, selenium vapor can be generated at 300° C.

In further aspects, a selenium-containing layer may be generated by depositing selenium ink onto the inner surface of the top plate. A layer of selenium ink can be deposited by spraying, coating, or printing the selenium ink.

Selenium vapor may be generated in the enclosure during annealing by vaporizing a selenium-containing layer deposited on the inner surface of the top plate while maintaining a temperature difference between the top plate and the photovoltaic absorber material. The temperature of the top plate can be maintained high enough to vaporize the selenium-containing layer, as well as to maintain the vapor phase. The temperature of the photovoltaic absorber material can be held high enough for annealing the photovoltaic absorber material and increasing its grain size.

Annealing in the presence of selenium can be performed at a range of times and temperatures. In some embodiments, the temperature of the photovoltaic absorber material is held at about 450° C. for 1 minute. In certain embodiments, the temperature of the photovoltaic absorber material is held at about 525° C. The time for annealing can range from 15 seconds to 60 minutes, or from 30 seconds to five minutes. The temperature for annealing can range from 400° C. to 650° C., or from 450° C. to 550° C.

In additional aspects, the annealing process can include sodium. As discussed above, sodium can be introduced in an ink or a photovoltaic absorber material by using an organic-soluble sodium-containing molecule.

Depositing Chalcogen Layers

In various processes of this disclosure, a composition or step may optionally include a chalcogen layer. Chalcogen can be introduced by various processes including spraying, coating, printing, and contact transfer processes, as well as an evaporation or sputtering process, a solution process, or a melt process.

In some embodiments, a chalcogen layer may be deposited with a chalcogen-containing ink. An ink may contain solubilized, elemental chalcogen, or a soluble chalcogen source compound such as an alkyl chalcogenide. Examples of solvents for elemental chalcogen and chalcogen source compounds include organic solvents, alcohols, water and amines.

In some embodiments, chalcogen may also be added to an ink containing metal atoms which is used to form a metal-containing layer, as in any one of FIGS. 4-8. Chalcogen may be added to an ink containing metal atoms by dissolving a chalcogen source compound or elemental chalcogen in a solvent and adding a portion of the solvent to the ink containing metal atoms. Chalcogen may be added to an ink containing metal atoms by dissolving a chalcogen source compound or elemental chalcogen in the ink containing metal atoms.

Examples of chalcogen source compounds include organoselenides, RSeR, RSeSeR, RSeSeSeR, and $R(Se)_nR$ where R is alkyl.

A chalcogen source compound may be irradiated with ultraviolet light to provide selenium. Irradiation of a selenium source compound may be done in a solution, or in an ink. Irradiation of a chalcogen source compound may also be done after deposition of the compound on a substrate.

Elemental chalcogens can be treated with a reducing agent to provide soluble selenide. Examples of reducing agents include $NaBH_4$, $LiAlH_4$, $Al(BH_4)_3$, diisobutylaluminum hydride, amines, diamines, mixtures of amines, ascorbic acid, formic acid, and mixtures of the foregoing.

Additional Sulfurization or Selenization

In various processes of this disclosure, a composition or material may optionally be subjected to a step of sulfurization or selenization.

Selenization may be carried out with elemental selenium or Se vapor. Sulfurization may be carried out with elemental sulfur. Sulfurization with $H_2S$ or selenization with $H_2Se$ may be carried out by using pure $H_2S$ or $H_2Se$, respectively, or may be done by dilution in nitrogen.

A sulfurization or selenization step can be done at any temperature from about 200° C. to about 600° C., or from about 200° C. to about 650° C., or at temperatures below 200° C. One or more steps of sulfurization and selenization may be performed concurrently, or sequentially.

Examples of sulfurizing agents include hydrogen sulfide, hydrogen sulfide diluted with hydrogen, elemental sulfur, sulfur powder, carbon disulfide, alkyl polysulfides, dimethyl sulfide, dimethyl disulfide, and mixtures thereof.

Examples of selenizing agents include hydrogen selenide, hydrogen selenide diluted with hydrogen, elemental selenium, selenium powder, carbon diselenide, alkyl polyselenides, dimethyl selenide, dimethyl diselenide, and mixtures thereof.

A sulfurization or selenization step can also be done with co-deposition of another metal such as copper, indium, or gallium.

Methods and Compositions for Stoichiometric Gradients

Embodiments of this invention may further provide the ability to make thin film materials having a compositional gradient. The compositional gradient may be a variation in the concentration or ratio of any of the atoms in a semiconductor or thin film material.

The process steps shown in FIG. 8 can be used to make a layered substrate having a gradient in the stoichiometry of a Group 11 or Group 13 atom. A composition gradient can be formed using a series of polymeric precursor compounds having a sequentially increasing or decreasing concentration or ratio of certain Group 11 or Group 13 atoms.

In some embodiments, the compositional gradient may be a gradient of the concentration of indium or gallium, or a gradient of the ratio of atoms of indium to gallium.

In certain embodiments, the compositional gradient may be a gradient of the ratio of atoms of copper to indium or gallium.

In further embodiments, the compositional gradient may be a gradient of the ratio of atoms of copper to silver.

In some embodiments, the compositional gradient may be a gradient of the level of alkali metal ions.

In some variations, the compositional gradient may be a gradient of the ratio of atoms of selenium to sulfur.

A gradient can be a continuous variation in a concentration, or a step-change variation in a concentration.

The compositional gradient may be a gradient of the ratio of atoms of indium to gallium according to the formula $Cu_x(In_{1-y}Ga_y)_v(S_{1-z}Se_z)_w$, wherein y increases from about 0 to 1.0 over the gradient as the distance from the substrate increases, and wherein x is from 0.6 to 1.0, z is from 0 to 1, v is from 0.95 to 1.05, and w is from 1.8 to 2.2.

The compositional gradient may be a gradient of the ratio of atoms of copper to atoms of indium plus gallium according to the formula $Cu_x(In_{1-y}Ga_y)_v(S_{1-z}Se_z)_w$, wherein x decreases from about 1.5 to 0.5 over the gradient as the distance from the substrate increases, and wherein y is from 0 to 1, z is from 0 to 1, v is from 0.95 to 1.05, and w is from 1.8 to 2.2.

The polymeric precursors may be prepared as a series of ink formulations which represent the compositional gradient.

Empirical Formulas of Polymeric Precursors

This disclosure provides a range of polymeric precursor compounds having two or more different metal atoms and chalcogen atoms.

In certain aspects, a polymeric precursor compound may contain metal certain atoms and atoms of Group 13. Any of these atoms may be bonded to one or more atoms selected from atoms of Group 15, S, Se, and Te, as well as one or more ligands.

A polymeric precursor compound may be a neutral compound, or an ionic form, or have a charged complex or counterion. In some embodiments, an ionic form of a polymeric precursor compound may contain a divalent metal atom, or a divalent metal atom as a counterion.

A polymeric precursor compound may contain atoms selected from the transition metals of Group 3 through Group 12, B, Al, Ga, In, Tl, Si, Ge, Sn, Pb, As, Sb, and Bi. Any of these atoms may be bonded to one or more atoms selected from atoms of Group 15, S, Se, and Te, as well as one or more ligands.

A polymeric precursor compound may contain atoms selected from Ni, Pd, Pt, Cu, Ag, Au, Zn, Cd, Hg, B, Al, Ga, In, Tl, Si, Ge, Sn, Pb, and Bi. Any of these atoms may be bonded to one or more atoms selected from atoms of Group 15, S, Se, and Te, as well as one or more ligands.

In some embodiments, a polymeric precursor compound may contain atoms selected from Cu, Ag, Zn, Al, Ga, In, Tl, Si, Ge, Sn, and Pb. Any of these atoms may be bonded to one or more atoms selected from atoms of Group 15, S, Se, and Te, as well as one or more ligands.

In some embodiments, a polymeric precursor compound may contain atoms selected from Cu, Ag, Zn, Al, Ga, In, Tl, Si, Ge, Sn, and Pb. Any of these atoms may be bonded to one or more chalcogen atoms, as well as one or more ligands.

In some variations, a polymeric precursor compound may contain atoms selected from Cu, Ag, In, Ga, and Al. Any of these atoms may be bonded to one or more atoms selected from S, Se, and Te, as well as one or more ligands.

Polymeric Precursor Structure and Properties (MPP)

A polymeric precursor compound of this disclosure is stable at ambient temperatures. Polymeric precursors can be used for making layered materials, optoelectronic materials, and devices. Using polymeric precursors advantageously allows control of the stoichiometry, structure, and ratios of various atoms in a material, layer, or semiconductor.

Polymeric precursor compounds of this invention may be solids, solids with low melting temperatures, semisolids, flowable solids, gums, or rubber-like solids, oily substances, or liquids at ambient temperatures, or temperatures moderately elevated from ambient. Embodiments of this disclosure that are fluids at temperatures moderately elevated from ambient can provide superior processability for production of solar cells and other products, as well as the enhanced ability to be processed on a variety of substrates including flexible substrates.

In general, a polymeric precursor compound can be processed through the application of heat, light, kinetic, mechanical or other energy to be converted to a material, including a semiconductor material. In these processes, a polymeric precursor compound undergoes a transition to become a material. The conversion of a polymeric precursor compound to a material can be done in processes known in the art, as well as the novel processes of this disclosure.

Embodiments of this invention may further provide processes for making optoelectronic materials. Following the synthesis of a polymeric precursor compound, the compound can be deposited, sprayed, or printed onto a substrate by various means. Conversion of the polymeric precursor compound to a material can be done during or after the process of depositing, spraying, or printing the compound onto the substrate.

A polymeric precursor compound of this disclosure may have a transition temperature below about 400° C., or below about 300° C., or below about 280° C., or below about 260° C., or below about 240° C., or below about 220° C., or below about 200° C.

In some aspects, polymeric precursors of this disclosure include molecules that are processable in a flowable form at temperatures below about 100° C. In certain aspects, a polymeric precursor can be fluid, liquid, flowable, flowable melt, or semisolid at relatively low temperatures and can be processed as a neat solid, semisolid, neat flowable liquid or melt, flowable solid, gum, rubber-like solid, oily substance, or liquid. In certain embodiments, a polymeric precursor is processable as a flowable liquid or melt at a temperature below about 200° C., or below about 180° C., or below about 160° C., or below about 140° C., or below about 120° C., or below about 100° C., or below about 80° C., or below about 60° C., or below about 40° C.

A polymeric precursor compound of this invention can be crystalline or amorphous, and can be soluble in various non-aqueous solvents.

A polymeric precursor compound may contain ligands, or ligand fragments, or portions of ligands that can be removed under mild conditions, at relatively low temperatures, and therefore provide a facile route to convert the polymeric precursor to a material or semiconductor. The ligands, or some atoms of the ligands, may be removable in various processes, including certain methods for depositing, spraying, and printing, as well as by application of energy.

These advantageous features allow enhanced control over the structure of a semiconductor material made with the polymeric precursor compounds of this invention.

Polymeric Precursors for Semiconductors and Optoelectronics (MPP)

This invention provides a range of polymeric precursor structures, compositions, and molecules having two or more different metal atoms.

In some embodiments, a polymeric precursor compound contains atoms $M^B$ of Group 13 selected from Al, Ga, In, Tl and any combination thereof.

The atoms $M^B$ may be any combination of atoms of Al, Ga, In, and Tl. The atoms $M^B$ may be all of the same kind, or may be combinations of any two, or three, or four of the atoms of Al, Ga, In, and Tl. The atoms $M^B$ may be a combination of any two of the atoms of Al, Ga, In, and Tl, for example, a combination of In and Ga, In and Tl, Ga and Tl, In and Al, Ga and Al, and so forth. The atoms $M^B$ may be a combination of In and Ga.

These polymeric precursor compounds further contain monovalent metal atoms $M^A$ selected from the transition metals of Group 3 through Group 12, as described above.

The atoms $M^A$ may be any combination of atoms of Cu, Ag, and Au.

The polymeric precursors of this disclosure can be considered inorganic polymers or coordination polymers.

The polymeric precursors of this disclosure may be represented in different ways, using different formulas to describe the same structure.

In some aspects, a polymeric precursor of this disclosure may be a distribution of polymer molecules or chains. The distribution may encompass molecules or chains having a range of chain lengths or molecular sizes. A polymeric precursor can be a mixture of polymers, polymer molecules or chains. The distribution of a polymeric precursor can be centered or weighted about a particular molecular weight or chain mass.

Embodiments of this invention further provide polymeric precursors that can be described as AB alternating addition copolymers.

The AB alternating addition copolymer is in general composed of repeat units A and B. The repeat units A and B are each derived from a monomer. The repeat units A and B may also be referred to as being monomers, although the empirical formula of monomer A is different from the empirical formula of repeat unit A.

The monomer for $M^A$ can be $M^A(ER)$, where $M^A$ is as described above.

The monomer for $M^B$ can be $M^B(ER)_3$, where $M^B$ is Al, Ga, In, or a combination thereof.

In a polymeric precursor, monomers of A link to monomers of B to provide a polymer chain, whether linear, cyclic, or branched, or of any other shape, that has repeat units A, each having the formula $\{M^A(ER)_2\}$, and repeat units B, each having the formula $\{M^B(ER)_2\}$. The repeat units A and B may appear in alternating order in the chain, for example, •••ABABABABAB•••.

In some embodiments, a polymeric precursor may have different atoms $M^B$ selected from Al, Ga, In, or a combination thereof, where the different atoms appear in random order in the structure.

The polymeric precursor compounds of this invention may be made with any desired stoichiometry regarding the number of different metal atoms and Group 13 atoms, and their respective stoichiometric level or ratio. The stoichiometry of a polymeric precursor compound may be controlled through the concentrations of monomers, or repeating units in the polymer chains of the precursors. A polymeric precursor compound may be made with any desired stoichiometry regarding the number of different metal atoms and atoms of Group 13 and their respective stoichiometric levels or ratios.

In some aspects, this disclosure provides polymeric precursors which are inorganic AB alternating addition copolymers having one of the following Formulas 1 through 13:

| | |
|---|---|
| $(RE)_2\text{-}[B(AB)_n]^-$ | Formula 1 |
| $(RE)_2\text{-}[(BA)_nB]^-$ | Formula 2 |
| $(RE)_2\text{-}BB(AB)_n$ | Formula 3 |
| $(RE)_2\text{-}B(AB)_nB$ | Formula 4 |
| $(RE)_2\text{-}B(AB)_nB(AB)_m$ | Formula 5 |
| $(RE)_2\text{-}(BA)_nBB$ | Formula 6 |
| $(RE)_2\text{-}B(BA)_nB$ | Formula 7 |
| $(RE)_2\text{-}(BA)_nB(BA)_mB$ | Formula 8 |
| $^{cyclic}(AB)_n$ | Formula 9 |
| $^{cyclic}(BA)_n$ | Formula 10 |
| $(RE)_2\text{-}(BB)(AABB)_n$ | Formula 11 |
| $(RE)_2\text{-}(BB)(AABB)_n(AB)_m$ | Formula 12 |
| $(RE)_2\text{-}(B)(AABB)_n(B)(AB)_n$ | Formula 13 | where A and B are as defined above, E is S, Se, or Te, and R is defined below.

Formulas 1 and 2 describe ionic forms that have a counterion or counterions not shown. Examples of counterions include alkali metal ions, Na, Li, and K.

The formulas $RE\text{-}B(AB)_n$ and $RE\text{-}(BA)_nB$ may describe stable molecules under certain conditions.

Figure 9:
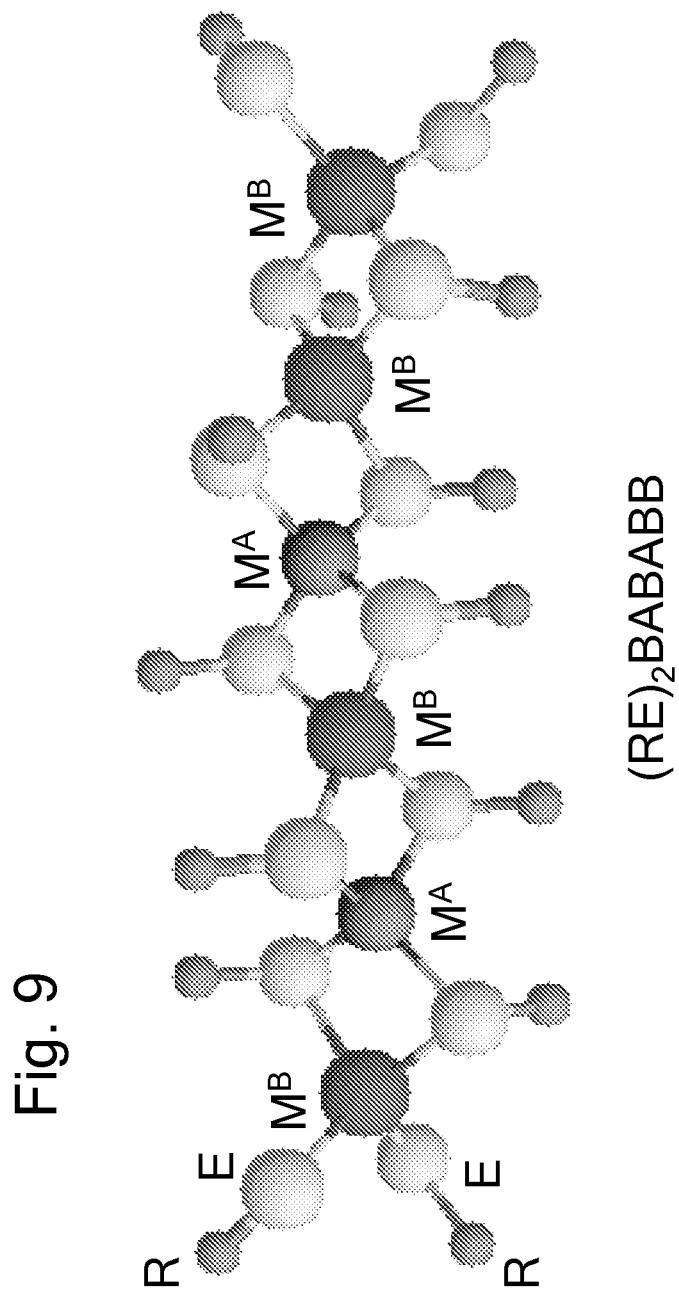
FIG. 9.

For example, an embodiment of a polymeric precursor compound of Formula 4 is shown in FIG. 9. As shown in FIG. 9, the structure of the compound can be represented by the formula $(RE)_2BABABB$, wherein A is the repeat unit $\{M^A(ER)_2\}$, B is the repeat unit $\{M^B(ER)_2\}$, E is a chalcogen, and R is a functional group defined below.

Figure 10:
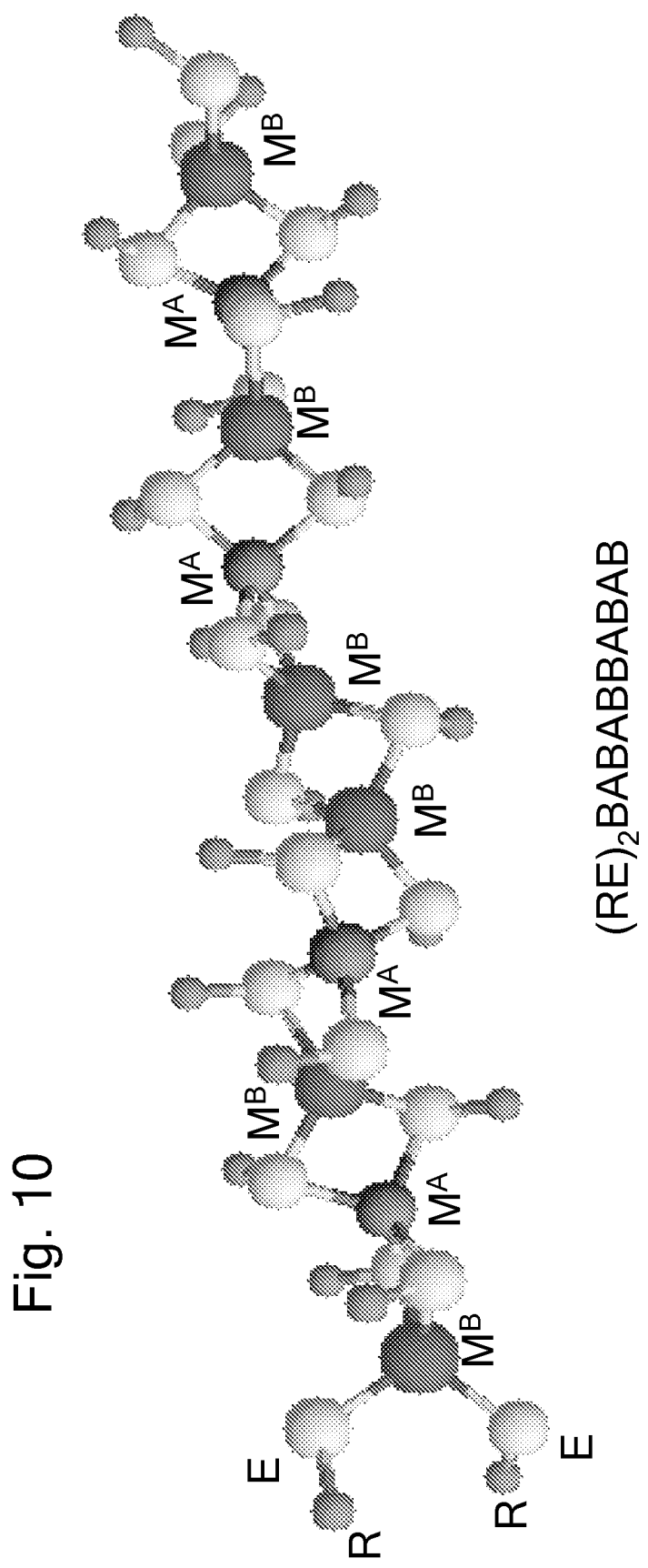
FIG. 10.

In another example, an embodiment of a polymeric precursor compound of Formula 5 is shown in FIG. 10. As shown in FIG. 10, the structure of the compound can be represented by the formula $(RE)_2BABABBABAB$, wherein A is the repeat unit $\{M^A(ER)_2\}$, B is the repeat unit $\{M^B(ER)_2\}$, E is a chalcogen, and R is a functional group defined below.

Figure 11:
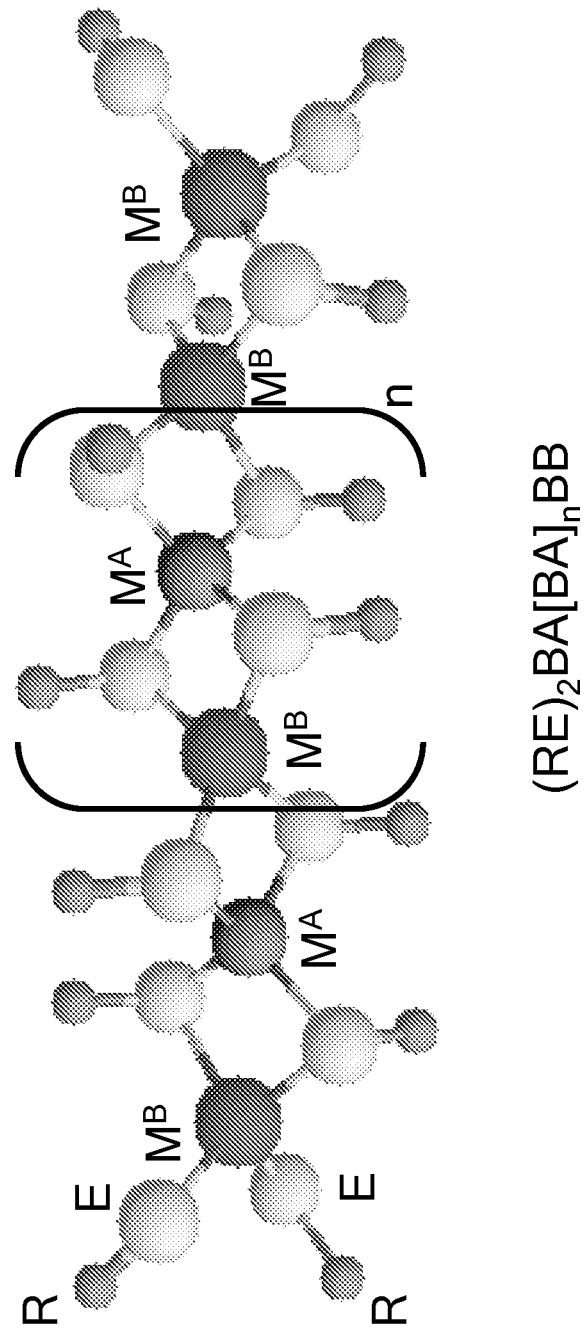
FIG. 11.

In a further example, an embodiment of a polymeric precursor compound of Formula 6 is shown in FIG. 11. As shown in FIG. 11, the structure of the compound can be represented by the formula $(RE)_2BA(BA)_nBB$, wherein A is the repeat unit $\{M^A(ER)_2\}$, B is the repeat unit $\{M^B(ER)_2\}$, E is a chalcogen, and R is a functional group defined below.

Figure 12:
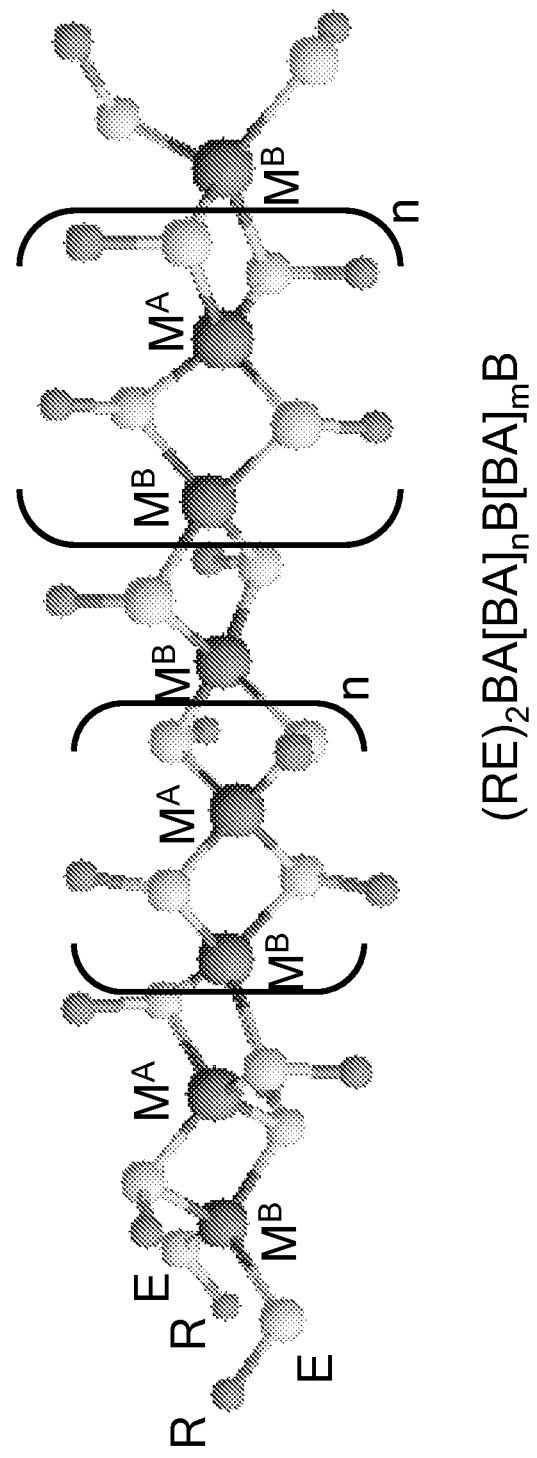
FIG. 12.

In another example, an embodiment of a polymeric precursor compound of Formula 8 is shown in FIG. 12. As shown in FIG. 12, the structure of the compound can be represented by the formula $(RE)_2BA(BA)_nB(BA)_mB$, wherein A is the repeat unit $\{M^A(ER)_2\}$, B is the repeat unit $\{M^B(ER)_2\}$, E is a chalcogen, and R is a functional group defined below.

Figure 13:
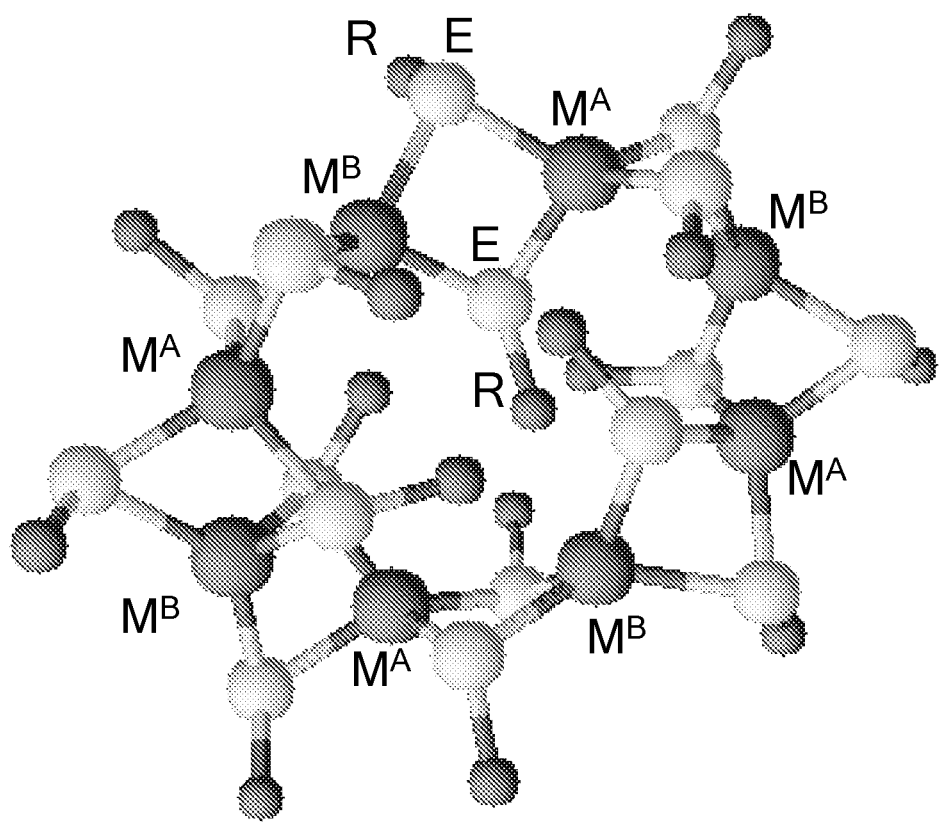
FIG. 13.

In a further example, an embodiment of a polymeric precursor compound of Formula 10 is shown in FIG. 13. As shown in FIG. 13, the structure of the compound can be represented by the formula $^{cyclic}(BA)_4$, wherein A is the repeat unit $\{M^A(ER)_2\}$, B is the repeat unit $\{M^B(ER)_2\}$, E is a chalcogen, and R is a functional group defined below.

A polymeric precursor having one of Formulas 1-8 and 11-13 may be of any length or molecular size. The values of n and m can be one (1) or more. In certain embodiments, the values of n and m are 2 or more, or 3 or more, or 4 or more, or 5 or more, or 6 or more, or 7 or more, or 8 or more, or 9 or more, or 10 or more. In some embodiments, n and m are independently from 2 to about one million, or from 2 to about 100,000, or from 2 to about 10,000, or from 2 to about 5000, or from 2 to about 1000, or from 2 to about 500, or from 2 to about 100, or from 2 to about 50.

A cyclic polymeric precursor having one of Formulas 9 or 10 may be of any molecular size. The value of n may be two (2) or more. In certain variations, the values of n and m are 2 or more, or 3 or more, or 4 or more, or 5 or more, or 6 or more, or 7 or more, or 8 or more, or 9 or more, or 10 or more. In some embodiments, for cyclic Formulas 9 and 10, n is from 2 to about 50, or from 2 to about 20, or from 2 to about 16, or from 2 to about 14, or from 2 to about 12, or from 2 to about 10, or from 2 to about 8.

The molecular weight of a polymeric precursor compound can be from about 1000 to 50,000, or from about 10,000 to 100,000, or from about 5000 to 500,000, or greater.

In another aspect, the repeat units $\{M^B(ER)_2\}$ and $\{M^A(ER)_2\}$ may be considered "handed" because the metal atom $M^A$ and the Group 13 atom $M^B$ appear on the left, while the chalcogen atom E appears to the right side. Thus, a linear terminated chain will in general require an additional chalcogen group or groups on the left terminus, as in Formulas 1-8 and 11-13, to complete the structure. A cyclic chain, as described by Formulas 9 and 10, does not require an additional chalcogen group or groups for termination.

In certain aspects, structures of Formulas 1-8 and 11-13, where n and m are one (1), may be described as adducts. For example, adducts include $(RE)_2\text{-}BBAB$, $(RE)_2\text{-}BABB$, and $(RE)_2\text{-}BABBAB$.

In some embodiments, a polymeric precursor may include a structure that is an AABB alternating block copolymer. For example, a polymeric precursor or portions of a precursor structure may contain one or more consecutive repeat units $\{AABB\}$. A polymeric precursor having an AABB alternating block copolymer may be represented by Formula 11 above.

In some aspects, this disclosure provides polymeric precursors which are inorganic AB alternating addition copolymers having the repeat units of Formula 14

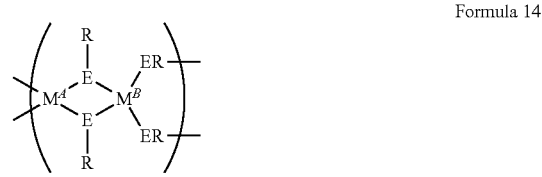

Formula 14 where atoms $M^B$ are atoms of Group 13 selected from Al, Ga, In, and Tl, and E is S, Se, or Te.

In certain aspects, this invention provides polymeric precursors having a number n of the repeat units of Formula 14, where n may be 1 or more, or 2 or more, or 3 or more, or 4 or more, or 5 or more, or 6 or more, or 7 or more, or 8 or more, or 9 or more, or 10 or more, or 11 or more, or 12 or more.

The AB copolymer of Formula 14 may also be represented as $(AB)_n$ or $(BA)_n$, which represents a polymer of any chain length. Another way to represent certain AB copolymers is the formula •••ABAB•••.

In further variations, this invention provides polymeric precursors that may be represented by Formula 15

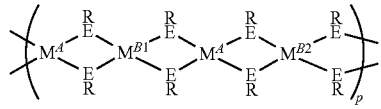

Formula 15 where atoms $M^{B1}$ and $M^{B2}$ are the same or different atoms of Group 13 selected from Al, Ga, In, Tl, or a combination thereof, E is S, Se, or Te, and p is one (1) or more.

where atoms $M^{B1}$ and $M^{B2}$ are the same or different atoms of Group 13 selected from Al, Ga, In, Tl, or a combination thereof, atoms $M^{A1}$ and $M^{A2}$ are the same or different and are atoms selected from Cu, Au, Ag, and Hg, E is S, Se, or Te, and p is one (1) or more.

In another aspect, this disclosure provides inorganic AB alternating copolymers which may be represented by Formula 17

 Formula 17 where $B^1$, $B^2$, and $B^3$ are repeat units containing atoms $M^{B1}$, $M^{B2}$, and $M^{B3}$, respectively, which are atoms of Al, Ga, In, Tl or a combination thereof.

Certain empirical formulas for monomers and polymeric precursors of this invention are summarized in Table 1.

TABLE 1

Empirical formulas for monomers, repeat units and polymeric precursors

| Formula | Representative Constitutional Chain Unit | Description |
|---|---|---|
| A | $\{M^A(ER)_2\}$ | From monomer $M^A(ER)$, where $M^A$ is Cu, Au, Ag |
| B | $\{M^B(ER)_2\}$ | From monomer $M^B(ER)_3$, where $M^B$ is Al, Ga, In, Tl, or a combination thereof |
| AB | $\{M^A(ER)_2 M^B(ER)_2\}$ | Polymer chain repeat unit |
| ABA | $\{M^A(ER)_2 M^B(ER)_2 M^A(ER)_2\}$ | An adduct, trimer, or oligomer |
| $B^1AB^2$ | $\{M^{B1}(ER)_2 M^A(ER)_2 M^{B2}(ER)_2\}$ | Polymer chain repeat unit, $M^{B1}$ and $M^{B2}$ may be the same or different, a trimer or oligomer |
| $AB^1AB^2$ | $\{M^A(ER)_2 M^{B1}(ER)_2 M^A(ER)_2 M^{B2}(ER)_2\}$ | Alternating copolymer $(AB)_n$, a tetramer or oligomer |
| $AB^1AB^2AB^3$ | $\{M^A(ER)_2 M^{B1}(ER)_2 M^A(ER)_2 M^{B2}(ER)_2 M^A(ER)_2 M^{B3}(ER)_2\}$ | Polymer, or an AB trimer, or an oligomer |
| $(AB)_n$ or $(BA)_n$ | $-\!\!+\!\!A\!\!-\!\!B\!\!+_n\!\!-$  or  $-\!\!+\!\!B\!\!-\!\!A\!\!+_n\!\!-$ | Polymer of any chain length |
| ···ABAB··· | $-\!\!+\!\!A\!\!-\!\!B\!\!-\!\!A\!\!-\!\!B\!\!+\!\!-$ | Polymer of any length, whether linear, branched, or cyclic |
| {AABB} | $-\!\!+\!\!A\!\!-\!\!A\!\!-\!\!B\!\!-\!\!B\!\!+\!\!-$ | AABB alternating block copolymer |
| $^{cyclic}(AB)_4$ or $^{cyclic}(BA)_4$ | (cyclic structure A-B-A-B-A-B-A-B) | Cyclic polymer chain, oligomer or octamer |

In further aspects, this invention provides polymeric precursors which may be represented by Formula 16

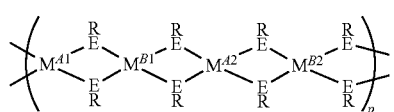

Formula 16

In Table 1, the "representative constitutional chain unit" refers to the repeating unit of the polymer chain. In general, the number and appearance of electrons, ligands, or R groups in a representative constitutional chain repeating unit does not necessarily reflect the oxidation state of the metal atom. For example, the chain repeating unit A, which is $\{M^A(ER)_2\}$, arises from the monomer $M^A(ER)$, where $M^A$ is a metal atom of monovalent oxidation state 1 (I or one) as described above, or any combination of Cu, Ag and Au. It is to be understood that the repeating unit exists in the polymer chain bonded to two other repeating units, or to a repeating unit and a chain terminating unit. Likewise, the chain repeating unit B, which is {M$^B$(ER)$_2$}, arises from the monomer M$^B$(ER)$_3$, where M$^B$ is a Group 13 atom of trivalent oxidation state 3 (III or three) selected from Al, Ga, In, Tl, and any combination thereof, including where any one or more of those atoms are not present. In one aspect, monomer M$^A$(ER), and monomer M$^B$(ER)$_3$, combine to form an AB repeating unit, which is {M$^A$(ER)$_2$M$^B$(ER)$_2$}.

In some aspects, this disclosure provides AB alternating copolymers which may also be alternating with respect to M$^A$ or M$^B$. A polymeric precursor that is alternating with respect to M$^A$ may contain chain regions having alternating atoms M$^{A1}$ and M$^{A2}$. A polymeric precursor that is alternating with respect to M$^B$ may contain chain regions having alternating atoms M$^{B1}$ and M$^{B2}$.

In further aspects, this disclosure provides AB alternating block copolymers which may contain one or more blocks of n repeat units, represented as (AB$^1$)$_n$ or (B$^1$A)$_n$, where the block of repeat units contains only one kind of atom M$^{B1}$ selected from Group 13. A block may also be a repeat unit represented as (A$^1$B)$_n$ or (BA$^1$)$_n$, where the block of repeat units contains only one kind of atom M$^{A1}$. A polymeric precursor of this disclosure may contain one or more blocks of repeat units having different Group 13 atoms in each block, or different atoms M$^A$ in each block. For example, a polymeric precursor may have one of the following formulas:

Formula 18

Formula 19

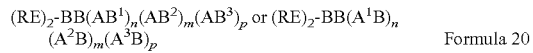

Formula 20

Formula 21

Formula 22

Formula 23 where B$^1$, B$^2$ and B$^3$ represent repeat units {M$^{B1}$(ER)$_2$}, {M$^{B2}$(ER)$_2$}, and {M$^{B3}$(ER)$_2$}, respectively, where M$^{B1}$, M$^{B2}$ and M$^{B3}$ are atoms of Group 13, each different from the other, independently selected from Al, In, Ga, Tl, or a combination thereof, and where A$^1$, A$^2$ and A$^3$ represent repeat units {M$^{A1}$(ER)$_2$}, {M$^{A2}$(ER)$_2$}, and {M$^{A3}$(ER)$_2$}, respectively, where M$^{A1}$, M$^{A2}$ and M$^{A3}$ are each different from the other and are identified as described above for M$^A$. In Formulas 18 through 23, the values of n, m, and p may be 2 or more, or 3 or more, or 4 or more, or 5 or more, or 6 or more, or 7 or more, or 8 or more, or 9 or more, or 10 or more, or 11 or more, or 12 or more.

In certain embodiments, an M$^B$ monomer can contain a chelating group -ERE-, for example, having the formula M$^B$(ERE).

In some embodiments, a monomer may exist in a dimeric form under ambient conditions, or a trimeric or higher form, and can be used as a reagent in such forms. It is understood that the term monomer would refer to all such forms, whether found under ambient conditions, or found during the process for synthesizing a polymeric precursor from the monomer. The formulas M$^A$(ER) and M$^B$(ER)$_3$, for example, should be taken to encompass the monomer in such dimeric or higher forms, if any. A monomer in a dimeric or higher form, when used as a reagent can provide the monomer form.

The polymeric precursors of this invention obtained by reacting monomers M$^A$(ER) and M$^B$(ER)$_3$ can be advantageously highly soluble in organic solvent, whereas one or more of the monomers may have been insoluble.

As used herein, the terms "polymer" and "polymeric" refer to a polymerized moiety, a polymerized monomer, a repeating chain made of repeating units, or a polymer chain or polymer molecule. A polymer or polymer chain may be defined by recitation of its repeating unit or units, and may have various shapes or connectivities such as linear, branched, cyclic, and dendrimeric. Unless otherwise specified, the terms polymer and polymeric include homopolymers, copolymers, block copolymers, alternating polymers, terpolymers, polymers containing any number of different monomers, oligomers, networks, two-dimensional networks, three-dimensional networks, crosslinked polymers, short and long chains, high and low molecular weight polymer chains, macromolecules, and other forms of repeating structures such as dendrimers. Polymers include those having linear, branched and cyclic polymer chains, and polymers having long or short branches.

As used herein, the term "polymeric component" refers to a component of a composition, where the component is a polymer, or may form a polymer by polymerization. The term polymeric component includes a polymerizable monomer or polymerizable molecule. A polymeric component may have any combination of the monomers or polymers which make up any of the example polymers described herein, or may be a blend of polymers.

Embodiments of this invention may further provide polymeric precursors having polymer chain structures with repeating units. The stoichiometry of these polymeric precursors may be precisely controlled to provide accurate levels of any desired arbitrary ratio of particular atoms. Precursor compounds having controlled stoichiometry can be used to make bulk materials, layers, and semiconductor materials having controlled stoichiometry. In some aspects, precisely controlling the stoichiometry of a polymeric precursor may be achieved by controlling the stoichiometry of the reagents, reactants, monomers or compounds used to prepare the polymeric precursor.

For the polymeric precursors of this invention, the group R in the formulas above, or a portion thereof, may be a good leaving group in relation to a transition of the polymeric precursor compound at elevated temperatures or upon application of energy.

The functional groups R in the formulas above and in Table 1 may each be the same or different from the other and are groups attached through a carbon or non-carbon atom, including alkyl, aryl, heteroaryl, alkenyl, amido, silyl, and inorganic and organic ligands. In some embodiments, the groups R are each the same or different from the other and are alkyl groups attached through a carbon atom.

In some aspects, the monomer for M$^B$ can be represented as M$^B$(ER$^1$)$_3$, and the monomer for M$^A$ can be represented as M$^A$(ER$^2$), where R$^1$ and R$^2$ are the same or different and are groups attached through a carbon or non-carbon atom, including alkyl, aryl, heteroaryl, alkenyl, amido, silyl, and inorganic and organic ligands. In some embodiments, the groups R$^1$ and R$^2$ are each the same or different from the other and are alkyl groups attached through a carbon atom.

In certain variations, the monomer for M$^B$ may be M$^B$(ER$^1$)(ER$^2$)$_2$, where R$^1$ and R$^2$ are different and are groups attached through a carbon or non-carbon atom, including alkyl, aryl, heteroaryl, alkenyl, amido, silyl, and inorganic and organic ligands. In some embodiments, the groups R$^1$ and R$^2$, of M$^B$(ER$^1$)(ER$^2$)$_2$, are different and are alkyl groups attached through a carbon atom.

In some embodiments, polymeric precursor compounds advantageously do not contain a phosphine ligand, or a ligand or attached compound containing phosphorus, arsenic, or antimony, or a halogen ligand.

In further embodiments, the groups R may independently be (C1-22)alkyl groups. In these embodiments, the alkyl group may be a (C1)alkyl (methyl), or a (C2)alkyl (ethyl), or a (C3)alkyl, or a (C4)alkyl, or a (C5)alkyl, or a (C6)alkyl, or a (C7)alkyl, or a (C8)alkyl, or a (C9)alkyl, or a (C10)alkyl, or a (C11)alkyl, or a (C12)alkyl, or a (C13)alkyl, or a (C14) alkyl, or a (C15)alkyl, or a (C16)alkyl, or a (C17)alkyl, or a (C18)alkyl, or a (C19)alkyl, or a (C20)alkyl, or a (C21)alkyl, or a (C22)alkyl.

In certain embodiments, the groups R may independently be (C1-12)alkyl groups. In these embodiments, the alkyl group may be a (C1)alkyl (methyl), or a (C2)alkyl (ethyl), or a (C3)alkyl, or a (C4)alkyl, or a (C5)alkyl, or a (C6)alkyl, or a (C7)alkyl, or a (C8)alkyl, or a (C9)alkyl, or a (C10)alkyl, or a (C11)alkyl, or a (C12)alkyl.

In certain embodiments, the groups R may independently be (C1-6)alkyl groups. In these embodiments, the alkyl group may be a (C1)alkyl (methyl), or a (C2)alkyl (ethyl), or a (C3)alkyl, or a (C4)alkyl, or a (C5)alkyl, or a (C6)alkyl.

A polymeric precursor compound may be crystalline, or non-crystalline.

In some embodiments, a polymeric precursor may be a compound comprising repeating units $\{M^B(ER)(ER)\}$ and $\{M^A(ER)(ER)\}$, wherein $M^A$ is a monovalent metal atom selected from Cu, Au, Ag, or a combination thereof, $M^B$ is an atom of Group 13, E is S, Se, or Te, and R is independently selected, for each occurrence, from alkyl, aryl, heteroaryl, alkenyl, amido, silyl, and inorganic and organic ligands. In certain embodiments, the atoms $M^B$ in the repeating units $\{M^B(ER)(ER)\}$ are randomly selected from atoms of Group 13. In certain variations, $M^A$ is Cu, Ag, or a mixture of Cu and Ag, and the atoms $M^B$ are selected from indium and gallium. E may be only selenium in a polymeric precursor, and the groups R may be independently selected, for each occurrence, from (C1-6)alkyl.

Embodiments of this invention may further provide polymeric precursors that are linear, branched, cyclic, or a mixture of any of the foregoing. Some polymeric precursors may be a flowable liquid or melt at a temperature below about 100° C.

In some aspects, a polymeric precursor may contain n repeating units $\{M^B(ER)(ER)\}$ and n repeating units $\{M^A(ER)(ER)\}$, wherein n is one or more, or n is two or more, or n is three or more, or n is four or more, or n is eight or more. In some embodiments, n is from one to ten thousand, or n is from one to one thousand, or from one to five hundred, or from one to one hundred, or from one to fifty.

In further aspects, the molecular size of a polymeric precursor may be from about 500 Daltons to about 3000 kDa, or from about 500 Daltons to about 1000 kDa, or from about 500 Daltons to about 100 kDa, or from about 500 Daltons to about 50 kDa, or from about 500 Daltons to about 10 kDa. In some embodiments, the molecular size of a polymeric precursor may be greater than about 3000 kDa.

The repeating units $\{M^B(ER)(ER)\}$ and $\{M^A(ER)(ER)\}$ may be alternating. A polymeric precursor may be described by the formula $(AB)_n$, wherein A is the repeat unit $\{M^A(ER)(ER)\}$, B is the repeat unit $\{M^B(ER)(ER)\}$, n is one or more, or n is two or more, and R is independently selected, for each occurrence, from alkyl, aryl, heteroaryl, alkenyl, amido, silyl, and inorganic and organic ligands. In some variations, a polymeric precursor may have any one of the formulas $(RE)_2\text{-BB}(AB)_n$, $(RE)_2\text{-B}(AB)_n B$, $(RE)_2\text{-B}(AB)_n B(AB)_m$, $(RE)_2\text{-}(BA)_n BB$, $(RE)_2\text{-B}(BA)_n B$, $(RE)_2\text{-}(BA)_n B(BA)_m B$, $^{cyclic}(AB)_n$, $^{cyclic}(BA)_n$, $(RE)_2\text{-}(BB)(AABB)_n$, $(RE)_2\text{-}(BB)(AABB)_n(AB)_m$, $(RE)_2\text{-}(B)(AABB)_n(B)(AB)_m$, $(RE)_2\text{-}[B(AB)_n]^-$, and $(RE)_2\text{-}[(BA)_n B]^-$, wherein A is the repeat unit $\{M^A(ER)(ER)\}$, B is the repeat unit $\{M^B(ER)(ER)\}$, n is one or more, or n is two or more, and m is one or more. In further aspects, a polymeric precursor may be a block copolymer containing one or more blocks of repeat units, wherein each block contains only one kind of atom $M^B$.

A precursor compound of this disclosure may be a combination of u*(1−x) equivalents of $M^{A1}(ER)$, u*x equivalents of $M^{A2}(ER)$, v*(1−y−t) equivalents of $M^{B1}(ER)_3$, v*y equivalents of $M^{B2}(ER)_3$, v*t equivalents of $M^{B3}(ER)_3$, wherein $M^{A1}$ is Cu and $M^{A2}$ is Ag, $M^{B1}$, $M^{B2}$ and $M^{B3}$ are different atoms of Group 13, wherein the compound has the empirical formula $(M^{A1}_{1-x}M^{A2}_x)_u(M^{B1}_{1-y-t}M^{B2}_y M^{B3}_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.5 to 1.5, v is from 0.5 to 1.5, w is from 2 to 6, and R represents R groups, of which there are w in number, independently selected from alkyl, aryl, heteroaryl, alkenyl, amido, silyl, and inorganic and organic ligands. In these embodiments, a precursor compound can have the stoichiometry useful to prepare CAIGAS, CAIGS, CIGAS, CIGS, AIGAS and AIGS materials, including materials deficient or enriched in the quantity of a Group 11 atom, for example materials deficient or enriched in Cu.

In some embodiments, x is from 0.001 to 0.999. In some embodiments, t is from 0.001 to 0.999.

In further embodiments, a precursor compound can contain S, Se and Te.

In some embodiments, a precursor compound can be a combination of w*(1−z) equivalents of $M^{A1}(ER^1)$, w*z equivalents of $M^{A2}(ER^2)$, x equivalents of $M^{B1}(ER^3)_3$, y equivalents of $M^{B2}(ER^4)_3$, equivalents of $M^{B3}(ER^5)_3$, wherein $M^{A1}$ is Cu and $M^{A2}$ is Ag, $M^{B1}$, $M^{B2}$ and $M^{B3}$ are different atoms of Group 13, wherein the compound has the empirical formula $(Cu_{1-z}Ag_z)_w In_x Ga_y Al_t(ER^1)_{w(1-z)}(ER^2)_{(w*z)}(ER^3)_{3x}(ER^4)_{3y}(ER^5)_{3t}$, w is from 0.5 to 1.5, z is from 0 to 1, x is from 0 to 1, y is from 0 to 1, t is from 0 to 1, x plus y plus t is one, and wherein $R^1$, $R^2$, $R^3$, $R^4$ and $R^5$ are the same or each different, and are independently selected, for each occurrence, from alkyl, aryl, heteroaryl, alkenyl, amido, silyl, and inorganic and organic ligands. In these embodiments, a precursor compound can have the stoichiometry useful to prepare CAIGAS, CAIGS, CIGAS, CIGS, AIGAS and AIGS materials, including materials deficient or enriched in the quantity of a Group 11 atom. In some embodiments, z is from 0.001 to 0.999. In some embodiments, t is from 0.001 to 0.999.

A precursor compound of this disclosure may be a combination of x equivalents of $M^{A1}(ER)$, v*(1−y−t) equivalents of $M^{B1}(ER)_3$, v*y equivalents of $M^{B2}(ER)_3$, v*t equivalents of $M^{B3}(ER)_3$, wherein $M^{A1}$ is Cu, $M^{B1}$, $M^{B2}$ and $M^{B3}$ are different atoms of Group 13, wherein the compound has the empirical formula $M^{A1}_x(M^{B1}_{1-y-t}M^{B2}_y M^{B3}_t)_v((S_{1-z}Se_z)R)_w$, wherein x is from 0.5 to 1.5, y is from 0 to 1, t is from 0 to 1, the sum of y plus t is from 0 to 1, z is from 0 to 1, v is from 0.5 to 1.5, w is from 2 to 6, and R represents R groups, of which there are w in number, independently selected from alkyl, aryl, heteroaryl, alkenyl, amido, silyl, and inorganic and organic ligands. In these embodiments, a precursor compound can have the stoichiometry useful to prepare CIGAS and CIGS materials, including materials deficient or enriched in the quantity of a Group 11 atom. In some embodiments, t is from 0.001 to 0.999.

In some embodiments, a precursor compound can be a combination of z equivalents of $M^{A1}(ER^1)$, x equivalents of $M^{B1}(ER^3)_3$, y equivalents of $M^{B2}(ER^4)_3$, t equivalents of $M^{B3}(ER^5)_3$, wherein $M^{A1}$ is Cu, $M^{B1}$, $M^{B2}$ and $M^{B3}$ are different atoms of Group 13, wherein the compound has the empirical formula $Cu_zIn_xGa_yAl_t(ER^1)_{w(1-z)}(ER^2)_{(w*z)}(ER^3)_{3x}(ER^4)_{3y}(ER^5)_{3t}$, z is from 0.5 to 1.5, x is from 0 to 1, y is from 0 to 1, t is from 0 to 1, x plus y plus t is one, and wherein $R^1$, $R^2$, $R^3$, $R^4$ and $R^5$ are the same or each different, and are independently selected, for each occurrence, from alkyl, aryl, heteroaryl, alkenyl, amido, silyl, and inorganic and organic ligands. In these embodiments, a precursor compound can have the stoichiometry useful to prepare CIGAS and CIGS materials, including materials deficient in the quantity of a Group 11 atom. In some embodiments, t is from 0.001 to 0.999.

A precursor compound of this disclosure may be a combination of $u*(1-x)$ equivalents of $M^{A1}(ER)$, $u*x$ equivalents of $M^{A2}(ER)$, $v*(1-y)$ equivalents of $M^{B1}(ER)_3$, $v*y$ equivalents of $M^{B2}(ER)_3$, wherein $M^{A1}$ is Cu and $M^{A2}$ is Ag, $M^{B1}$ and $M^{B2}$ are different atoms of Group 13, wherein the compound has the empirical formula $(M^{A1}_{1-x}M^{A2}_x)_u(M^{B1}_{1-y}M^{B2}_y)_v((S_{1-z}Se_z)R)_w$, wherein x is from 0 to 1, y is from 0 to 1, z is from 0 to 1, u is from 0.5 to 1.5, v is from 0.5 to 1.5, w is from 2 to 6, and R represents R groups, of which there are w in number, independently selected from alkyl, aryl, heteroaryl, alkenyl, amido, silyl, and inorganic and organic ligands. In these embodiments, a precursor compound can have the stoichiometry useful to prepare CAIGS, CIGS and AIGS materials, including materials deficient in the quantity of a Group 11 atom. In some embodiments, x is from 0.001 to 0.999.

In some embodiments, a precursor compound can be a combination of $w*(1-z)$ equivalents of $M^{A1}(ER^1)$, $w*z$ equivalents of $M^{A2}(ER^2)$, x equivalents of $M^{B1}(ER^3)_3$, y equivalents of $M^{B2}(ER^4)_3$, wherein $M^{A1}$ is Cu and $M^{A2}$ is Ag $M^{B1}$ and $M^{B2}$ are different atoms of Group 13, wherein the compound has the empirical formula $(Cu_{1-z}Ag_z)_wIn_xGa_y(ER^1)_{w(1-z)}(ER^2)_{(w*z)}(ER^3)_{3x}(ER^4)_{3y}$, w is from 0.5 to 1.5, z is from 0 to 1, x is from 0 to 1, y is from 0 to 1, x plus y is one, and wherein $R^1$, $R^2$, $R^3$, $R^4$ are the same or each different, and are independently selected, for each occurrence, from alkyl, aryl, heteroaryl, alkenyl, amido, silyl, and inorganic and organic ligands. In these embodiments, a precursor compound can have the stoichiometry useful to prepare CAIGS, CIGS and AIGS materials, including materials deficient or enriched in the quantity of a Group 11 atom. In some embodiments, z is from 0.001 to 0.999.

A precursor compound of this disclosure may be a combination of x equivalents of $M^{A1}(ER)$, $v*(1-y)$ equivalents of $M^{B1}(ER)_3$, $v*y$ equivalents of $M^{B2}(ER)_3$, wherein $M^{A1}$ is Cu, $M^{B1}$ and $M^{B2}$ are different atoms of Group 13, wherein the compound has the empirical formula $M^{A1}_x(M^{B1}_{1-y}M^{B2}_y)_v((S_{1-z}Se_z)R)_w$, wherein x is from 0.5 to 1.5, y is from 0 to 1, z is from 0 to 1, v is from 0.5 to 1.5, w is from 2 to 6, and R represents R groups, of which there are w in number, independently selected from alkyl, aryl, heteroaryl, alkenyl, amido, silyl, and inorganic and organic ligands. In these embodiments, a precursor compound can have the stoichiometry useful to prepare CIGS materials, including materials deficient or enriched in the quantity of a Group 11 atom.

In some embodiments, a precursor compound can be a combination of z equivalents of $M^{A1}(ER^1)$ x equivalents of $M^{B1}(ER^2)_3$, y equivalents of $M^{B2}(ER^3)_3$, wherein $M^{A1}$ is Cu, $M^{B1}$ and $M^{B2}$ are different atoms of Group 13, wherein the compound has the empirical formula $Cu_zIn_xGa_y(ER^1)_z(ER^2)_{3x}(ER^3)_{3y}$, z is from 0.5 to 1.5, x is from 0 to 1, y is from 0 to 1, x plus y is one, and wherein $R^1$, $R^2$, $R^3$ are the same or each different, and are independently selected, for each occurrence, from alkyl, aryl, heteroaryl, alkenyl, amido, silyl, and inorganic and organic ligands. In these embodiments, a precursor compound can have the stoichiometry useful to prepare CIGS materials, including materials deficient or enriched in the quantity of a Group 11 atom.

This disclosure provides a range of polymeric precursor compounds made by reacting a first monomer $M^B(ER^1)_3$ with a second monomer $M^A(ER^2)$, where $M^A$ is a monovalent metal atom, $M^B$ is an atom of Group 13, E is S, Se, or Te, and $R^1$ and $R^2$ are the same or different and are independently selected from alkyl, aryl, heteroaryl, alkenyl, amido, silyl, and inorganic and organic ligands. The compounds may contain n repeating units $\{M^B(ER)(ER)\}$ and n repeating units $\{M^A(ER)(ER)\}$, wherein n is one or more, or n is two or more, and R is defined, for each occurrence, the same as $R^1$ and $R^2$.

A polymeric precursor molecule can be represented by the formula $\{M^A(ER)(ER)M^B(ER)(ER)\}$, or $\{M^A(ER)_2M^B(ER)_2\}$, which are each understood to represent an $\{AB\}$ repeating unit of a polymeric precursor $(AB)_n$. This shorthand representation is used in the following paragraphs to describe further examples of polymeric precursors. Further, when more than one kind of atom $M^A$ or $M^B$ is present, the amount of each kind may be specified in these examples by the notation (x $M^{A1}$,y $M^{A2}$) or (x $M^{B1}$,y $M^{B2}$). For example, the polymeric compound $\{Cu(Se''Bu)_2(In_{0.75},Ga_{0.25})(Se''Bu)_2\}$ is composed of repeating units, where the repeating units can appear in any order, and 75% of the repeating units contain one indium atom and 25% contain one gallium atom.

Examples of polymeric precursor compounds of this disclosure include compounds having any one of the repeat unit formulas: $\{Ag(Se^{sec}Bu)_4In\}$, $\{Ag_{0.6}(Se^{sec}Bu)_{3.6}In\}$, $\{Ag_{0.9}(Se^sBu)_{3.9}In\}$, $\{Ag_{1.5}(Se^sBu)_{4.5}In\}$, $\{Ag(Se^sBu)_3(Se^tBu)In\}$, $\{Cu_{0.5}Ag_{0.5}(Se^sBu)_4In\}$, $\{Ag(Se^sBu)_4Ga\}$, $\{Ag_{0.8}(Se^sBu)_{3.8}In_{0.2}Ga_{0.8}\}$, $\{Ag(Se^sBu)_4In_{0.3}Ga_{0.7}\}$, $\{Ag(Se^sBu)_4In_{0.7}Ga_{0.3}\}$, $\{Ag(Se^sBu)_4In_{0.5}Ga_{0.5}\}$, $\{Cu_{0.7}Ag_{0.1}(Se^sBu)_{3.8}Ga_{0.3}In_{0.7}\}$, $\{Cu_{0.8}Ag_{0.2}(Se^sBu)_4In\}$, $\{Cu_{0.2}Ag_{0.8}(Se^sBu)_4In\}$, $\{Cu_{0.5}Ag_{0.5}(Se^sBu)_4Ga_{0.5}In_{0.5}\}$, $\{Cu_{0.85}Ag_{0.1}(Se^sBu)_{3.95}Ga_{0.3}In_{0.7}\}$, $\{Cu_{0.5}Ag_{0.5}(Se^sBu)_4Ga_{0.3}In_{0.7}\}$, $\{Ag(Se^sBu)_3(Se^tBu)Ga_{0.3}In_{0.7}\}$, $\{Cu_{0.8}Ag_{0.05}(Se^sBu)_{3.85}Ga_{0.3}In_{0.7}\}$.

Examples of polymeric precursor compounds of this disclosure include compounds having any one of the repeat unit formulas: $\{Cu_{1.40}Ag_{0.10}(Se^tBu)_{1.5}(Se''Bu)(In_{0.2}Ga_{0.25}Al_{0.05})(Se''Bu)_2\}$; $\{Cu_{1.30}Ag_{0.10}(S^tBu)_{1.4}(S^tBu)(In_{0.85}Ga_{0.1}Al_{0.05})(S^tBu)_2\}$; $\{Cu_{1.20}Ag_{0.10}(S^tBu)_{1.3}(S''Bu)(In_{0.80}Ga_{0.15}Al_{0.05})(S''Bu)_2\}$; $\{Cu_{1.10}Ag_{0.10}(Se^tBu)_{1.2}(Se''Bu)(In_{0.75}Ga_{0.20}Al_{0.05})(Se''Bu)_2\}$; and $\{Cu_{1.05}Ag_{0.05}(S^tBu)_{1.1}(Se^tBu)(In_{0.7}Ga_{0.2}Al_{0.1})(Se^tBu)_2\}$.

Examples of polymeric precursor compounds of this disclosure include compounds having any one of the repeat unit formulas: $\{Cu(S^tBu)(S^iPr)In(S^iPr)_2\}$; $\{Cu(S^tBu)_2In(S^tBu)_2\}$; $\{Cu(S^tBu)(S''Bu)In(S''Bu)_2\}$; $\{Cu(Se^tBu)(Se''Bu)In(Se''Bu)_2\}$; $\{Cu(S^tBu)(Se^tBu)In(Se^tBu)_2\}$; $\{Cu(Se^tBu)(S^tBu)Ga(S^tBu)_2\}$; $\{Cu(Se^tBu)_2Ga(Se^tBu)_2\}$; $\{Cu(S^tBu)_2Ga(S^tBu)_2\}$; $\{Cu(Se^tBu)_2In(Se^tBu)_2\}$; $\{Cu(Se^tBu)(Se^iPr)In(Se^iPr)_2\}$; $\{Cu(Se^tBu)(S^sBu)In(S^sBu)_2\}$; $\{Cu(Se^tBu)(Se^iPr)Ga(Se^iPr)_2\}$; and $\{Cu(S^tBu)(S^iPr)Ga(S^iPr)_2\}$.

Examples of polymeric precursor compounds of this disclosure include compounds having any one of the repeat unit formulas: $\{Cu(Se^tBu)(Se''Bu)In(Se''Bu)_2\}$; $\{Cu(S^tBu)(S^iPr)In(S^iPr)_2\}$; $\{Cu(S''Bu)(S^tBu)In(S^tBu)_2\}$; $\{Cu(Se''Bu)(Se^tBu)In(Se^tBu)_2\}$; $\{Cu(S^tBu)(Se^tBu)In(Se^tBu)_2\}$; $\{Cu(Se^tBu)(S^tBu)Ga(S^tBu)_2\}$; $\{Cu(S''Bu)(S^tBu)Ga(S^tBu)_2\}$; $\{Cu(Se^sBu)(Se^tBu)In(Se^tBu)_2\}$; $\{Cu(Se^tBu)(Se^iPr)In(Se^iPr)_2\}$; $\{Cu(Se^tBu)(S^sBu)In(S^sBu)_2\}$; $\{Cu(Se^tBu)(Se^iPr)Ga(Se^iPr)_2\}$; and $\{Cu(S^tBu)(S^iPr)Ga(S^iPr)_2\}$.

Examples of polymeric precursor compounds of this disclosure include compounds having any one of the repeat unit formulas: $\{Cu(S^tBu)(S^iPr)(In,Ga)(S^iPr)_2\}$; $\{Cu(S^tBu)_2(In,Ga)(S^tBu)_2\}$; $\{Cu(S^tBu)(S''Bu)(In,Ga)(S''Bu)_2\}$; $\{Cu (Se$^t$Bu)(Se"Bu)(In,Ga)(Se"Bu)$_2$}; {Cu(S$^t$Bu)(Se$^t$Bu)(In,Ga)(Se$^t$Bu)$_2$}; {Cu(Se$^t$Bu)(S$^t$Bu)(In,Ga)(S$^t$Bu)$_2$}; {Cu(Se$^t$Bu)$_2$(In,Ga)(Se$^t$Bu)$_2$}; {Cu(S$^t$Bu)$_2$(In,Ga)(S$^t$Bu)$_2$}; {Cu(Se$^t$Bu)$_2$(In,Ga)(Se$^t$Bu)$_2$}; {Cu(Se$^t$Bu)(Se$^i$Pr)(In,Ga)(Se$^i$Pr)$_2$}; {Cu(Se$^t$Bu)(S$^s$Bu)(In,Ga)(S$^s$Bu)$_2$}; {Cu(Se$^t$Bu)(Se$^i$Pr)(In,Ga)(Se$^i$Pr)$_2$}; and {Cu(S$^t$Bu)(S$^i$Pr)(In,Ga)(S$^i$Pr)$_2$}.

Examples of polymeric precursor compounds of this disclosure include compounds having any one of the repeat unit formulas: {Cu(Se$^t$Bu)(Se"Bu)(In,Ga)(Se"Bu)$_2$}; {Cu(S$^t$Bu)(S$^i$Pr)(In,Ga)(S$^i$Pr)$_2$}; {Cu(S"Bu)(S$^t$Bu)(In,Ga)(S$^t$Bu)$_2$}; {Cu(Se"Bu)(Se$^t$Bu)(In,Ga)(Se$^t$Bu)$_2$}; {Cu(S$^t$Bu)(Se$^t$Bu)(In,Ga)(Se$^t$Bu)$_2$}; {Cu(Se$^t$Bu)(S$^t$Bu)(In,Ga)(S$^t$Bu)$_2$}; {Cu(S"Bu)(S$^t$Bu)(In,Ga)(S$^t$Bu)$_2$}; {Cu(Se$^s$Bu)(Se$^t$Bu)(In,Ga)(Se$^t$Bu)$_2$}; {Cu(Se$^t$Bu)(Se$^i$Pr)(In,Ga)(Se$^i$Pr)$_2$}; {Cu(Se$^t$Bu)(S$^s$Bu)(In,Tl)(S$^s$Bu)$_2$}; {Cu(Se$^t$Bu)(S$^i$Pr)(Ga,Tl)(Se$^i$Pr)$_2$; and {Cu(S$^t$Bu)(S$^i$Pr)(In,Ga)(S$^i$Pr)$_2$}.

Examples of polymeric precursor compounds of this disclosure include compounds having any one of the repeat unit formulas: {(0.85 Cu)(0.85 Se$^t$Bu)(Se"Bu)(0.7 In,0.3 Ga)(Se"Bu)$_2$}; {(0.9 Cu)(0.9 S$^t$Bu)(S$^t$Bu)(0.85 In,0.15 Ga)(S$^t$Bu)$_2$}; {(0.75 Cu)(0.75 S$^t$Bu)(S"Bu)(0.80 In,0.20 Ga)(S"Bu)$_2$}; {(0.8 Cu)(0.8 Se$^t$Bu)(Se"Bu)(0.75 In,0.25 Ga)(Se"Bu)$_2$}; {(0.95 Cu)(0.95 S$^t$Bu)(Se$^t$Bu)(0.70 In,0.30 Ga)(Se$^t$Bu)$_2$}; {(0.98 Cu)(0.98 Se$^t$Bu)(S$^t$Bu)(0.600 In,0.400 Ga)(S$^t$Bu)$_2$}; {(0.835 Cu)(0.835 Se$^t$Bu)$_2$(0.9 In,0.1 Ga)(Se$^t$Bu)$_2$}; {Cu(S$^t$Bu)$_2$(0.8 In,0.2 Ga)(S$^t$Bu)$_2$}; {Cu(Se$^t$Bu)$_2$(0.75 In,0.25 Ga)(Se$^t$Bu)$_2$}; {Cu(Se$^t$Bu)(Se$^i$Pr)(0.67 In,0.33 Ga)(Se$^i$Pr)$_2$}; {Cu(Se$^t$Bu)(S$^s$Bu)(0.875 In,0.125 Ga)(S$^s$Bu)$_2$}; {Cu(Se$^t$Bu)(Se$^i$Pr)(0.99 In,0.01 Ga)(Se$^i$Pr)$_2$}; and {Cu(S$^t$Bu)(S$^i$Pr)(0.97 In,0.030 Ga)(S$^i$Pr)$_2$}.

Examples of polymeric precursor compounds of this disclosure include compounds having any one of the repeat unit formulas: {Cu(Se$^s$Bu)$_2$In(Se$^s$Bu)$_2$}; {Cu(Se$^s$Bu)$_2$Ga(Se$^s$Bu)$_2$}; {Cu(S$^t$Bu)$_2$In(S$^t$Bu)$_2$}; {Cu(S$^t$Bu)$_2$In(S"Bu)$_2$}; {Cu(Se$^t$Bu)$_2$Ga(Se"Bu)$_2$}; {Cu(Se$^t$Bu)$_2$Ga(Se$^t$Bu)$_2$}; {Cu(S$^t$Bu)$_2$In(S$^t$Bu)$_2$}; {Cu(Se"Bu)(Se$^t$Bu)In(Se$^t$Bu)$_2$}; {Cu(S$^t$Bu)$_2$Ga(S$^t$Bu)$_2$}; and {Cu(Se"Bu)(Se$^t$Bu)Ga(Se$^t$Bu)$_2$}.

Examples of polymeric precursor compounds of this disclosure include compounds having any one of the repeat unit formulas: {Cu(Se$^t$Bu)(Se"Bu)(0.5 In,0.5 Ga)(Se"Bu)$_2$}; {Cu(Se$^t$Bu)(Se"Bu)(0.75 In,0.25 Ga)(Se"Bu)$_2$}; {Cu(S$^t$Bu)$_2$(0.75 In,0.25 Ga)(S$^t$Bu)$_2$}; and {Cu(S$^t$Bu)$_2$(0.9 In,0.1 Ga)(S$^t$Bu)$_2$}.

Examples of polymeric precursor compounds of this disclosure include compounds having any one of the repeat unit formulas: {Cu(Se(n-pentyl))(Se"Bu)(0.5 In,0.5 Ga)(Se"Bu)$_2$}; {Cu(Se(n-hexyl))(Se"Bu)(0.75 In,0.25 Ga)(Se"Bu)$_2$}; {Cu(S(n-heptyl))(S$^t$Bu)(0.75 In,0.25 Ga)(S$^t$Bu)$_2$}; and {Cu(S(n-octyl))(S$^t$Bu)(0.9 In,0.1 Ga)(S$^t$Bu)$_2$}.

Examples of polymeric precursor compounds of this disclosure include compounds having any one of the repeat unit formulas: {Ag(Se$^t$Bu)(Se"Bu)(In,Ga)(Se"Bu)$_2$}; {Ag(S$^t$Bu)(S$^i$Pr)(In,Ga)(S$^i$Pr)$_2$}; {Au(Se$^t$Bu)(Se"Bu)In(Se"Bu)$_2$}; {Hg(S$^t$Bu)(S$^i$Pr)In(S$^i$Pr)$_2$}; {Ag(S$^t$Bu)(S$^i$Pr)(In,Ga)(S$^i$Pr)$_2$}; {Ag(S$^t$Bu)$_2$(In,Ga)(S$^t$Bu)$_2$}; {Au(Se$^t$Bu)(Se"Bu)(In,Ga)(Se"Bu)$_2$}; {Hg(S$^t$Bu)(S$^i$Pr)(In,Ga)(S$^i$Pr)$_2$}; {Ag(S$^t$Bu)(S$^i$Pr)(0.9 In,0.1 Ga)(S$^i$Pr)$_2$}; {Ag(S$^t$Bu)$_2$(0.85 In,0.15 Ga)(S$^t$Bu)$_2$}; {Cu(Se$^t$Bu)(Se"Bu)(0.5 In,0.5 Al)(Se"Bu)$_2$}; {Cu(Se$^t$Bu)(Se"Bu)(0.75 In,0.25 Al)(Se"Bu)$_2$}, {(Cu,Ag)(Se$^t$Bu)(Se"Bu)(In,Ga)(Se"Bu)$_2$}; {(Ag,Au)(S$^t$Bu)(S$^i$Pr)(In,Ga)(S$^i$Pr)$_2$}; {(Cu,Au)(Se$^t$Bu)(Se"Bu)In(Se"Bu)$_2$}; and {(Cu,Hg)(S$^t$Bu)(S$^i$Pr)In(S$^i$Pr)$_2$}.

Examples of polymeric precursor compounds of this disclosure include compounds having any one of the repeat unit formulas: {(0.95 Cu,0.05 Ag)(Se$^t$Bu)(Se"Bu)(In,Ga)(Se"Bu)$_2$}; {(0.9 Cu,0.1 Ag)(Se$^t$Bu)(Se"Bu)(In,Ga)(Se"Bu)$_2$}; {(0.85 Cu,0.15 Ag)(Se$^t$Bu)(Se"Bu)(In,Ga)(Se"Bu)$_2$}; {(0.8 Cu,0.2 Ag)(Se$^t$Bu)(Se"Bu)(In,Ga)(Se"Bu)$_2$}; {(0.75 Cu,0.25 Ag)(Se$^t$Bu)(Se"Bu)(In,Ga)(Se"Bu)$_2$}; {(0.7 Cu,0.3 Ag)(Se$^t$Bu)(Se"Bu)(In,Ga)(Se"Bu)$_2$}; {(0.65 Cu,0.35 Ag)(Se$^t$Bu)(Se"Bu)(In,Ga)(Se"Bu)$_2$}; {(0.6 Cu,0.4 Ag)(Se$^t$Bu)(Se"Bu)(In,Ga)(Se"Bu)$_2$}; {(0.55 Cu,0.45 Ag)(Se$^t$Bu)(Se"Bu)(In,Ga)(Se"Bu)$_2$}; and {(0.5 Cu,0.5 Ag)(Se$^t$Bu)(Se"Bu)(In,Ga)(Se"Bu)$_2$}.

Preparation of Polymeric Precursors (MPP)

Embodiments of this invention provide a family of polymeric precursor molecules and compositions which can be synthesized from a compound containing an atom $M^B$ of Group 13 selected from Al, Ga, In, Tl, or a combination thereof, and a compound containing a monovalent atom $M^A$.

Advantageously facile routes for the synthesis and isolation of polymeric precursor compounds of this invention have been discovered, as described below.

This disclosure provides a range of polymeric precursor compositions which can be transformed into semiconductor materials and semiconductors. In some aspects, the polymeric precursor compositions are precursors for the formation of semiconductor materials and semiconductors.

In general, the polymeric precursor compositions of this invention are non-oxide chalcogen compositions.

In some embodiments, the polymeric precursor compositions are sources or precursors for the formation of absorber layers for solar cells, including CIS, CIGS, AIS, AIGS, CAIS, CAIGS, CIGAS, AIGAS and CAIGAS absorber layers.

A polymeric precursor compound may be made with any desired stoichiometry regarding the number of different metal atoms and atoms of Group 13 and their respective stoichiometric levels or ratios.

As discussed below, a polymeric precursor compound may be made by reacting monomers to produce a polymer chain. The polymeric precursor formation reactions can include initiation, propagation, and termination.

Methods for making a polymeric precursor may include the step of contacting a compound $M^B(ER)_3$ with a compound $M^A(ER)$, where $M^A$, $M^B$, E, and R are as defined above.

As shown in Reaction Scheme 1, a method for making a polymeric precursor may include the step of contacting a compound $M^B(ER^1)_3$ with a compound $M^A(ER^2)$, where $M^A$, $M^B$, and E are as defined above and the groups $R^1$ and $R^2$ of the compounds may be the same or different and are as defined above.

REACTION SCHEME 1:

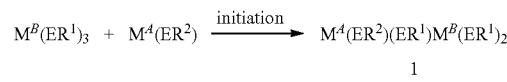

1

In Reaction Scheme 1, $M^B(ER^1)_3$ and $M^A(ER^2)$ are monomers that form the first adduct 1, $M^A(ER)_2M^B(ER)_2$. Reaction Scheme 1 represents the initiation of a polymerization of monomers. In one aspect, Reaction Scheme 1 represents the formation of the intermediate adduct AB. In general, among other steps, the polymerization reaction may form polymer chains by adding monomers to the first adduct 1, so that the first adduct 1 may be a transient molecule that is not observed when a longer chain is ultimately produced. When additional monomers are bound to either end of the first adduct 1, then the first adduct 1 becomes a repeating unit AB in the polymer chain.

In general, to prepare a polymeric precursor, the compounds $M^B(ER)_3$ and $M^A(ER)$ can be generated by various reactions.

For example, a compound $M^A(ER)$ can be prepared by reacting $M^AX$ with $M^+(ER)$. $M^+(ER)$ can be prepared by reacting E with LiR to provide Li(ER). Li(ER) can be acidified to provide HER, which can be reacted with Na(OR) or K(OR) to provide Na(ER) and K(ER), respectively. In these reactions, E, R and $M^A$ are as defined above.

In another example, a compound $M^A(ER)$ can be prepared by reacting $M^AX$ with $(RE)Si(CH_3)_3$. The compound $(RE)Si(CH_3)_3$ can be made by reacting $M^+(ER)$ with $XSi(CH_3)_3$, where $M^+$ is Na, Li, or K, and X is halogen.

In another example, a compound $M^A(ER)$ can be prepared by reacting $M^A_2O$ with HER. In particular, Cu(ER) can be prepared by reacting $Cu_2O$ with HER.

For example, a compound $M^B(ER)_3$ can be prepared by reacting $M^BX_3$ with $M^+(ER)$. $M^+(ER)$ can be prepared as described above.

In another example, a compound $M^B(ER)_3$ can be prepared by reacting $M^BX_3$ with $(RE)Si(CH_3)_3$. The compound $(RE)Si(CH_3)_3$ can be made as described above.

In another example, a compound $M^B(ER)_3$ can be prepared by reacting $M^BR_3$ with HER.

Moreover, in the preparation of a polymeric precursor, a compound $M^+M^B(ER)_4$ can optionally be used in place of a portion of the compound $M^B(ER)_3$. For example, a compound $M^+M^B(ER)_4$ can be prepared by reacting $M^BX_3$ with 4 equivalents of $M^+(ER)$, where $M^+$ is Na, Li, or K, and X is halogen. The compound $M^+(ER)$ can be prepared as described above.

The propagation of the polymeric precursor can be represented in part by the formulas in Reaction Scheme 2. The formulas in Reaction Scheme 2 represent only some of the reactions and additions which may occur in propagation of the polymeric precursor.

REACTION SCHEME 2:

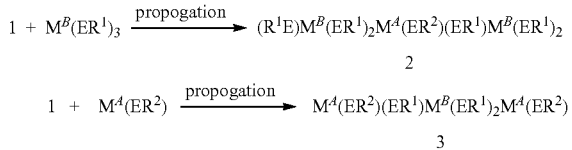

In Reaction Scheme 2, the addition of a monomer $M^B(ER^1)_3$ or $M^A(ER^2)$ to the first adduct 1, may produce additional adducts 2 and 3, respectively. In one aspect, Reaction Scheme 2 represents the formation of the adduct (RE)-BAB, as well as the adduct intermediate AB-$M^A$(ER). In general, the adducts 2 and 3 may be transient moieties that are not observed when a longer chain is ultimately produced.

The products of the initial propagation steps may continue to add monomers in propagation. As shown in Reaction Scheme 3, adduct 2 may add a monomer $M^B(ER^1)_3$ or $M^A(ER^2)$.

REACTION SCHEME 3:

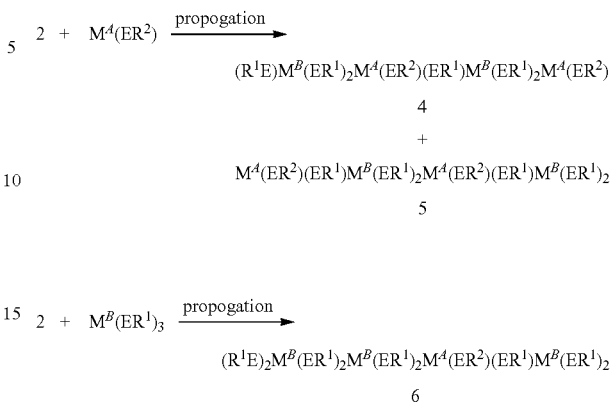

In one aspect, Reaction Scheme 3 represents the formation of the intermediate adduct (RE)-BAB-$M^A(ER)_4$, as well as the adduct $(RE)_2$-BBAB 6. In general, the molecules 4, 5 and 6 may be transient molecules that are not observed when a longer chain is ultimately produced.

Other reactions and additions which may occur include the addition of certain propagating chains to certain other propagating chains. For example, as shown in Reaction Scheme 4, adduct 1 may add to adduct 2 to form a longer chain.

REACTION SCHEME 4:

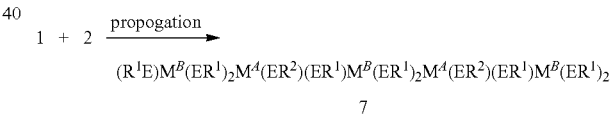

In one aspect, Reaction Scheme 4 represents the formation of the adduct (RE)-BABAB 7.

Any of the moieties 4, 5, 6, and 7 may be transient, and may not be observed when a longer chain is ultimately produced.

In some variations, a propagation step may provide a stable molecule. For example, moiety 6 may be a stable molecule.

In general, AB alternating block copolymers as described in Formulas 18 through 23 may be prepared by sequential addition of the corresponding monomers $M^{B1}(ER)_3$, $M^{B2}(ER)_3$, and $M^{B3}(ER)_3$, when present, as well as $M^{A1}(ER)$, $M^{A2}(ER)$, and $M^{A3}(ER)$, when present, during polymerization or propagation.

Certain reactions or additions of the polymeric precursor propagation may include the formation of chain branches. As shown in Reaction Scheme 5, the addition of a monomer $M^A(ER^2)$ to the adduct molecule 2 may produce a branched chain 8.

REACTION SCHEME 5:

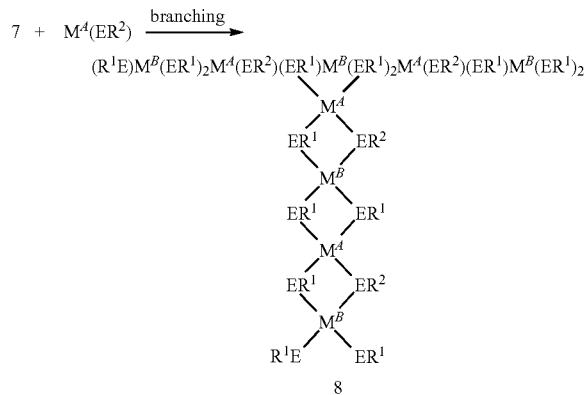

The propagation of the polymeric precursor can be represented in part by the formulas in Reaction Schemes 2, 3, 4 and 5. The formulas in Reaction Schemes 2, 3, 4 and 5 represent only some representative reactions and additions which may occur in propagation of the polymeric precursor.

Termination of the propagating polymer chain may occur by several mechanisms. In general, because of the valencies of the atoms $M^A$ and $M^B$, a completed polymer chain may terminate in a $M^B$ unit, but not an $M^A$ unit. In some aspects, a chain terminating unit is a •••B unit, or a $(ER)_2B$••• unit.

In some aspects, the propagation of the polymeric precursor chain may terminate when either of the monomers $M^B(ER)_3$ or $M^A(ER)$ becomes depleted.

In certain aspects, as shown in Reaction Scheme 6, the propagation of the polymeric precursor chain may terminate when a growing chain represented by the formula (RE)-B••••••B reacts with another chain having the same terminal (RE)-B unit to form a chain having the formula B••••••BB••••••B.

REACTION SCHEME 6:

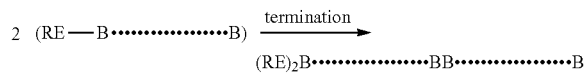

In Reaction Scheme 6, two chains have combined, where the propagation of the polymer chain is essentially terminated and the product chain (RE)$_2$B••••••BB••••••B has chain terminating units that are B units.

In further aspects, the propagation of the polymeric precursor chain may terminate when the growing chain forms a ring. As shown in Reaction Scheme 7, a propagating chain such as 5 may terminate by cyclization in which the polymer chain forms a ring.

REACTION SCHEME 7:

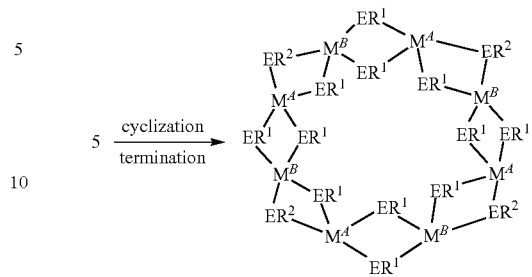

A polymeric precursor compound may be a single chain, or a distribution of chains having different lengths, structures or shapes, such as branched, networked, dendrimeric, and cyclic shapes, as well as combinations of the forgoing. A polymeric precursor compound may be any combination of the molecules, adducts and chains described above in Reaction Schemes 1 through 7.

A polymeric precursor of this disclosure may be made by the process of providing a first monomer compound having the formula $M^B(ER^1)_3$, providing a second monomer compound having the formula $M^A(ER^2)$, and contacting the first monomer compound with the second monomer compound. In some embodiments, the first monomer compound may be a combination of compounds having the formulas $M^{B1}(ER^1)_3$ and $M^{B2}(ER^3)_3$, wherein $M^{B1}$ and $M^{B2}$ are different atoms of Group 13, and $R^1$, $R^2$ and $R^3$ are the same or different and are independently selected from alkyl, aryl, heteroaryl, alkenyl, amido, silyl, and inorganic and organic ligands.

In some variations, the first monomer compound may be a combination of compounds having the formulas $M^{B1}(ER^1)_3$, $M^{B2}(ER^3)_3$, and $M^{B3}(ER^4)_3$, wherein $M^{B1}$, $M^{B2}$ and $M^{B3}$ are atoms of Group 13 each different from the other, and $R^3$ and $R^4$ are defined the same as $R^1$ and $R^2$.

In certain aspects, the second monomer compound may be a combination of compounds having the formulas $M^{A1}(ER^2)$ and $M^{A2}(ER^3)$, wherein $M^{A1}$ and $M^{A2}$ are different atoms selected from Cu, Au, Ag, or a combination thereof, and $R^3$ is defined the same as $R^1$ and $R^2$.

In further aspects, a method for making a polymeric precursor may include the synthesis of a compound containing two or more atoms of $M^B$ and contacting the compound with a compound $M^A(ER)$, where $M^A$, $M^B$, E and R are as defined above. For example, $(ER)_2M^{B1}(ER)_2M^{B2}(ER)_2$ can be reacted with $M^A(ER^2)$, where $M^{B1}$ and $M^{B2}$ are the same or different atoms of Group 13.

Methods for making a polymeric precursor include embodiments in which the first monomer compound and the second monomer compound may be contacted in a process of depositing, spraying, coating, or printing. In certain embodiments, the first monomer compound and the second monomer compound may be contacted at a temperature of from about −60° C. to about 100° C.

Controlling the Stoichiometry of Atoms of Group 13 in Polymeric Precursors

A polymeric precursor compound may be made with any desired stoichiometry with respect to the number of different metal atoms and atoms of Group 13 and their respective stoichiometric levels or ratios.

In some embodiments, the stoichiometry of a polymeric precursor compound may be controlled through the numbers of equivalents of the monomers in the formation reactions.

In some aspects, the monomers $M^{B1}(ER)_3$, $M^{B2}(ER^1)_3$, $M^{B3}(ER^2)_3$, and $M^{B4}(ER^3)_3$ can be used for polymerization. Examples of these monomers are $In(ER)_3$, $Ga(ER^1)_3$, $Al(ER^2)_3$, where the groups R, $R^1$, and $R^2$ are the same or different and are groups attached through a carbon or non-carbon atom, including alkyl, aryl, heteroaryl, alkenyl, amido, silyl, and inorganic and organic ligands. In some embodiments, the groups R, $R^1$, and $R^2$ are each the same or different from the others and are alkyl groups attached through a carbon atom.

In further aspects, the monomers $M^{B1}(ER)(ER^1)_2$, $M^{B2}(ER^2)(ER^3)_2$, and $M^{B3}(ER^4)(ER^5)_2$ can be used for polymerization, where the groups R, $R^1$, $R^2$, $R^3$, $R^4$, and $R^5$ are each the same or different from the others and are groups attached through a carbon or non-carbon atom, including alkyl, aryl, heteroaryl, alkenyl, amido, silyl, and inorganic and organic ligands. In some embodiments, the groups R, $R^1$, $R^2$, $R^3$, $R^4$, and $R^5$ are each the same or different from the others and are alkyl groups attached through a carbon atom.

Embodiments of this invention may further provide that the stoichiometry of a polymeric precursor compound may be controlled to any desired level through the adjustment of the amounts of each of the monomers provided in the formation reactions.

As shown in Reaction Scheme 8, a polymerization to form a polymeric precursor may be initiated with a mixture of monomers $M^A(ER^3)$, $M^{B1}(ER^1)_3$, and $M^{B2}(ER^2)_3$ having any arbitrary ratios of stoichiometry.

REACTION SCHEME 8:

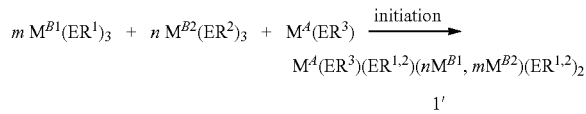

In Reaction Scheme 8, a polymerization can be performed with a mixture of monomers in any desired amounts. In certain variations, a polymerization to form a polymeric precursor may be initiated with a mixture of any combination of the monomers described above, where the number of equivalents of each monomer is adjusted to any arbitrary level.

In some variations, a polymerization to form a polymeric precursor can be done using the monomers $M^{A1}(ER^1)$, $M^{A2}(ER^2)$, and $M^{A3}(ER^3)$, for example, which can be contacted in any desired quantity to produce any arbitrary ratio of $M^{A1}$ to $M^{A2}$ to $M^{A3}$.

In some aspects, for alternating copolymers of monomers $M^A(ER)$ and $M^B(ER)_3$, the ratio of $M^A$ to $M^B$ in the polymeric precursor can be controlled from a ratio as low as 1:2 in the unit BAB, for example, to a ratio of 1:1 in an alternating $(AB)_n$ polymeric precursor, to a ratio of 1.5:1 or higher. The ratio of $M^A$ to $M^B$ in the polymeric precursor may be 0.5 to 1.5, or 0.5 to 1, or 1 to 1, or 1 to 0.5, or 1.5 to 0.5. As discussed above, in further embodiments, a polymeric precursor compound may be made with any desired stoichiometry of the number of different metal atoms and atoms of Group 13 and their respective concentration levels or ratios.

In certain aspects, a polymerization to form a polymeric precursor can be done to form a polymeric precursor having any ratio of $M^A$ to $M^B$. As shown in Reaction Scheme 9, a polymeric precursor having the composition $\{p\ M^A(ER)/m\ M^{B1}(ER)_3/n\ M^{B2}(ER)_3\}$ may be formed using the mixture of monomers $m\ M^{B1}(ER)_3 + n\ M^{B2}(ER)_3 + p\ M^A(ER)$.

REACTION SCHEME 9:

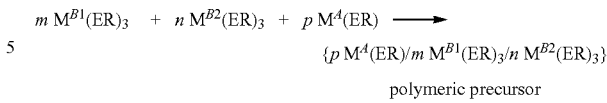

In certain variations, any number of monomers of $M^A(ER)$ and any number of monomers of $M^B(ER)_3$ can be used in the formation reactions. For example, a polymeric precursor may be made with the monomers $M^{A1}(ER)$, $M^{A2}(ER)$, $M^{A3}(ER)$, $M^{B1}(ER)_3$, $M^{B2}(ER^1)_3$, $M^{B3}(ER^2)_3$, and $M^{B4}(ER^3)_3$, where the number of equivalents of each monomer is an independent and arbitrary amount.

For example, the ratios of the atoms $M^A : M^B$ in a polymeric precursor may be about 0.5:1 or greater, or about 0.6:1 or greater, or about 0.7:1 or greater, or about 0.8:1 or greater, or about 0.9:1 or greater, or about 0.95:1 or greater. In certain variations, the ratios of the atoms $M^A : M^B$ in a polymeric precursor may be about 1:1 or greater, or about 1.1:1 or greater.

In further examples, the ratios of the atoms $M^A : M^B$ in a polymeric precursor may be from about 0.5 to about 1.2, or from about 0.6 to about 1.2, or from about 0.7 to about 1.1, or from about 0.8 to about 1.1, or from about 0.8 to about 1, or from about 0.9 to about 1. In some examples, the ratios of the atoms $M^A : M^B$ in a polymeric precursor may be about 0.80, or about 0.82, or about 0.84, or about 0.86, or about 0.88, or about 0.90, or about 0.92, or about 0.94, or about 0.96, or about 0.98, or about 1.00, or about 1.02, or about 1.1, or about 1.2, or about 1.3, or about 1.5. In the foregoing ratios $M^A : M^B$, the ratio refers to the sum of all atoms of $M^A$ or $M^B$, respectively, when there are more than one kind of $M^A$ or $M^B$, such as $M^{A1}$ and $M^{A2}$ and $M^{B1}$ and $M^{B2}$.

As shown in Reaction Scheme 10, a polymeric precursor compound having the repeating unit composition $\{M^A(ER)_2(m\ M^{B1}, n\ M^{B2})(ER)_2\}$ may be formed using the mixture of monomers $m\ M^{B1}(ER)_3 + n\ M^{B2}(ER)_3 + M^A(ER)$.

REACTION SCHEME 10:

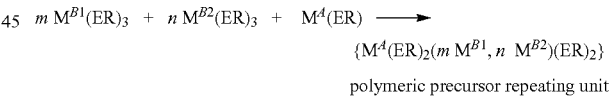

In Reaction Scheme 10, the sum of m and n is one.

Embodiments of this invention may further provide a polymeric precursor made from monomers of $M^A(ER)$ and $M^B(ER)_3$, where the total number of equivalents of monomers of $M^A(ER)$ is less than the total number of equivalents of monomers of $M^B(ER)_3$. In certain embodiments, a polymeric precursor may be made that is substoichiometric or deficient in atoms of $M^A$ relative to atoms of $M^B$.

As used herein, the expression $M^A$ is deficient, or $M^A$ is deficient to $M^B$ refers to a composition or formula in which there are fewer atoms of $M^A$ than $M^B$.

As used herein, the expression $M^A$ is enriched, or $M^A$ is enriched relative to $M^B$ refers to a composition or formula in which there are more atoms of $M^A$ than $M^B$.

As shown in Reaction Scheme 11, a polymeric precursor having the empirical formula $M^A_x(M^{A1}_{1-y}M^{B2}_y)_v((S_{1-z}Se_z)R)_w$ may be formed using the mixture of monomers $M^{B1}(ER)_3$, $M^{B2}(ER)_3$ and $M^A(ER)$.

REACTION SCHEME 11:

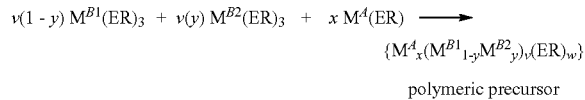

polymeric precursor where w can be (3v+x).

In some embodiments, a precursor compound may be a combination of u*(1−x) equivalents of $M^{A1}(ER)$, u*x equivalents of $M^{A2}(ER)$, v*(1−y−t) equivalents of $M^{B1}(ER)_3$, v*y equivalents of $M^{B2}(ER)_3$, v*t equivalents of $M^{B3}(ER)_3$, wherein $M^{A1}$ is Cu and $M^{A2}$ is Ag, $M^{B1}$, $M^{B2}$ and $M^{B3}$ are different atoms of Group 13, wherein the compound has the empirical formula $(M^{A1}{}_{1-x}M^{A2}{}_x)_u(M^{B1}{}_{1-y-t}M^{B2}{}_yM^{B3}{}_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.5 to 1.5, v is from 0.5 to 1.5, w is from 2 to 6, and R represents R groups, of which there are w in number, independently selected from alkyl, aryl, heteroaryl, alkenyl, amido, silyl, and inorganic and organic ligands. In some embodiments, x is from 0.001 to 0.999. In some embodiments, t is from 0.001 to 0.999.

In some embodiments, a precursor compound may have the empirical formula $(Cu_{1-x}Ag_x)_u(In_{1-y-t}Ga_yAl_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.5 to 1.5, v is from 0.5 to 1.5, w is from 2 to 6, and R represents R groups, of which there are w in number, as defined above. In some embodiments, x is from 0.001 to 0.999. In some embodiments, t is from 0.001 to 0.999.

In some embodiments, a precursor compound may have the empirical formula $(Cu_{1-x}Ag_x)_u(In_{1-y-t}Ga_yAl_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.7 to 1.25, v is from 0.7 to 1.25, w is from 2 to 6, and R represents R groups, of which there are w in number, as defined above. In some embodiments, x is from 0.001 to 0.999. In some embodiments, t is from 0.001 to 0.999.

In some embodiments, a precursor compound may have the empirical formula $(Cu_{1-x}Ag_x)_u(In_{1-y-t}Ga_yAl_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.8 to 0.95, v is from 0.9 to 1.1, w is from 3.6 to 4.4, and R represents R groups, of which there are w in number, as defined above. In some embodiments, x is from 0.001 to 0.999. In some embodiments, t is from 0.001 to 0.999.

In some embodiments, a precursor compound may be a combination of w*(1−z) equivalents of $M^{A1}(ER^1)$, w*z equivalents of $M^{A2}(ER^2)$, x equivalents of $M^{B1}(ER^3)_3$, y equivalents of $M^{B2}(ER^4)_3$, t equivalents of $M^{B3}(ER^5)_3$, wherein $M^{A1}$ is Cu and $M^{A2}$ is Ag, $M^{B1}$, $M^{B2}$ and $M^{B3}$ are different atoms of Group 13, wherein the compound has the empirical formula $(Cu_{1-z}Ag_z)_wIn_xGa_yAl_t(ER^1)_{w(1-z)}(ER^2)_{(w*z)}(ER^3)_{3x}(ER^4)_{3y}(ER^5)_{3t}$, w is from 0.5 to 1.5, z is from 0 to 1, x is from 0 to 1, y is from 0 to 1, t is from 0 to 1, x plus y plus t is one, and wherein $R^1$, $R^2$, $R^3$, $R^4$ and $R^5$ are the same or each different, and are independently selected, for each occurrence, from alkyl, aryl, heteroaryl, alkenyl, amido, silyl, and inorganic and organic ligands. In some embodiments, z is from 0.001 to 0.999. In some embodiments, t is from 0.001 to 0.999.

In some embodiments, a precursor compound may have the empirical formula $(Cu_{1-z}Ag_z)_wIn_xGa_yAl_t(ER^1)_{w(1-z)}(ER^2)_{(w*z)}(ER^3)_{3x}(ER^4)_{3y}(ER^5)_{3t}$, w is from 0.5 to 1.5, z is from 0 to 1, x is from 0 to 1, y is from 0 to 1, t is from 0 to 1, x plus y plus t is one, and wherein $R^1$, $R^2$, $R^3$, $R^4$ and $R^5$ are as defined above. In some embodiments, z is from 0.001 to 0.999. In some embodiments, t is from 0.001 to 0.999.

In some embodiments, a precursor compound may have the empirical formula $(Cu_{1-z}Ag_z)_wIn_xGa_yAl_t(ER^1)_{w(1-z)}(ER^2)_{(w*z)}(ER^3)_{3x}(ER^4)_{3y}(ER^5)_{3t}$, w is from 0.7 to 1.25, z is from 0 to 1, x is from 0 to 1, y is from 0 to 1, t is from 0 to 1, x plus y plus t is one, and wherein $R^1$, $R^2$, $R^3$, $R^4$ and $R^5$ are as defined above. In some embodiments, z is from 0.001 to 0.999. In some embodiments, t is from 0.001 to 0.999.

In some embodiments, a precursor compound may have the empirical formula $(Cu_{1-z}Ag_z)_wIn_xGa_yAl_t(ER^1)_{(1-z)}(ER^2)_{(w*z)}(ER^3)_{3x}(ER^4)_{3y}(ER^5)_{3t}$, w is from 0.8 to 0.95, z is from 0 to 1, x is from 0 to 1, y is from 0 to 1, t is from 0 to 1, x plus y plus t is one, and wherein $R^1$, $R^2$, $R^3$, $R^4$ and $R^5$ are as defined above. In some embodiments, z is from 0.001 to 0.999. In some embodiments, t is from 0.001 to 0.999.

In further aspects, a mixture of polymeric precursor compounds may advantageously be prepared with any desired stoichiometry of the number of different metal atoms and atoms of Group 13 and their respective stoichiometric levels or ratios.

As shown in Reaction Scheme 12, a polymeric precursor compound may be prepared by contacting x equivalents of $M^{B1}(ER^1)_3$, y equivalents of $M^{B2}(ER^2)_3$, and z equivalents of $M^A(ER^3)$, where $M^{B1}$ and $M^{B2}$ are different atoms of Group 13, x is from 0.5 to 1.5, y is from 0.5 to 1.5, and z is from 0.5 to 1.5. For example, $M^{B1}$ may be In and $M^{B2}$ may be Ga.

REACTION SCHEME 12:

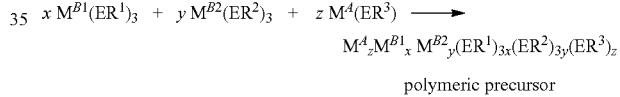

polymeric precursor

A polymeric precursor compound may have the empirical formula $Cu_xIn_yGa_z(ER^1)_x(ER^2)_{3y}(ER^3)_{3z}$, where $R^1$, $R^2$ and $R^3$ are the same or each different from the other. A polymeric precursor compound of this kind can be used to control the ratio of In to Ga, and make the ratio In:Ga a predetermined value.

Controlling the Stoichiometry of Monovalent Metal Atoms $M^A$

In some aspects, a polymeric precursor composition may advantageously be prepared with any desired stoichiometry of monovalent metal atoms $M^A$.

Embodiments of this invention can provide polymeric precursor compounds that may advantageously be prepared with any desired stoichiometry with respect to the number of different monovalent metal elements and their respective ratios. Polymeric precursor compounds having predetermined stoichiometry may be used in a process for making a photovoltaic absorber layer having the same predetermined stoichiometry on a substrate. Processes for making a photovoltaic absorber layer having predetermined stoichiometry on a substrate include depositing a precursor having the predetermined stoichiometry onto the substrate and converting the deposited precursor into a photovoltaic absorber material.

In some embodiments, a polymeric precursor can be made with a predetermined stoichiometry of Cu atoms. The amount of Cu relative to atoms of Group 13 can be a deficiency of copper, in which the ratio of Cu/In, Cu/Ga, Cu/(In+Ga), or Cu/(In+Ga+Al) is less than one. The amount of Cu relative to atoms of Group 13 can reflect enrichment of copper, in which the ratio of Cu/In, Cu/Ga, Cu/(In+Ga), or Cu/(In+Ga+Al) is greater than one.

In some embodiments, a polymeric precursor can be made with a predetermined stoichiometry of Ag atoms. The amount of Ag relative to atoms of Group 13 can be a deficiency of silver, in which the ratio of Ag/In, Ag/Ga, Ag/(In+Ga), or Ag/(In+Ga+Al) is less than one. The amount of Ag relative to atoms of Group 13 can reflect enrichment of silver, in which the ratio of Ag/In, Ag/Ga, Ag/(In+Ga), or Ag/(In+Ga+Al) is greater than one.

In some embodiments, a polymeric precursor can be made with a predetermined stoichiometry of Cu and Ag atoms. The amount of Cu and Ag relative to atoms of Group 13 can be a deficiency of copper and silver, in which the ratio of (Cu+Ag)/In, (Cu+Ag)/Ga, (Cu+Ag)/(In+Ga), or (Cu+Ag)/(In+Ga+Al) is less than one.

In some embodiments, the amount of Cu and Ag relative to atoms of Group 13 can reflect enrichment of copper and silver, in which the ratio of (Cu+Ag)/In, (Cu+Ag)/Ga, (Cu+Ag)/(In+Ga), or (Cu+Ag)/(In+Ga+Al) is greater than one.

In further embodiments, a polymeric precursor can be made with a predetermined stoichiometry of Cu to Ag atoms where the precursor has any ratio of Cu to Ag. The ratio of Cu to Ag can be from about zero, where the precursor contains little or zero copper, to a very high ratio, where the precursor contains little or zero silver.

In some aspects, polymeric precursor compounds of this invention having predetermined stoichiometry can be used to make photovoltaic materials having the stoichiometry of CIS, CIGS, AIS, AIGS, CAIS, CAIGS, or CAIGAS.

A precursor compound of this disclosure may be a combination of $u*(1-x)$ equivalents of $M^{A1}(ER)$, $u*x$ equivalents of $M^{A2}(ER)$, $v*(1-y)$ equivalents of $M^{B1}(ER)_3$, $v*y$ equivalents of $M^{B2}(ER)_3$, wherein $M^{A1}$ is Cu and $M^{A2}$ is Ag, $M^{B1}$ and $M^{B2}$ are different atoms of Group 13, wherein the compound has the empirical formula $(M^{A1}_{1-x}M^{A2}_x)_u(M^{B1}_{1-y}M^{B2}_y)_v((S_{1-z}Se_z)R)_w$, wherein x is from 0 to 1, y is from 0 to 1, z is from 0 to 1, u is from 0.5 to 1.5, v is from 0.5 to 1.5, w is from 2 to 6, and R represents R groups, of which there are w in number, independently selected from alkyl, aryl, heteroaryl, alkenyl, amido, silyl, and inorganic and organic ligands. In these embodiments, a precursor compound can have the stoichiometry useful to prepare CAIGS, CIGS and AIGS materials, including materials deficient in the quantity of a Group 11 atom. In some embodiments, x is from 0.001 to 0.999.

In some embodiments, a precursor compound can be a combination of $w*(1-z)$ equivalents of $M^{A1}(ER^1)$, $w*z$ equivalents of $M^{A2}(ER^2)$ x equivalents of $M^{B1}(ER^3)_3$, y equivalents of $M^{B2}(ER^4)_3$, wherein $M^{A1}$ is Cu and $M^{A2}$ is Ag, $M^{B1}$ and $M^{B2}$ are different atoms of Group 13, wherein the compound has the empirical formula $(Cu_{1-z}Ag_z)_wIn_xGa_y(ER^1)_{w(1-z)}(ER^2)_{(w*z)}(ER^3)_{3x}(ER^4)_{3y}$, w is from 0.5 to 1.5, z is from 0 to 1, x is from 0 to 1, y is from 0 to 1, x plus y is one, and wherein $R^1, R^2, R^3, R^4$ are the same or each different, and are independently selected, for each occurrence, from alkyl, aryl, heteroaryl, alkenyl, amido, silyl, and inorganic and organic ligands. In these embodiments, a precursor compound can have the stoichiometry useful to prepare CAIGS, CIGS and AIGS materials, including materials deficient in the quantity of a Group 11 atom. In some embodiments, z is from 0.001 to 0.999.

A precursor compound of this disclosure may be a combination of x equivalents of $M^{A1}(ER)$, $v*(1-y)$ equivalents of $M^{B1}(ER)_3$, $v*y$ equivalents of $M^{B2}(ER)_3$, wherein $M^{A1}$ is Cu, $M^{B1}$ and $M^{B2}$ are different atoms of Group 13, wherein the compound has the empirical formula $M^{A1}_x(M^{B1}_{1-y}M^{B2}_y)_v((S_{1-z}Se_z)R)_w$, wherein x is from 0.5 to 1.5, y is from 0 to 1, z is from 0 to 1, v is from 0.5 to 1.5, w is from 2 to 6, and R represents R groups, of which there are w in number, independently selected from alkyl, aryl, heteroaryl, alkenyl, amido, silyl, and inorganic and organic ligands. In these embodiments, a precursor compound can have the stoichiometry useful to prepare CIS or CIGS materials, including materials deficient or enriched in the quantity of a Group 11 atom.

In some embodiments, a precursor compound can be a combination of z equivalents of $M^{A1}(ER^1)$, x equivalents of $M^{B1}(ER^2)_3$, y equivalents of $M^{B2}(ER^3)_3$, wherein $M^{A1}$ is Cu, $M^{B1}$ and $M^{B2}$ are different atoms of Group 13, wherein the compound has the empirical formula $Cu_zIn_xGa_y(ER^1)_z(ER^2)_{3x}(ER^3)_{3y}$, z is from 0.5 to 1.5, x is from 0 to 1, y is from 0 to 1, x plus y is one, and wherein $R^1, R^2, R^3$ are the same or each different, and are independently selected, for each occurrence, from alkyl, aryl, heteroaryl, alkenyl, amido, silyl, and inorganic and organic ligands. In these embodiments, a precursor compound can have the stoichiometry useful to prepare CIS or CIGS materials, including materials deficient or enriched in the quantity of a Group 11 atom.

As shown in Reaction Scheme 13, a polymeric precursor compound may be prepared by contacting x equivalents of $M^{A1}(ER^1)$, y equivalents of $M^{A2}(ER^2)$, and z equivalents of $M^B(ER^3)_3$, where $M^{A1}$ and $M^{A2}$ are different monovalent metal atoms, x is from 0.5 to 1.5, y is from 0.5 to 1.5, and z is from 0.5 to 1.5. For example, $M^{A1}$ may be Cu and $M^{A2}$ may be Ag.

REACTION SCHEME 13:

$x M^{A1}(ER^1) + y M^{A2}(ER^2) + z M^B(ER^3)_3 \longrightarrow$

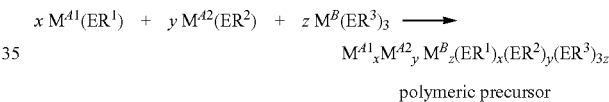

$M^{A1}_x M^{A2}_y M^B_z(ER^1)_x(ER^2)_y(ER^3)_{3z}$ polymeric precursor

A polymeric precursor compound may have the empirical formula $Cu_xAg_yIn_z(ER^1)_x(ER^2)_y(ER^3)_{3z}$, where $R^1, R^2$ and $R^3$ are the same or each different from the other. A polymeric precursor compound of this kind can be used to control the ratio of Cu to Ag, and make the ratio Cu:Ag a predetermined value.

Controlling the Stoichiometry of Atoms of Group 13 in a Thin Film Material Made with a Polymeric Precursor Embodiments of this invention can provide polymeric precursor compounds that may advantageously be prepared with any desired stoichiometry with respect to the number of different Group 13 elements and their respective ratios. Polymeric precursor compounds having predetermined stoichiometry may be used in a process for making a photovoltaic absorber layer having the same predetermined stoichiometry on a substrate. Processes for making a photovoltaic absorber layer having predetermined stoichiometry on a substrate include depositing a precursor having the predetermined stoichiometry onto the substrate and converting the deposited precursor into a photovoltaic absorber material.

In some aspects, polymeric precursor compounds of this invention having predetermined stoichiometry can be used to make photovoltaic materials having the stoichiometry of CIGS, AIGS, CAIGS, CIGAS, AIGAS and CAIGAS.

In certain embodiments, the precursor may have predetermined stoichiometry according to the empirical formula $(M^{A1}_{1-x}M^{A2}_x)_u(M^{B1}_{1-y-t}M^{B2}_yM^{B3}_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.5 to 1.5, v is from 0.5 to 1.5, w is from 2 to 6, and R represents R groups, of which there are w in number, independently selected from alkyl, aryl, heteroaryl, alkenyl, amido, silyl, and inorganic and organic ligands. In some embodiments, x is from 0.001 to 0.999. In some embodiments, t is from 0.001 to 0.999.

In further variations, the precursor can have predetermined stoichiometry according to the empirical formula $(Cu_{1-x}Ag_x)_u(In_{1-y-t}Ga_yAl_t)_v((S_{1-z}Se_z)R)_w$, wherein x is from 0 to 1, y is from 0 to 1, t is from 0 to 1, the sum of y plus t is from 0 to 1, z is from 0 to 1, u is from 0.5 to 1.5, v is from 0.5 to 1.5, w is from 2 to 6, and R represents R groups, of which there are w in number, independently selected from alkyl, aryl, heteroaryl, alkenyl, amido, silyl, and inorganic and organic ligands. In some embodiments, x is from 0.001 to 0.999. In some embodiments, t is from 0.001 to 0.999.

In some aspects, polymeric precursors having predetermined stoichiometry can be used to make photovoltaic materials including $CuGaS_2$, $AgGaS_2$, $AuGaS_2$, $CuInS_2$, $AgInS_2$, $AuInS_2$, $CuGaSe_2$, $AgGaSe_2$, $AuGaSe_2$, $CuInSe_2$, $AgInSe_2$, $AuInSe_2$, $CuGaTe_2$, $AgGaTe_2$, $AuGaTe_2$, $CuInTe_2$, $AgInTe_2$, $AuInTe_2$, CuInGaSSe, AgInGaSSe, AuInGaSSe, CuInGaSSe, AgInGaSeTe, AuInGaSeTe, CuInGaSTe, AgInGaSTe, AuInGaSTe.

Crosslinking and Chemical Reagents for Polymeric Precursors

Embodiments of this invention encompass methods and compositions for crosslinking polymeric precursors and compositions.

In some aspects, a crosslinked polymeric precursor may be used to control the viscosity of a precursor composition, or a polymeric precursor ink composition. The crosslinking of a polymeric precursor can increase its molecular weight. The molecular weight of a polymeric precursor can be varied over a wide range by incorporating crosslinking into the preparation of the precursor. The viscosity of an ink composition can be varied over a wide range by using a crosslinked precursor to prepare an ink composition.

In some embodiments, the crosslinking of a polymeric precursor composition may be used to control the viscosity of the composition, or of a polymeric precursor ink composition. A polymeric precursor component of a composition can be crosslinked by adding a crosslinking agent to the composition. The viscosity of an ink composition may be varied over a wide range by adding a crosslinking agent to the ink composition.

In further aspects, the crosslinking of a polymeric precursor composition may be used to control the variation of properties of thin films made with the precursor.

Examples of a crosslinking agent include $E(Si(CH_3)_3)_2$, where E is as defined above.

Examples of a crosslinking agent include $H_2E$, where E is as defined above.

Examples of a crosslinking agent include HEREH, $M^4(E-RE)H$ and $M^4(ERE)M^4$, where $M^4$, E, and R are as defined above.

Examples of a crosslinking agent include $(RE)_2$In-E-In$(ER)_2$, where E is as defined above and R is alkyl.

A crosslinking agent can be made by reacting $Cu_2O$ with HEREH to form Cu(ERE)H or Cu(ERE)Cu.

Examples of a crosslinking agent include dithiols and diselenols, for example, HER'EH, where E and R are as defined above. A diselenol can react with two ER groups of different polymeric precursor chains to link the chains together.

In another example, Cu(ER'E)Cu can be used during synthesis of a polymeric precursor to form crosslinks.

Embodiments of this invention may further provide a crosslinking agent having the formula $(RE)_2M^{13}(ER'E)M^{13}(ER)_2$, where $M^{13}$, E, R' and R are as defined above. A crosslinking agent of this kind may be used either during synthesis of a polymeric precursor to form crosslinks, or in formation of an ink or other composition.

In some embodiments, a polymeric precursor may incorporate crosslinkable functional groups. A crosslinkable functional group may be attached to a portion of the R groups of one or more kinds in the polymeric precursor.

Examples of crosslinkable functional groups include vinyl, vinylacrylate, epoxy, and cycloaddition and Diels-Alder reactive pairs. Crosslinking may be performed by methods known in the art including the use of heat, light or a catalyst, as well as by vulcanization with elemental sulfur.

Dopants

In some embodiments, a polymeric precursor composition may include a dopant. A dopant may be introduced into a polymeric precursor in the synthesis of the precursor, or alternatively, can be added to a composition or ink containing the polymeric precursor. A semiconductor material or thin film of this disclosure made from a polymeric precursor may contain atoms of one or more dopants. Methods for introducing a dopant into a photovoltaic absorber layer include preparing the absorber layer with a polymeric precursor of this invention containing the dopant.

The quantity of a dopant in an embodiment of this disclosure can be from about $1 \times 10^{-7}$ atom percent to about 5 atom percent relative to the most abundant Group 11 atom, or greater. In some embodiments, a dopant can be included at a level of from about $1 \times 10^{16}$ cm$^{-3}$ to about $1 \times 10^{21}$ cm$^{-3}$. A dopant can be included at a level of from about 1 ppm to about 10,000 ppm.

In some embodiments, a dopant may be an alkali metal atom including Li, Na, K, Rb, and a mixture of any of the foregoing.

Embodiments of this invention may further include a dopant being an alkaline earth metal atom including Be, Mg, Ca, Sr, Ba, and a mixture of any of the foregoing.

In some embodiments, a dopant may be a transition metal atom from Group 3 through Group 12.

In some embodiments, a dopant may be a transition metal atom from Group 5 including V, Nb, Ta, and a mixture of any of the foregoing.

In some embodiments, a dopant may be a transition metal atom from Group 6 including Cr, Mo, W, and a mixture of any of the foregoing.

In some embodiments, a dopant may be a transition metal atom from Group 10 including Ni, Pd, Pt, and a mixture of any of the foregoing.

In some embodiments, a dopant may be a transition metal atom from Group 12 including Zn, Cd, Hg, and a mixture of any of the foregoing.

In some embodiments, a dopant may be an atom from Group 14 including C, Si, Ge, Sn, Pb, and a mixture of any of the foregoing.

In some embodiments, a dopant may be an atom from Group 15 including P, As, Sb, Bi, and a mixture of any of the foregoing. For example, a polymeric precursor composition may be prepared using an amount of $Sb(ER)_3$, $Bi(ER)_3$, or mixtures thereof, where E is S or Se and R is alkyl or aryl.

A dopant may be provided in a precursor as a counterion or introduced into a thin film by any of the deposition methods described herein. A dopant may also be introduced into a thin film by methods known in the art including ion implantation.

A dopant of this disclosure may be p-type or n-type.

Any of the foregoing dopants may be used in an ink of this invention.

Capping Compounds

In some embodiments, a polymeric precursor composition may be formed as shown in Reaction Schemes 1 through 6, where one or more capping compounds are added to the reactions. A capping compound may control the extent of polymer chain formation. A capping compound may also be used to control the viscosity of an ink containing the polymeric precursor compound or composition, as well as its solubility and ability to from a suspension. Examples of capping compounds include inorganic or organometallic complexes which bind to repeating units A or B, or both, and prevent further chain propagation. Examples of capping compounds include $R_2M^BER$, and $RM^B(ER)_2$.

Ligands

As used herein, the term ligand refers to any atom or chemical moiety that can donate electron density in bonding or coordination.

A ligand can be monodentate, bidentate or multidentate.

As used herein, the term ligand includes Lewis base ligands.

As used herein, the term organic ligand refers to an organic chemical group composed of atoms of carbon and hydrogen, having from 1 to 22 carbon atoms, and optionally containing oxygen, nitrogen, sulfur or other atoms, which can bind to another atom or molecule through a carbon atom. An organic ligand can be branched or unbranched, substituted or unsubstituted.

As used herein, the term inorganic ligand refers to an inorganic chemical group which can bind to another atom or molecule through a non-carbon atom.

Examples of ligands include halogens, water, alcohols, ethers, hydroxyls, amides, carboxylates, chalcogenylates, thiocarboxylates, selenocarboxylates, tellurocarboxylates, carbonates, nitrates, phosphates, sulfates, perchlorates, oxalates, and amines As used herein, the term chalcogenylate refers to thiocarboxylate, selenocarboxylate, and tellurocarboxylate, having the formula $RCE_2^-$, where E is S, Se, or Te.

As used herein, the term chalcocarbamate refers to thiocarbamate, selenocarbamate, and tellurocarbamate, having the formula $R^1R^2NCE_2^-$, where E is S, Se, or Te, and $R^1$ and $R^2$ are the same or different and are hydrogen, alkyl, aryl, or an organic ligand.

Examples of ligands include $F^-$, $Cl^-$, $H_2O$, ROH, $R_2O$, $OH^-$, $RO^-$, $NR_2^-$, $RCO_2^-$, $RCE_2^-$, $CO_3^{2-}$, $NO_3^-$, $PO_4^{3-}$, $SO_4^{2-}$, $ClO_4^-$, $C_2O_4^{2-}$, $NH_3$, $NR_3$, $R_2NH$, and $RNH_2$, where R is alkyl, and E is chalcogen.

Examples of ligands include azides, heteroaryls, thiocyanates, arylamines, arylalkylamines, nitrites, and sulfites.

Examples of ligands include $Br^-$, $N_3^-$, pyridine, [SCN—]$^-$, $ArNH_2$, $NO_2^-$, and $SO_3^{2-}$ where Ar is aryl.

Examples of ligands include cyanides or nitriles, isocyanides or isonitriles, alkylcyanides, alkylnitriles, alkylisocyanides, alkylisonitriles, arylcyanides, arylnitriles, arylisocyanides, and arylisonitriles.

Examples of ligands include hydrides, carbenes, carbon monoxide, isocyanates, isonitriles, thiolates, alkylthiolates, dialkylthiolates, thioethers, thiocarbamates, phosphines, alkylphosphines, arylphosphines, arylalkylphosphines, arsenines, alkylarsenines, arylarsenines, arylalkylarsenines, stilbines, alkylstilbines, arylstilbines, and arylalkylstilbines.

Examples of ligands include $I^-$, $H^-$, $R^-$, $-CN^-$, $-CO$, RNC, RSH, $R_2S$, $RS^-$, $-SCN^-$, $R_3P$, $R_3As$, $R_3Sb$, alkenes, and aryls, where each R is independently alkyl, aryl, or heteroaryl.

Examples of ligands include trioctylphosphine, trimethylvinylsilane and hexafluoroacetylacetonate.

Examples of ligands include nitric oxide, silyls, alkylgermyls, arylgermyls, arylalkylgermyls, alkylstannyls, arylstannyls, arylalkylstannyls, selenocyanates, selenolates, alkylselenolates, dialkylselenolates, selenoethers, selenocarbamates, tellurocyanates, tellurolates, alkyltellurolates, dialkyltellurolates, telluroethers, and tellurocarbamates.

Examples of ligands include chalcogenates, thiothiolates, selenothiolates, thioselenolates, selenoselenolates, alkyl thiothiolates, alkyl selenothiolates, alkyl thioselenolates, alkyl selenoselenolates, aryl thiothiolates, aryl selenothiolates, aryl thioselenolates, aryl selenoselenolates, arylalkyl thiothiolates, arylalkyl selenothiolates, arylalkyl thioselenolates, and arylalkyl selenoselenolates.

Examples of ligands include selenoethers and telluroethers.

Examples of ligands include NO, $O^{2-}$, $NH_nR_{3-n}$, $PH_nR_{3-n}$, $SiR_3^-$, $GeR_3^-$, $SnR_3^-$, $^-SR$, $^-SeR$, $^-TeR$, $^-SSR$, $^-SeSR$, $^-SSeR$, $^-SeSeR$, and RCN, where n is from 1 to 3, and each R is independently alkyl or aryl.

As used herein, the term transition metals refers to atoms of Groups 3 though 12 of the Periodic Table of the elements recommended by the Commission on the Nomenclature of Inorganic Chemistry and published in *IUPAC Nomenclature of Inorganic Chemistry, Recommendations* 2005.

Photovoltaic Absorber Layer Compositions

A polymeric precursor may be used to prepare a material for use in developing semiconductor products.

The polymeric precursors of this invention may advantageously be used in mixtures to prepare a material with controlled or predetermined stoichiometric ratios of the metal atoms in the material.

In some aspects, processes for solar cells that avoid additional sulfurization or selenization steps may advantageously use polymeric precursor compounds and compositions of this invention.

A polymeric precursor may be used to prepare an absorber material for a solar cell product. The absorber material may have the empirical formula $M^A_x(M^B_{1-y}M^C_y)_v(E^1_{1-z}E^2_z)_w$, where $M^A$ is a Group 11 atom selected from Cu, Ag, and Au, $M^B$ and $M^C$ are different Group 13 atoms selected from Al, Ga, In, Tl, or a combination thereof, $E^1$ is S or Se, $E^2$ is Se or Te, $E^1$ and $E^2$ are different, x is from 0.5 to 1.5, y is from 0 to 1, and z is from 0 to 1, v is from 0.5 to 1.5, and w is from 1.5 to 2.5.

The absorber material may be either an n-type or a p-type semiconductor, when such compound is known to exist.

In some embodiments, one or more polymeric precursor compounds may be used to prepare a CIS layer on a substrate, wherein the layer has the empirical formula $Cu_xIn_y(S_{1-z}Se_z)_w$, where x is from 0.5 to 1.5, y is from 0.5 to 1.5, z is from 0 to 1, and w is from 1.5 to 2.5.

In some aspects, one or more polymeric precursor compounds may be used to prepare a CIS layer on a substrate, wherein the layer has the empirical formula $Cu_xIn_y(S_{1-z}Se_z)_w$, where x is from 0.7 to 1.2, y is from 0.7 to 1.2, z is from 0 to 1, and w is from 1.5 to 2.5.

In some variations, one or more polymeric precursor compounds may be used to prepare a CIS layer on a substrate, wherein the layer has the empirical formula $Cu_xIn_y(S_{1-z}Se_z)_w$, where x is from 0.7 to 1.1, y is from 0.7 to 1.1, z is from 0 to 1, and w is from 1.5 to 2.5.

In certain embodiments, one or more polymeric precursor compounds may be used to prepare a CIS layer on a substrate, wherein the layer has the empirical formula $Cu_xIn_y(S_{1-z}Se_z)_w$, where x is from 0.8 to 0.95, y is from 0.95 to 1.05, z is from 0 to 1, and w is from 1.8 to 2.2.

In certain embodiments, one or more polymeric precursor compounds may be used to prepare a CIS layer on a substrate, wherein the layer has the empirical formula $Cu_xIn_y(S_{1-z}Se_z)_w$, where x is from 0.8 to 0.95, y is from 0.95 to 1.05, z is from 0 to 1, and w is from 2.0 to 2.2.

In some embodiments, one or more polymeric precursor compounds may be used to prepare a CIGS layer on a substrate, wherein the layer has the empirical formula $Cu_x(In_{1-y}Ga_y)_v(S_{1-z}Se_z)_w$, where x is from 0.5 to 1.5, y is from 0 to 1, and z is from 0 to 1, v is from 0.5 to 1.5, and w is from 1.5 to 2.5.

In some aspects, one or more polymeric precursor compounds may be used to prepare a CIGS layer on a substrate, wherein the layer has the empirical formula $Cu_x(In_{1-y}Ga_y)_v(S_{1-z}Se_z)_w$, where x is from 0.7 to 1.2, y is from 0 to 1, and z is from 0 to 1, v is from 0.7 to 1.2, and w is from 1.5 to 2.5.

In some variations, one or more polymeric precursor compounds may be used to prepare a CIGS layer on a substrate, wherein the layer has the empirical formula $Cu_x(In_{1-y}Ga_y)_v(S_{1-z}Se_z)_w$, where x is from 0.7 to 1.1, y is from 0 to 1, and z is from 0 to 1, v is from 0.7 to 1.1, and w is from 1.5 to 2.5.

In certain embodiments, one or more polymeric precursor compounds may be used to prepare a CIGS layer on a substrate, wherein the layer has the empirical formula $Cu_x(In_{1-y}Ga_y)_v(S_{1-z}Se_z)_w$, where x is from 0.7 to 1.1, y is from 0 to 1, and z is from 0 to 1, v is from 0.7 to 1.1, and w is from 1.5 to 2.5.

In certain embodiments, one or more polymeric precursor compounds may be used to prepare a CIGS layer on a substrate, wherein the layer has the empirical formula $Cu_x(In_{1-y}Ga_y)_v(S_{1-z}Se_z)_w$, where x is from 0.8 to 0.95, y is from 0 to 0.5, and z is from 0 to 1, v is from 0.95 to 1.05, and w is from 1.8 to 2.2.

In certain embodiments, one or more polymeric precursor compounds may be used to prepare a CIGS layer on a substrate, wherein the layer has the empirical formula $Cu_x(In_{1-y}Ga_y)_v(S_{1-z}Se_z)_w$, where x is from 0.8 to 0.95, y is from 0 to 0.5, and z is from 0 to 1, v is from 0.95 to 1.05, and w is from 2.0 to 2.2.

In some embodiments, one or more polymeric precursor compounds may be used to prepare a CAIGS layer on a substrate, wherein the layer has the empirical formula $(Cu_{1-x}Ag_x)_u(In_{1-y}Ga_y)_v(S_{1-z}Se_z)_w$, where x is from 0.001 to 0.999, y is from 0 to 1, z is from 0 to 1, u is from 0.5 to 1.5, v is from 0.5 to 1.5, and w is from 1.5 to 2.5.

In some embodiments, one or more polymeric precursor compounds may be used to prepare a CAIGS layer on a substrate, wherein the layer has the empirical formula $(Cu_{1-x}Ag_x)_u(In_{1-y}Ga_y)_v(S_{1-z}Se_z)_w$, where x is from 0.001 to 0.999, y is from 0 to 1, z is from 0 to 1, u is from 0.7 to 1.2, v is from 0.7 to 1.2, and w is from 1.5 to 2.5.

In some embodiments, one or more polymeric precursor compounds may be used to prepare a CAIGS layer on a substrate, wherein the layer has the empirical formula $(Cu_{1-x}Ag_x)_u(In_{1-y}Ga_y)_v(S_{1-z}Se_z)_w$, where x is from 0.001 to 0.999, y is from 0 to 1, z is from 0 to 1, u is from 0.7 to 1.1, v is from 0.7 to 1.1, and w is from 1.5 to 2.5.

In some embodiments, one or more polymeric precursor compounds may be used to prepare a CAIGS layer on a substrate, wherein the layer has the empirical formula $(Cu_{1-x}Ag_x)_u(In_{1-y}Ga_y)_v(S_{1-z}Se_z)_w$, where x is from 0.001 to 0.999, y is from 0 to 1, z is from 0.5 to 1, u is from 0.7 to 1.1, v is from 0.7 to 1.1, and w is from 1.5 to 2.5.

In some embodiments, one or more polymeric precursor compounds may be used to prepare a CAIGS layer on a substrate, wherein the layer has the empirical formula $(Cu_{1-x}Ag_x)_u(In_{1-y}Ga_y)_v(S_{1-z}Se_z)_w$, where x is from 0.001 to 0.999, y is from 0 to 1, z is from 0.5 to 1, u is from 0.8 to 0.95, v is from 0.7 to 1.1, and w is from 1.5 to 2.5.

Embodiments of this invention may further provide polymeric precursors that can be used to prepare a CIS, CIGS, AIS, AIGS, CAIS, CAIGS, CIGAS, AIGAS or CAIGAS material for a solar cell product.

In some aspects, one or more polymeric precursors may be used to prepare a CIS, CIGS, AIS, AIGS, CAIS, CAIGS, CIGAS, AIGAS or CAIGAS material as a chemically and physically uniform layer.

In some variations, one or more polymeric precursors may be used to prepare a CIS, CIGS, AIS, AIGS, CAIS, CAIGS, CIGAS, AIGAS or CAIGAS material wherein the stoichiometry of the metal atoms of the material can be controlled.

In certain variations, one or more polymeric precursors may be used to prepare a CIS, CIGS, AIS, AIGS, CAIS, CAIGS, CIGAS, AIGAS or CAIGAS material using nanoparticles prepared with the polymeric precursors.

In certain embodiments, one or more polymeric precursors may be used to prepare a CIS, CIGS, AIS, AIGS, CAIS, CAIGS, CIGAS, AIGAS or CAIGAS material as a layer that may be processed at relatively low temperatures to achieve a solar cell.

In some aspects, one or more polymeric precursors may be used to prepare a CIS, CIGS, AIS, AIGS, CAIS, CAIGS, CIGAS, AIGAS or CAIGAS material as a photovoltaic layer.

In some variations, one or more polymeric precursors may be used to prepare a chemically and physically uniform semiconductor CIS, CIGS, AIS, AIGS, CAIS, CAIGS, CIGAS, AIGAS or CAIGAS layer on a variety of substrates, including flexible substrates.

Examples of an absorber material include $CuGaS_2$, $AgGaS_2$, $AuGaS_2$, $CuInS_2$, $AgInS_2$, $AuInS_2$, $CuTlS_2$, $AgTlS_2$, $AuTlS_2$, $CuGaSe_2$, $AgGaSe_2$, $AuGaSe_2$, $CuInSe_2$, $AgInSe_2$, $AuInSe_2$, $CuTlSe_2$, $AgTlSe_2$, $AuTlSe_2$, $CuGaTe_2$, $AgGaTe_2$, $AuGaTe_2$, $CuInTe_2$, $AgInTe_2$, $AuInTe_2$, $CuTlTe_2$, $AgTlTe_2$, and $AuTlTe_2$.

Examples of an absorber material include CuInGaSSe, AgInGaSSe, AuInGaSSe, CuInTlSSe, AgInTlSSe, AuInTlSSe, CuGaTlSSe, AgGaTlSSe, AuGaTlSSe, CuInGaSSe, AgInGaSeTe, AuInGaSeTe, CuInTlSeTe, AgInTlSeTe, AuInTlSeTe, CuGaTlSeTe, AgGaTlSeTe, AuGaTlSeTe, CuInGaSTe, AgInGaSTe, AuInGaSTe, CuInTlSTe, AgInTlSTe, AuInTlSTe, CuGaTlSTe, AgGaTlSTe, and AuGaTlSTe.

The CIS, CIGS, AIS, AIGS, CAIS, CAIGS, CIGAS, AIGAS or CAIGAS layer may be used with various junction partners to produce a solar cell. Examples of junction partner layers are known in the art and include CdS, ZnS, ZnSe, and CdZnS. See, for example, Martin Green, *Solar Cells: Operating Principles, Technology and System Applications* (1986); Richard H. Bube, *Photovoltaic Materials* (1998); Antonio Luque and Steven Hegedus, *Handbook of Photovoltaic Science and Engineering* (2003).

In some aspects, the thickness of an absorber layer may be from about 0.01 to about 100 micrometers, or from about 0.01 to about 20 micrometers, or from about 0.01 to about 10 micrometers, or from about 0.05 to about 5 micrometers, or from about 0.1 to about 4 micrometers, or from about 0.1 to about 3.5 micrometers, or from about 0.1 to about 3 micrometers, or from about 0.1 to about 2.5 micrometers.

Substrates

The polymeric precursors of this invention can be used to form a layer on a substrate. The substrate can have any shape. Substrate layers of polymeric precursors can be used to create a photovoltaic layer or device.

A substrate may have an electrical contact layer. The electrical contact layer can be on the surface of the substrate. An electrical contact layer on a substrate can be the back contact for a solar cell or photovoltaic device.

Examples of an electrical contact layer include a layer of a metal or a metal foil, as well as a layer of molybdenum, aluminum, copper, gold, platinum, silver, titanium nitride, stainless steel, a metal alloy, and a combination of any of the foregoing.

Examples of substrates on which a polymeric precursor of this disclosure can be deposited or printed include semiconductors, doped semiconductors, silicon, gallium arsenide, insulators, glass, molybdenum glass, silicon dioxide, titanium dioxide, zinc oxide, silicon nitride, and combinations thereof.

A substrate may be coated with molybdenum or a molybdenum-containing compound.

In some embodiments, a substrate may be pre-treated with a molybdenum-containing compound, or one or more compounds containing molybdenum and selenium.

Examples of substrates on which a polymeric precursor of this disclosure can be deposited or printed include metals, metal foils, molybdenum, aluminum, beryllium, cadmium, cerium, chromium, cobalt, copper, gold, manganese, nickel, palladium, platinum, rhenium, rhodium, silver, stainless steel, steel, iron, strontium, tin, titanium, tungsten, zinc, zirconium, metal alloys, metal silicides, metal carbides, and combinations thereof.

Examples of substrates on which a polymeric precursor of this disclosure can be deposited or printed include polymers, plastics, conductive polymers, copolymers, polymer blends, polyethylene terephthalates, polycarbonates, polyesters, polyester films, mylars, polyvinyl fluorides, polyvinylidene fluoride, polyethylenes, polyetherimides, polyethersulfones, polyetherketones, polyimides, polyvinylchlorides, acrylonitrile butadiene styrene polymers, silicones, epoxys, and combinations thereof.

Examples of substrates on which a polymeric precursor of this disclosure can be deposited or printed include roofing materials.

Examples of substrates on which a polymeric precursor of this disclosure can be deposited or printed include papers and coated papers.

A substrate of this disclosure can be of any shape. Examples of substrates on which a polymeric precursor of this disclosure can be deposited include a shaped substrate including a tube, a cylinder, a roller, a rod, a pin, a shaft, a plane, a plate, a blade, a vane, a curved surface or a spheroid.

A substrate may be layered with an adhesion promoter before the deposition, coating or printing of a layer of a polymeric precursor of this invention.

Examples of adhesion promoters include a glass layer, a metal layer, a titanium-containing layer, a tungsten-containing layer, a tantalum-containing layer, tungsten nitride, tantalum nitride, titanium nitride, titanium nitride silicide, tantalum nitride silicide, a chromium-containing layer, a vanadium-containing layer, a nitride layer, an oxide layer, a carbide layer, and combinations thereof.

Examples of adhesion promoters include organic adhesion promoters such as organofunctional silane coupling agents, silanes, hexamethyldisilazanes, glycol ether acetates, ethylene glycol bis-thioglycolates, acrylates, acrylics, mercaptans, thiols, selenols, tellurols, carboxylic acids, organic phosphoric acids, triazoles, and mixtures thereof.

Substrates may be layered with a barrier layer before the deposition of printing of a layer of a polymeric precursor of this invention.

Examples of a barrier layer include a glass layer, a metal layer, a titanium-containing layer, a tungsten-containing layer, a tantalum-containing layer, tungsten nitride, tantalum nitride, titanium nitride, titanium nitride silicide, tantalum nitride silicide, and combinations thereof A substrate can be of any thickness, and can be from about 20 micrometers to about 20,000 micrometers or more in thickness.

Ink Compositions

Embodiments of this invention further provide ink compositions which contain one or more polymeric precursor compounds. The polymeric precursors of this invention may be used to make photovoltaic materials by printing an ink onto a substrate.

An ink of this disclosure advantageously allows precise control of the stoichiometric ratios of certain atoms in the ink because the ink can be composed of a mixture of polymeric precursors.

Inks of this disclosure can be made by any methods known in the art.

In some embodiments, an ink can be made by mixing a polymeric precursor with one or more carriers. The ink may be a suspension of the polymeric precursors in an organic carrier. In some variations, the ink is a solution of the polymeric precursors in an organic carrier. The carrier can include one or more organic liquids or solvents, and may contain an aqueous component. A carrier may be an organic solvent.

An ink can be made by providing one or more polymeric precursor compounds and solubilizing, dissolving, solvating, or dispersing the compounds with one or more carriers. The compounds dispersed in a carrier may be nanocrystalline, nanoparticles, microparticles, amorphous, or dissolved molecules.

The concentration of the polymeric precursors in an ink of this disclosure can be from about 0.001% to about 99% (w/w), or from about 0.001% to about 90%, or from about 0.1% to about 90%.

A polymeric precursor may exist in a liquid or flowable phase under the temperature and conditions used for deposition, coating or printing.

In some variations of this invention, polymeric precursors that are partially soluble, or are insoluble in a particular carrier can be dispersed in the carrier by high shear mixing.

As used herein, the term dispersing encompasses the terms solubilizing, dissolving, and solvating.

The carrier for an ink of this disclosure may be an organic liquid or solvent. Examples of a carrier for an ink of this disclosure include one or more organic solvents, which may contain an aqueous component.

Embodiments of this invention further provide polymeric precursor compounds having enhanced solubility in one or more carriers for preparing inks. The solubility of a polymeric precursor compound can be selected by variation of the nature and molecular size and weight of one or more organic ligands attached to the compound.

An ink composition of this invention may contain any of the dopants disclosed herein, or a dopant known in the art.

Ink compositions of this disclosure can be made by methods known in the art, as well as methods disclosed herein.

Examples of a carrier for an ink of this disclosure include alcohol, methanol, ethanol, isopropyl alcohol, thiols, butanol, butanediol, glycerols, alkoxyalcohols, glycols, 1-methoxy-2-propanol, acetone, ethylene glycol, propylene glycol, propylene glycol laurate, ethylene glycol ethers, diethylene glycol, triethylene glycol monobutylether, propylene glycol monomethylether, 1,2-hexanediol, ethers, diethyl ether, aliphatic hydrocarbons, aromatic hydrocarbons, pentane, hexane, heptane, octane, isooctane, decane, cyclohexane, p-xylene, m-xylene, o-xylene, benzene, toluene, xylene, tetrahydrofuran, 2-methyltetrahydrofuran, siloxanes, cyclosiloxanes, silicone fluids, halogenated hydrocarbons, dibromomethane, dichloromethane, dichloroethane, trichloroethane chloroform, methylene chloride, acetonitrile, esters, acetates, ethyl acetate, butyl acetate, acrylates, isobornyl acrylate, 1,6-hexanediol diacrylate, polyethylene glycol diacrylate, ketones, acetone, methyl ethyl ketone, cyclohexanone, butyl carbitol, cyclopentanone, lactams, N-methylpyrrolidone, N-(2-hydroxyethyl)-pyrrolidone, cyclic acetals, cyclic ketals, aldehydes, amines, diamines, amides, dimethylformamide, methyl lactate, oils, natural oils, terpenes, and mixtures thereof.

An ink of this disclosure may further include components such as a surfactant, a dispersant, an emulsifier, an anti-foaming agent, a dryer, a filler, a resin binder, a thickener, a viscosity modifier, an anti-oxidant, a flow agent, a plasticizer, a conductivity agent, a crystallization promoter, an extender, a film conditioner, an adhesion promoter, and a dye. Each of these components may be used in an ink of this disclosure at a level of from about 0.001% to about 10% or more of the ink composition.

Examples of surfactants include siloxanes, polyalkyleneoxide siloxanes, polyalkyleneoxide polydimethylsiloxanes, polyester polydimethylsiloxanes, ethoxylated nonylphenols, nonylphenoxy polyethyleneoxyethanol, fluorocarbon esters, fluoroaliphatic polymeric esters, fluorinated esters, alkylphenoxy alkyleneoxides, cetyl trimethyl ammonium chloride, carboxymethylamylose, ethoxylated acetylene glycols, betaines, N-n-dodecyl-N,N-dimethylbetaine, dialkyl sulfosuccinate salts, alkylnaphthalenesulfonate salts, fatty acid salts, polyoxyethylene alkylethers, polyoxyethylene alkylallylethers, polyoxyethylene-polyoxypropylene block copolymers, alkylamine salts, quaternary ammonium salts, and mixtures thereof.

Examples of surfactants include anionic, cationic, amphoteric, and nonionic surfactants. Examples of surfactants include SURFYNOL, DYNOL, ZONYL, FLUORAD, and SILWET surfactants.

A surfactant may be used in an ink of this disclosure at a level of from about 0.001% to about 2% of the ink composition.

Examples of a dispersant include a polymer dispersant, a surfactant, hydrophilic-hydrophobic block copolymers, acrylic block copolymers, acrylate block copolymers, graft polymers, and mixtures thereof.

Examples of an emulsifier include a fatty acid derivative, an ethylene stearamide, an oxidized polyethylene wax, mineral oils, a polyoxyethylene alkyl phenol ether, a polyoxyethylene glycol ether block copolymer, a polyoxyethylene sorbitan fatty acid ester, a sorbitan, an alkyl siloxane polyether polymer, polyoxyethylene monostearates, polyoxyethylene monolaurates, polyoxyethylene monooleates, and mixtures thereof.

Examples of an anti-foaming agent include polysiloxanes, dimethylpolysiloxanes, dimethyl siloxanes, silicones, polyethers, octyl alcohol, organic esters, ethyleneoxide propyleneoxide copolymers, and mixtures thereof.

Examples of a dryer include aromatic sulfonic acids, aromatic carboxylic acids, phthalic acid, hydroxyisophthalic acid, N-phthaloylglycine, 2-pyrrolidone 5-carboxylic acid, and mixtures thereof.

Examples of a filler include metallic fillers, silver powder, silver flake, metal coated glass spheres, graphite powder, carbon black, conductive metal oxides, ethylene vinyl acetate polymers, and mixtures thereof.

Examples of a resin binder include acrylic resins, alkyd resins, vinyl resins, polyvinyl pyrrolidone, phenolic resins, ketone resins, aldehyde resins, polyvinyl butyral resin, amide resins, amino resins, acrylonitrile resins, cellulose resins, nitrocellulose resins, rubbers, fatty acids, epoxy resins, ethylene acrylic copolymers, fluoropolymers, gels, glycols, hydrocarbons, maleic resins, urea resins, natural rubbers, natural gums, phenolic resins, cresols, polyamides, polybutadienes, polyesters, polyolefins, polyurethanes, isocynates, polyols, thermoplastics, silicates, silicones, polystyrenes, and mixtures thereof.

Examples of thickeners and viscosity modifiers include conducting polymers, celluloses, urethanes, polyurethanes, styrene maleic anhydride copolymers, polyacrylates, polycarboxylic acids, carboxymethylcelluoses, hydroxyethylcelluloses, methylcelluloses, methyl hydroxyethyl celluloses, methyl hydroxypropyl celluloses, silicas, gellants, aluminates, titanates, gums, clays, waxes, polysaccharides, starches, and mixtures thereof.

Examples of anti-oxidants include phenolics, phosphites, phosphonites, thioesters, stearic acids, ascorbic acids, catechins, cholines, and mixtures thereof.

Examples of flow agents include waxes, celluloses, butyrates, surfactants, polyacrylates, and silicones.

Examples of a plasticizer include alkyl benzyl phthalates, butyl benzyl phthalates, dioctyl phthalates, diethyl phthalates, dimethyl phthalates, di-2-ethylhexy-adipates, diisobutyl phthalates, diisobutyl adipates, dicyclohexyl phthalates, glycerol tribenzoates, sucrose benzoates, polypropylene glycol dibenzoates, neopentyl glycol dibenzoates, dimethyl isophthalates, dibutyl phthalates, dibutyl sebacates, tri-n-hexyltrimellitates, and mixtures thereof.

Examples of a conductivity agent include lithium salts, lithium trifluoromethanesulfonates, lithium nitrates, dimethylamine hydrochlorides, diethylamine hydrochlorides, hydroxylamine hydrochlorides, and mixtures thereof.

Examples of a crystallization promoter include copper chalcogenides, alkali metal chalcogenides, alkali metal salts, alkaline earth metal salts, sodium chalcogenates, cadmium salts, cadmium sulfates, cadmium sulfides, cadmium selenides, cadmium tellurides, indium sulfides, indium selenides, indium tellurides, gallium sulfides, gallium selenides, gallium tellurides, molybdenum, molybdenum sulfides, molybdenum selenides, molybdenum tellurides, molybdenum-containing compounds, and mixtures thereof.

An ink may contain one or more components selected from the group of a conducting polymer, silver metal, silver selenide, silver sulfide, copper metal, indium metal, gallium metal, zinc metal, alkali metals, alkali metal salts, alkaline earth metal salts, sodium chalcogenates, calcium chalcogenates, cadmium sulfide, cadmium selenide, cadmium telluride, indium sulfide, indium selenide, indium telluride, gallium sulfide, gallium selenide, gallium telluride, zinc sulfide, zinc selenide, zinc telluride, copper sulfide, copper selenide, copper telluride, molybdenum sulfide, molybdenum selenide, molybdenum telluride, and mixtures of any of the foregoing.

An ink of this disclosure may contain particles of a metal, a conductive metal, or an oxide. Examples of metal and oxide particles include silica, alumina, titania, copper, iron, steel, aluminum and mixtures thereof.

In certain variations, an ink may contain a biocide, a sequestering agent, a chelator, a humectant, a coalescent, or a viscosity modifier.

In certain aspects, an ink of this disclosure may be formed as a solution, a suspension, a slurry, or a semisolid gel or paste. An ink may include one or more polymeric precursors solubilized in a carrier, or may be a solution of the polymeric precursors. In certain variations, a polymeric precursor may include particles or nanoparticles that can be suspended in a carrier, and may be a suspension or paint of the polymeric precursors. In certain embodiments, a polymeric precursor can be mixed with a minimal amount of a carrier, and may be a slurry or semisolid gel or paste of the polymeric precursor.

The viscosity of an ink of this disclosure can be from about 0.5 centipoises (cP) to about 50 cP, or from about 0.6 to about 30 cP, or from about 1 to about 15 cP, or from about 2 to about 12 cP.

The viscosity of an ink of this disclosure can be from about 20 cP to about $2 \times 10^6$ cP, or greater. The viscosity of an ink of this disclosure can be from about 20 cP to about $1 \times 10^6$ cP, or from about 200 cP to about 200,000 cP, or from about 200 cP to about 100,000 cP, or from about 200 cP to about 40,000 cP, or from about 200 cP to about 20,000 cP.

The viscosity of an ink of this disclosure can be about 1 cP, or about 2 cP, or about 5 cP, or about 20 cP, or about 100 cP, or about 500 cP, or about 1,000 cP, or about 5,000 cP, or about 10,000 cP, or about 20,000 cP, or about 30,000 cP, or about 40,000 cP.

In some embodiments, an ink may contain one or more components from the group of a surfactant, a dispersant, an emulsifier, an anti-foaming agent, a dryer, a filler, a resin binder, a thickener, a viscosity modifier, an anti-oxidant, a flow agent, a plasticizer, a conductivity agent, a crystallization promoter, an extender, a film conditioner, an adhesion promoter, and a dye. In certain variations, an ink may contain one or more compounds from the group of cadmium sulfide, cadmium selenide, cadmium telluride, zinc sulfide, zinc selenide, zinc telluride, copper sulfide, copper selenide, and copper telluride. In some aspects, an ink may contain particles of a metal, a conductive metal, or an oxide.

An ink may be made by dispersing one or more polymeric precursor compounds of this disclosure in one or more carriers to form a dispersion or solution.

A polymeric precursor ink composition can be prepared by dispersing one or more polymeric precursors in a solvent, and heating the solvent to dissolve or disperse the polymeric precursors. The polymeric precursors may have a concentration of from about 0.001% to about 99% (w/w), or from about 0.001% to about 90%, or from about 0.1% to about 90%, or from about 0.1% to about 50%, or from about 0.1% to about 40%, or from about 0.1% to about 30%, or from about 0.1% to about 20%, or from about 0.1% to about 10% in the solution or dispersion.

An ink composition may further contain an additional indium-containing compound, or an additional gallium-containing compound. Examples of additional indium-containing compounds include $In(SeR)_3$, wherein R is alkyl or aryl. Examples of additional gallium-containing compounds include $Ga(SeR)_3$, wherein R is alkyl or aryl. For example, an ink may further contain $In(Se^nBu)_3$ or $Ga(Se^nBu)_3$, or mixtures thereof. In some embodiments, an ink may contain Na(ER), where E is S or Se and R is alkyl or aryl. In certain embodiments, an ink may contain $NaIn(ER)_4$, $NaGa(ER)_4$, $LiIn(ER)_4$, $LiGa(ER)_4$, $KIn(ER)_4$, or $KGa(ER)_4$, where E is S or Se and R is alkyl or aryl. In certain embodiments, an ink may contain Cu(ER). For these additional compounds, R is preferably $^nBu$, $^iBu$, $^sBu$, or Pr.

Processes for Films of Polymeric Precursors on Substrates

The polymeric precursors of this invention can be used to make photovoltaic materials by depositing a layer onto a substrate, where the layer contains one or more polymeric precursors. The deposited layer may be a film or a thin film. Substrates are described above.

As used herein, the terms "deposit," "depositing," and "deposition" refer to any method for placing a compound or composition onto a surface or substrate, including spraying, coating, and printing.

As used herein, the term "thin film" refers to a layer of atoms or molecules, or a composition layer on a substrate having a thickness of less than about 300 micrometers.

A deposited layer of this disclosure advantageously allows precise control of the stoichiometric ratios of certain atoms in the layer because the layer can be composed of a mixture of polymeric precursors.

The polymeric precursors of this invention, and compositions containing polymeric precursors, can be deposited onto a substrate using methods known in the art, as well as methods disclosed herein.

Examples of methods for depositing a polymeric precursor onto a surface or substrate include all forms of spraying, coating, and printing.

Solar cell layers can be made by depositing one or more polymeric precursors of this disclosure on a flexible substrate in a high throughput roll process. The depositing of polymeric precursors in a high throughput roll process can be done by spraying or coating a composition containing one or more polymeric precursors, or by printing an ink containing one or more polymeric precursors of this disclosure.

The depositing of compounds by spraying can be done at rates from about 10 nm to 3 micrometers per minute, or from 100 nm to 2 micrometers per minute.

Examples of methods for depositing a polymeric precursor onto a surface or substrate include spraying, spray coating, spray deposition, spray pyrolysis, and combinations thereof.

Examples of methods for printing using an ink of this disclosure include printing, screen printing, inkjet printing, aerosol jet printing, ink printing, jet printing, stamp/pad printing, transfer printing, pad printing, flexographic printing, gravure printing, contact printing, reverse printing, thermal printing, lithography, electrophotographic printing, and combinations thereof.

Examples of methods for depositing a polymeric precursor onto a surface or substrate include electrodepositing, electroplating, electroless plating, bath deposition, coating, dip coating, wet coating, spin coating, knife coating, roller coating, rod coating, slot die coating, meyerbar coating, lip direct coating, capillary coating, liquid deposition, solution deposition, layer-by-layer deposition, spin casting, and solution casting.

The polymeric precursors of this invention, and ink compositions containing polymeric precursors, can be deposited onto a substrate using methods known in the art, as well as methods disclosed herein.

A deposited layer of this disclosure advantageously allows precise control of the stoichiometric ratios of certain atoms in the layer because the layer can be composed of a polymeric precursor.

Examples of methods for depositing a polymeric precursor onto a surface or substrate include all forms of spraying, coating, and printing.

In some embodiments, a process for knife gap coating can be performed. The gap can be from 50 to 200 μm, or larger, and the knife speed can be from about 5 to 100 mm/s The substrate can be cleared using a stream from a nitrogen gas gun. Ink may be applied to the blade to fill the gap and make contact with the substrate. The ink is then coated in a single pass and the back surface is wiped or washed with toluene or organic solvent. The coated substrate can be transferred to a hot plate for conversion to a material. The conversion time can range from 40 seconds to 5 minutes or greater.

The coating and conversion steps are repeated to build up a desired film thickness. Thickness per pass can be from 75 to 150 nm, or from 10 to 3000 nm. The coated substrate is then annealed.

In certain embodiments, crack-free films with 500 nm or greater thickness per pass are achieved.

Examples of methods for depositing a polymeric precursor onto a surface or substrate include chemical vapor deposition, aerosol chemical vapor deposition, metal-organic chemical vapor deposition, organometallic chemical vapor deposition, plasma enhanced chemical vapor deposition, and combinations thereof.

In certain embodiments, a first polymeric precursor may be deposited onto a substrate, and subsequently a second polymeric precursor may be deposited onto the substrate. In certain embodiments, several different polymeric precursors may be deposited onto the substrate to create a layer.

In certain variations, different polymeric precursors may be deposited onto a substrate simultaneously, or sequentially, whether by spraying, coating, printing, or by other methods. The different polymeric precursors may be contacted or mixed before the depositing step, during the depositing step, or after the depositing step. The polymeric precursors can be contacted before, during, or after the step of transporting the polymeric precursors to the substrate surface.

The depositing of polymeric precursors, including by spraying, coating, and printing, can be done in a controlled or inert atmosphere, such as in dry nitrogen and other inert gas atmospheres, as well as in a partial vacuum atmosphere.

Processes for depositing, spraying, coating, or printing polymeric precursors can be done at various temperatures including from about −20° C. to about 650° C., or from about −20° C. to about 600° C., or from about −20° C. to about 400° C., or from about 20° C. to about 360° C., or from about 20° C. to about 300° C., or from about 20° C. to about 250° C.

Processes for making a solar cell involving a step of transforming a polymeric precursor compound into a material or semiconductor can be performed at various temperatures including from about 100° C. to about 650° C., or from about 150° C. to about 650° C., or from about 250° C. to about 650° C., or from about 300° C. to about 650° C., or from about 400° C. to about 650° C., or from about 300° C. to about 600° C., or from about 300° C. to about 550° C., or from about 300° C. to about 500° C., or from about 300° C. to about 450° C.

In certain aspects, depositing of polymeric precursors on a substrate can be done while the substrate is heated. In these variations, a thin-film material may be deposited or formed on the substrate.

In some embodiments, a step of converting a precursor to a material and a step of annealing can be done simultaneously. In general, a step of heating a precursor can be done before, during or after any step of depositing the precursor.

In some variations, a substrate can be cooled after a step of heating. In certain embodiments, a substrate can be cooled before, during, or after a step of depositing a precursor. A substrate may be cooled to return the substrate to a lower temperature, or to room temperature, or to an operating temperature of a deposition unit. Various coolants or cooling methods can be applied to cool a substrate.

The depositing of polymeric precursors on a substrate may be done with various apparatuses and devices known in art, as well as devices described herein.

In some variations, the depositing of polymeric precursors can be performed using a spray nozzle with adjustable nozzle dimensions to provide a uniform spray composition and distribution.

Embodiments of this disclosure further contemplate articles made by depositing a layer onto a substrate, where the layer contains one or more polymeric precursors. The article may be a substrate having a layer of a film, or a thin film, which is deposited, sprayed, coated, or printed onto the substrate. In certain variations, an article may have a substrate printed with a polymeric precursor ink, where the ink is printed in a pattern on the substrate.

For spin coating, an ink can be made by dissolving a polymeric precursor in a solvent in an inert atmosphere glove box. The ink can be passed through a syringe filter and deposited onto a Mo-coated glass substrate in a quantity sufficient to cover the entire substrate surface. The substrate can be then spun at 1200 rpm for about 60 s. The coated substrate can be allowed to dry at room temperature, typically for 1-2 minutes. The coated substrate can be heated in a furnace for conversion of the polymeric molecular precursor film to a semiconductor thin film material.

After conversion of the coated substrate, another precursor coating may be applied to the thin film material on the substrate by repeating the procedure above. This process can be repeated to prepare additional thin film material layers on the substrate.

After the last thin film material layer is prepared on the substrate, the substrate can be annealed. The annealing process may include a step of heating the coated substrate at a temperature sufficient to convert the coating on the substrate to a thin film photovoltaic material. The annealing process may include a step of heating the coated substrate at 400° C. for 60 min (30° C./min ramp), or 500° C. for 30 min (30° C./min ramp), or 550° C. for 60 min (10° C./min ramp), or 550° C. for 20 min (30° C./min ramp). The annealing process may include an additional step of heating the coated substrate at 550° C. for 10 min (30° C./min ramp), or 525° C. for 10 min (20° C./s ramp), or 400° C. for 5 min (40° C./s ramp).

Methods and Compositions for Photovoltaic Absorber Layers

Molecular precursor and polymeric precursor inks may be used to grow photovoltaic absorber layers, or other material, by using multiple inks with different compositions. In some embodiments, large grains can be achieved by using multiple inks.

The use of multiple inks allows a wide range of compositions to be manufactured in a controlled fashion. For example, many kinds of CIGS compositions can be made, and many compositions in CIGS phase space can be made.

In some embodiments, a two ink system is used.

In further embodiments, any number of inks can be used.

In certain embodiments, a first ink may contain a molecular precursor or polymeric precursor with a predetermined composition. For example, the first ink can have a predetermined composition that is enriched in Cu.

Examples of a material made with a Cu-enriched ink include $Cu_{>1.0}In_xGa_{1-x}Se_{\sim 2.0-2.4}$, where x=0-1, and Cu may be from 1.05-1.30. In some embodiments, the first can have the stoichiometry $Cu_{>1.0}In_xGa_{1-x}Se_{\sim 2.0-2.4}$, where x=0-1, and Cu may be from 1.05-1.30.

The first ink, when used by itself, could be used to generate a CIS, CGS, or CIGS material that is enriched in Cu.

A second ink or balance ink may contain a sufficient quantity and stoichiometry of atoms so that when the second ink is combined with the first ink, the combination provides a total composition and stoichiometry that is the desired amount.

For example, the second ink may contain a molecular precursor or polymeric precursor with a predetermined composition. For example, the second ink can have a predetermined composition that is deficient in Cu.

In some embodiments, the second ink may contain a Cu-containing molecule, an In-containing molecule, or a Ga-containing molecule. For example, the second ink can contain $Cu_{0.5}Ga_{1.0}Se_{<2}$, $Ga_{2.0}Se_{\sim3}$, $In_{2.0}Se_{\sim3}$, $In_{1.4}Ga_{0.6}Se_{\sim3}$, $Cu_{0.3}In_{1.0}Se_{<2}$, or $Cu_{0.5}In_{0.7}Ga_{0.3}Se_{<2}$.

Examples of a material made with the second ink include $Cu_{<1.0}In_xGa_{1-x}Se_{\sim2.0-2.4}$, where x=0-1, and Cu may be from 0-0.75. In some embodiments, the second ink may have the stoichiometry $Cu_{<1.0}In_xGa_{1-x}Se_{\sim2.0-2.4}$, where x=0-1, and Cu may be from 0-0.75.

Examples of a material or composition that can be made by the methods of this disclosure include $Cu_{1.05}In_{1.0}Se_{\sim2.0-2.4}$, $Cu_{1.1}In_{0.9}Ga_{0.1}Se_{\sim2.0-2.4}$, $Cu_{1.3}In_{1.0}Se_{\sim2.0-2.4}$, $Cu_{1.05}In_{1.0}Ga_{0.15}Se_{\sim2.0-2.4}$, $Cu_{1.1}In_{0.85}Ga_{0.15}Se_{\sim2.0-2.4}$, $Cu_{1.1}In_{1.0}Se_{\sim2.0-2.4}$, $Cu_{1.1}In_{0.7}Ga_{0.3}Se_{\sim2.0-2.4}$, and $Cu_{1.2}In_{0.80}Ga_{0.10}Se_{\sim2.0-2.4}$.

Finishing Stages for Solar Cells

A solar cell device can be made from a photovoltaic absorber layer on a substrate by carrying out various finishing steps.

In some embodiments, a finishing step includes a chemical bath treatment step. In a chemical bath treatment step, the photovoltaic absorber layer can be exposed to a buffer compound. Examples of a buffer compound include $In_2S_3$.

An additional finishing step is deposition of a buffer layer. A buffer layer of CdS can be made by chemical bath deposition.

Another finishing step is deposition of a TCO layer. The TCO layer can be made from Al:ZnO (AZO). The TCO layering step can include ZnO (intrinsic iZO).

A further finishing step is deposition of metal contacts on the TCO layer.

A solar cell can be finished by annealing in air, or in inert atmosphere.

As used herein, the term "back" of the solar cell or photovoltaic absorber layer refers to the surface of the photovoltaic absorber layer which is closer to the back contact of the solar cell. The term "front" of the solar cell or photovoltaic absorber layer refers to the surface of the photovoltaic absorber layer which is closer to the TCO layer of the solar cell.

Photovoltaic Devices

The polymeric precursors of this invention can be used to make photovoltaic materials and solar cells of high efficiency.

In some embodiments, the solar cell is a thin layer solar cell having a CIS, CIGS, AIS, AIGS, CAIS, CAIGS, CIGAS, AIGAS or CAIGAS absorber layer deposited or printed on a substrate.

Embodiments of this invention may provide improved efficiency for solar cells used for light to electricity conversion.

In some embodiments, a solar cell of this disclosure is a heterojunction device made with a CIS, CIGS, AIS, AIGS, CAIS, CAIGS, CIGAS, AIGAS or CAIGAS cell. The CIS, CIGS, AIS, AIGS, CAIS, CAIGS, CIGAS, AIGAS or CAIGAS layer may be used as a junction partner with a layer of, for example, cadmium sulfide, cadmium selenide, cadmium telluride, zinc sulfide, zinc selenide, or zinc telluride. The absorber layer may be adjacent to a layer of MgS, MgSe, MgTe, HgS, HgSe, HgTe, AlN, AlP, AlAs, AlSb, GaN, GaP, GaAs, GaSb, InN, InP, InAs, InSb, or combinations thereof.

In certain variations, a solar cell of this disclosure is a multijunction device made with one or more stacked solar cells.

As shown in FIG. 3, a solar cell device of this disclosure may have a substrate 10, an electrode layer 20, an absorber layer 30, a buffer layer 40, and a transparent conductive layer (TCO) 50. The substrate 10 may be metal, plastic, glass, or ceramic. The electrode layer 20 can be a molybdenum-containing layer. The absorber layer 30 may be a CIS, CIGS, AIS, AIGS, CAIS, CAIGS, CIGAS, AIGAS or CAIGAS layer. The buffer layer 40 may be a cadmium sulfide layer. The transparent conductive layer 50 can be an indium tin oxide layer or a doped zinc oxide layer.

A solar cell device of this disclosure may have a substrate, an electrode layer, an absorber layer, a buffer layer, an adhesion promoting layer, a junction partner layer, a transparent layer, a transparent electrode layer, a transparent conductive oxide layer, a transparent conductive polymer layer, a doped conductive polymer layer, an encapsulating layer, an anti-reflective layer, a protective layer, or a protective polymer layer. In certain variations, an absorber layer includes a plurality of absorber layers.

In certain variations, solar cells may be made by processes using polymeric precursor compounds and compositions of this invention that advantageously avoid additional sulfurization or selenization steps.

In certain variations, a solar cell device may have a molybdenum-containing layer, or an interfacial molybdenum-containing layer.

Examples of a protective polymer include silicon rubbers, butyryl plastics, ethylene vinyl acetates, and combinations thereof.

Substrates can be made of a flexible material which can be handled in a roll. The electrode layer may be a thin foil.

Absorber layers of this disclosure can be made by depositing or printing a composition containing nanoparticles onto a substrate, where the nanoparticles can be made with polymeric precursor compounds of this invention. In some processes, nanoparticles can be made with polymeric precursor compounds and deposited on a substrate. Deposited nanoparticles can subsequently be transformed by the application of heat or energy.

In some embodiments, the absorber layer may be formed from nanoparticles or semiconductor nanoparticles which have been deposited on a substrate and subsequently transformed by heat or energy.

In some embodiments, a thin film photovoltaic device may have a transparent conductor layer, a buffer layer, a p-type absorber layer, an electrode layer, and a substrate. The transparent conductor layer may be a transparent conductive oxide (TCO) layer such as a zinc oxide layer, or zinc oxide layer doped with aluminum, or a carbon nanotube layer, or a tin oxide layer, or a tin oxide layer doped with fluorine, or an indium tin oxide layer, or an indium tin oxide layer doped with fluorine, while the buffer layer can be cadmium sulfide, or cadmium sulfide and high resistivity zinc oxide. The p-type absorber layer can be a CIGS layer, and the electrode layer can be molybdenum. The transparent conductor layer can be up to about 0.5 micrometers in thickness. The buffer layer can also be a cadmium sulfide n-type junction partner layer. In some embodiments, the buffer layer may be a silicon dioxide, an aluminum oxide, a titanium dioxide, or a boron oxide.

Some examples of transparent conductive oxides are given in K. Ellmer et al., Transparent Conductive Zinc Oxide, Vol. 104, Springer Series in Materials Science (2008).

In some aspects, a solar cell can include a molybdenum selenide interface layer, which may be formed using various molybdenum-containing and selenium-containing compounds that can be added to an ink for printing, or deposited onto a substrate.

A thin film material photovoltaic absorber layer can be made with one or more polymeric precursors of this invention. For example, a polymeric precursor ink can be sprayed onto a stainless steel substrate using a spray pyrolysis unit in a glovebox in an inert atmosphere. The spray pyrolysis unit may have an ultrasonic nebulizer, precision flow meters for inert gas carrier, and a tubular quartz reactor in a furnace. The spray-coated substrate can be heated at a temperature of from about 25° C. to about 650° C. in an inert atmosphere, thereby producing a thin film material photovoltaic absorber layer.

In further examples, a thin film material photovoltaic absorber layer can be made by providing a polymeric precursor ink which is filtered with a 0.45 micron filter, or a 0.3 micron filter. The ink may be printed onto a polyethylene terephthalate substrate using a inkjet printer in a glovebox in an inert atmosphere. A film of about 0.1 to 5 microns thickness can be deposited on the substrate. The substrate can be removed and heated at a temperature of from about 100° C. to about 600° C., or from about 100° C. to about 650° C. in an inert atmosphere, thereby producing a thin film material photovoltaic absorber layer.

In some examples, a solar cell can be made by providing an electrode layer on a polyethylene terephthalate substrate. A thin film material photovoltaic absorber layer can be coated onto the electrode layer as described above. A buffer layer can be deposited onto the absorber layer. A transparent conductive oxide layer can be deposited onto the buffer layer, thereby forming an embodiment of a solar cell.

Methods for making a photovoltaic absorber layer on a substrate include providing one or more polymeric precursor compounds, providing a substrate, spraying the compounds onto the substrate, and heating the substrate at a temperature of from about 100° C. to about 600° C., or of from about 100° C. to about 650° C. in an inert atmosphere, thereby producing a photovoltaic absorber layer having a thickness of from 0.01 to 100 micrometers. The spraying can be done in spray coating, spray deposition, jet deposition, or spray pyrolysis. The substrate may be glass, metal, polymer, plastic, or silicon.

The photovoltaic absorber layer made by the methods of this disclosure may have an empirical formula $Cu_x(In_{1-y}Ga_y)_v(S_{1-z}Se_z)_w$, where x is from 0.8 to 0.95, y is from 0 to 0.5, and z is from 0 to 1, v is from 0.95 to 1.05, and w is from 1.8 to 2.2. In some embodiments, w is from 2.0 to 2.2. The photovoltaic absorber layer made by the methods of this disclosure may have an empirical formula empirical formula $Cu_xIn_y(S_{1-z}Se_z)_w$, where x is from 0.8 to 0.95, y is from 0.95 to 1.05, z is from 0 to 1, and w is from 1.8 to 2.2. Methods for making a photovoltaic absorber layer can include a step of sulfurization or selenization.

In certain variations, methods for making a photovoltaic absorber layer may include heating the compounds to a temperature of from about 20° C. to about 400° C. while depositing, spraying, coating, or printing the compounds onto the substrate.

Methods for making a photovoltaic absorber layer on a substrate include providing one or more polymeric precursor compounds, providing a substrate, depositing the compounds onto the substrate, and heating the substrate at a temperature of from about 100° C. to about 650° C., or from about 100° C. to about 600° C., or from about 100° C. to about 400° C., or from about 100° C. to about 300° C. in an inert atmosphere, thereby producing a photovoltaic absorber layer having a thickness of from 0.01 to 100 micrometers. The depositing can be done in electrodepositing, electroplating, electroless plating, bath deposition, liquid deposition, solution deposition, layer-by-layer deposition, spin casting, or solution casting. The substrate may be glass, metal, polymer, plastic, or silicon.

Methods for making a photovoltaic absorber layer on a substrate include providing one or more polymeric precursor inks, providing a substrate, printing the inks onto the substrate, and heating the substrate at a temperature of from about 100° C. to about 600° C., or from about 100° C. to about 650° C. in an inert atmosphere, thereby producing a photovoltaic absorber layer having a thickness of from 0.01 to 100 micrometers. The printing can be done in screen printing, inkjet printing, transfer printing, flexographic printing, or gravure printing. The substrate may be glass, metal, polymer, plastic, or silicon. The method may further include adding to the ink an additional indium-containing compound, such as $In(SeR)_3$, wherein R is alkyl or aryl.

In general, an ink composition for depositing, spraying, or printing may contain an additional indium-containing compound, or an additional gallium-containing compound. Examples of additional indium-containing compounds include $In(SeR)_3$, wherein R is alkyl or aryl. Examples of additional gallium-containing compounds include $Ga(SeR)_3$, wherein R is alkyl or aryl. For example, an ink may further contain $In(Se''Bu)_3$ or $Ga(Se''Bu)_3$, or mixtures thereof. In some embodiments, an ink may contain $Na(ER)$, where E is S or Se and R is alkyl or aryl. In certain embodiments, an ink may contain $NaIn(ER)_4$, $NaGa(ER)_4$, $LiIn(ER)_4$, $LiGa(ER)_4$, $KIn(ER)_4$, or $KGa(ER)_4$, where E is S or Se and R is alkyl or aryl.

Electrical Power Generation and Transmission

This disclosure contemplates methods for producing and delivering electrical power. A photovoltaic device of this invention can be used, for example, to convert solar light to electricity which can be provided to a commercial power grid.

As used herein, the term "solar cell" refers to individual solar cell as well as a solar cell array, which can combine a number of solar cells.

The solar cell devices of this disclosure can be manufactured in modular panels.

The power systems of this disclosure can be made in large or small scale, including power for a personal use, as well as on a megawatt scale for a public use.

An important feature of the solar cell devices and power systems of this disclosure is that they can be manufactured and used with low environmental impact.

A power system of this disclosure may utilize a solar cell on a movable mounting, which may be motorized to face the solar cell toward the light. Alternatively, a solar cell may be mounted on a fixed object in an optimal orientation.

Solar cells can be attached in panels in which various groups of cells are electrically connected in series and in parallel to provide suitable voltage and current characteristics.

Solar cells can be installed on rooftops, as well as outdoor, sunlighted surfaces of all kinds. Solar cells can be combined with various kinds of roofing materials such as roofing tiles or shingles.

A power system can include a solar cell array and a battery storage system. A power system may have a diode-containing circuit and a voltage-regulating circuit to prevent the battery storage system from draining through the solar cells or from being overcharged.

A power system can be used to provide power for lighting, electric vehicles, electric buses, electric airplanes, pumping water, desalinization of water, refrigeration, milling, manufacturing, and other uses.

Sources of Elements

Sources of silver include silver metal, Ag(I), silver nitrates, silver halides, silver chlorides, silver acetates, silver alkoxides, and mixtures thereof.

Sources of alkali metal ions include alkali metals, alkali metal salts, alkali metal halides, alkali metal nitrates, selenides including Na$_2$Se, Li$_2$Se, and K$_2$Se, as well as organometallic compounds such as alkyllithium compounds.

Sources of copper include copper metal, Cu(I), Cu(II), copper halides, copper chlorides, copper acetates, copper alkoxides, copper alkyls, copper diketonates, copper 2,2,6,6,-tetramethyl-3,5,-heptanedionate, copper 2,4-pentanedionate, copper hexafluoroacetylacetonate, copper acetylacetonate, copper dimethylaminoethoxide, copper ketoesters, and mixtures thereof.

Sources of indium include indium metal, trialkylindium, trisdialkylamineindium, indium halides, indium chlorides, dimethylindium chlorides, trimethylindium, indium acetylacetonates, indium hexafluoropentanedionates, indium methoxyethoxides, indium methyltrimethylacetylacetates, indium trifluoropentanedionates, and mixtures thereof.

Sources of gallium include gallium metal, trialkylgallium, trisdialkylamine gallium, gallium halides, gallium fluorides, gallium chlorides, gallium iodides, diethylgallium chlorides, gallium acetate, gallium 2,4-pentanedionate, gallium ethoxide, gallium 2,2,6,6,-tetramethylheptanedionate, trisdimethylaminogallium, and mixtures thereof.

Sources of aluminum include aluminum metal, trialkylaluminum, trisdialkylamine aluminum, aluminum halides, aluminum fluorides, aluminum chlorides, aluminum iodides, diethylaluminum chlorides, aluminum acetate, aluminum 2,4-pentanedionate, aluminum ethoxide, aluminum 2,2,6,6,-tetramethylheptanedionate, trisdimethylaminoaluminum, and mixtures thereof.

Some sources of gallium and indium are described in International Patent Publication No. WO2008057119.

Chemical Definitions

As used herein, the term atom percent, atom %, or at % refers to the amount of an atom with respect to the final material in which the atoms are incorporated. For example, "0.5 at % Na in CIGS" refers to an amount of sodium atoms equivalent to 0.5 atom percent of the atoms in the CIGS material.

As used herein, the term (X,Y) when referring to compounds or atoms indicates that either X or Y, or a combination thereof may be found in the formula. For example, (S,Se) indicates that atoms of either sulfur or selenium, or any combination thereof may be found. Further, using this notation the amount of each atom can be specified. For example, when appearing in the chemical formula of a molecule, the notation (0.75 In,0.25 Ga) indicates that the atom specified by the symbols in the parentheses is indium in 75% of the compounds and gallium in the remaining 25% of the compounds, regardless of the identity any other atoms in the compound. In the absence of a specified amount, the term (X,Y) refers to approximately equal amounts of X and Y.

The atoms S, Se, and Te of Group 16 are referred to as chalcogens.

As used herein, the letter "S" in CIGS, AIGS, CAIGS, CIGAS, AIGAS and CAIGAS refers to sulfur or selenium or both. The letter "C" in CIGS, CAIGS, CIGAS, and CAIGAS refers to copper. The letter "A" in AIGS, CAIGS, AIGAS and CAIGAS which appears before the letters I and G refers to silver. The letter "I" in CIGS, AIGS, CAIGS, CIGAS, AIGAS and CAIGAS refers to indium. The letter "G" in CIGS, AIGS, CAIGS, CIGAS, AIGAS and CAIGAS refers to gallium. The letter "A" in CIGAS, AIGAS and CAIGAS which appears after the letters I and G refers to aluminum.

CAIGAS therefore could also be represented as Cu/Ag/In/Ga/Al/S/Se.

As used herein, the terms CIGS, AIGS, and CAIGS include the variations C(I,G)S, A(I,G)S, and CA(I,G)S, respectively, and CIS, AIS, and CAIS, respectively, as well as CGS, AGS, and CAGS, respectively, unless described otherwise.

The terms CIGAS, AIGAS and CAIGAS include the variations C(I,G,A)S, A(I,G,A)S, and CA(I,G,A)S, respectively, and CIGS, AIGS, and CAIGS, respectively, as well as CGAS, AGAS, and CAGAS, respectively, unless described otherwise.

The term CAIGAS refers to variations in which either C or Silver is zero, for example, AIGAS and CIGAS, respectively, as well as variations in which Aluminum is zero, for example, CAIGS, AIGS, and CIGS.

As used herein, the term CIGS includes the terms CIGSSe and CIGSe, and these terms refer to compounds or materials containing copper/indium/gallium/sulfur/selenium, which may contain sulfur or selenium or both. The term AIGS includes the terms AIGSSe and AIGSe, and these terms refer to compounds or materials containing silver/indium/gallium/sulfur/selenium, which may contain sulfur or selenium or both. The term CAIGS includes the terms CAIGSSe and CAIGSe, and these terms refer to compounds or materials containing copper/silver/indium/gallium/sulfur/selenium, which may contain sulfur or selenium or both.

As used herein, the term "chalcogenide" refers to a compound containing one or more chalcogen atoms bonded to one or more metal atoms.

The term "alkyl" as used herein refers to a hydrocarbyl radical of a saturated aliphatic group, which can be a branched or unbranched, substituted or unsubstituted aliphatic group containing from 1 to 22 carbon atoms. This definition applies to the alkyl portion of other groups such as, for example, cycloalkyl, alkoxy, alkanoyl, aralkyl, and other groups defined below. The term "cycloalkyl" as used herein refers to a saturated, substituted or unsubstituted cyclic alkyl ring containing from 3 to 12 carbon atoms. As used herein, the term "C(1-5)alkyl" includes C(1)alkyl, C(2)alkyl, C(3)alkyl, C(4)alkyl, and C(5)alkyl. Likewise, the term "C(3-22)alkyl" includes C(1)alkyl, C(2)alkyl, C(3)alkyl, C(4)alkyl, C(5)alkyl, C(6)alkyl, C(7)alkyl, C(8)alkyl, C(9)alkyl, C(10)alkyl, C(11)alkyl, C(12)alkyl, C(13)alkyl, C(14)alkyl, C(15)alkyl, C(16)alkyl, C(17)alkyl, C(18)alkyl, C(19)alkyl, C(20)alkyl, C(21)alkyl, and C(22)alkyl.

As used herein, an alkyl group may be designated by a term such as Me (methyl), Et (ethyl), Pr (any propyl group), $^n$Pr (n-Pr, n-propyl), $^i$Pr (i-Pr, isopropyl), Bu (any butyl group), $^n$Bu (n-Bu, n-butyl), $^i$Bu (i-Bu, isobutyl), $^s$Bu (s-Bu, sec-butyl), and $^t$Bu (t-Bu, tert-butyl).

The term "alkenyl" as used herein refers to an unsaturated, branched or unbranched, substituted or unsubstituted alkyl or cycloalkyl having 2 to 22 carbon atoms and at least one carbon-carbon double bond. The term "alkynyl" as used herein refers to an unsaturated, branched or unbranched, substituted or unsubstituted alkyl or cycloalkyl having 2 to 22 carbon atoms and at least one carbon-carbon triple bond.

The term "alkoxy" as used herein refers to an alkyl, cycloalkyl, alkenyl, or alkynyl group covalently bonded to an oxygen atom. The term "alkanoyl" as used herein refers to —C(=O)-alkyl, which may alternatively be referred to as "acyl." The term "alkanoyloxy" as used herein refers to —O—C(=O)-alkyl groups. The term "alkylamino" as used herein refers to the group —NRR', where R and R' are each either hydrogen or alkyl, and at least one of R and R' is alkyl. Alkylamino includes groups such as piperidino wherein R and R' form a ring. The term "alkylaminoalkyl" refers to -alkyl-NRR'.

The term "aryl" as used herein refers to any stable monocyclic, bicyclic, or polycyclic carbon ring system of from 4 to 12 atoms in each ring, wherein at least one ring is aromatic.

Some examples of an aryl include phenyl, naphthyl, tetrahydro-naphthyl, indanyl, and biphenyl. Where an aryl substituent is bicyclic and one ring is non-aromatic, it is understood that attachment is to the aromatic ring. An aryl may be substituted or unsubstituted.

The term "heteroaryl" as used herein refers to any stable monocyclic, bicyclic, or polycyclic carbon ring system of from 4 to 12 atoms in each ring, wherein at least one ring is aromatic and contains from 1 to 4 heteroatoms selected from oxygen, nitrogen and sulfur. Phosphorous and selenium may be a heteroatom. Some examples of a heteroaryl include acridinyl, quinoxalinyl, pyrazolyl, indolyl, benzotriazolyl, furanyl, thienyl, benzothienyl, benzofuranyl, quinolinyl, isoquinolinyl, oxazolyl, isoxazolyl, pyrazinyl, pyridazinyl, pyridinyl, pyrimidinyl, pyrrolyl, and tetrahydroquinolinyl. A heteroaryl includes the N-oxide derivative of a nitrogen-containing heteroaryl.

The term "heterocycle" or "heterocyclyl" as used herein refers to an aromatic or nonaromatic ring system of from five to twenty-two atoms, wherein from 1 to 4 of the ring atoms are heteroatoms selected from oxygen, nitrogen, and sulfur. Phosphorous and selenium may be a heteroatom. Thus, a heterocycle may be a heteroaryl or a dihydro or tetrathydro version thereof.

The term "aroyl" as used herein refers to an aryl radical derived from an aromatic carboxylic acid, such as a substituted benzoic acid. The term "aralkyl" as used herein refers to an aryl group bonded to an alkyl group, for example, a benzyl group.

The term "carboxyl" as used herein represents a group of the formula —C(=O)OH or —C(=O)O⁻. The terms "carbonyl" and "acyl" as used herein refer to a group in which an oxygen atom is double-bonded to a carbon atom >C=O. The term "hydroxyl" as used herein refers to —OH or —O⁻. The term "nitrile" or "cyano" as used herein refers to —CN. The term "halogen" or "halo" refers to fluoro (—F), chloro (—Cl), bromo (—Br), and iodo (—I).

The term "substituted" as used herein refers to an atom having one or more substitutions or substituents which can be the same or different and may include a hydrogen substituent. Thus, the terms alkyl, cycloalkyl, alkenyl, alkynyl, alkoxy, alkanoyl, alkanoyloxy, alkylamino, alkylaminoalkyl, aryl, heteroaryl, heterocycle, aroyl, and aralkyl as used herein refer to groups which include substituted variations. Substituted variations include linear, branched, and cyclic variations, and groups having a substituent or substituents replacing one or more hydrogens attached to any carbon atom of the group. Substituents that may be attached to a carbon atom of the group include alkyl, cycloalkyl, alkenyl, alkynyl, alkoxy, alkanoyl, alkanoyloxy, alkylamino, alkylaminoalkyl, aryl, heteroaryl, heterocycle, aroyl, aralkyl, acyl, hydroxyl, cyano, halo, haloalkyl, amino, aminoacyl, alkylaminoacyl, acyloxy, aryloxy, aryloxyalkyl, mercapto, nitro, carbamyl, carbamoyl, and heterocycle. For example, the term ethyl includes without limitation —CH$_2$CH$_3$, —CHFCH$_3$, —CF$_2$CH$_3$, —CHFCH$_2$F, —CHFCHF$_2$, —CHFCF$_3$, —CF$_2$CH$_2$F, —CF$_2$CHF$_2$, —CF$_2$CF$_3$, and other variations as described above. In general, a substituent may itself be further substituted with any atom or group of atoms.

Some examples of a substituent for a substituted alkyl include halogen, hydroxyl, carbonyl, carboxyl, ester, aldehyde, carboxylate, formyl, ketone, thiocarbonyl, thioester, thioacetate, thioformate, selenocarbonyl, selenoester, selenoacetate, selenoformate, alkoxyl, phosphoryl, phosphonate, phosphinate, amino, amido, amidine, imino, cyano, nitro, azido, carbamato, sulfhydryl, alkylthio, sulfate, sulfonate, sulfamoyl, sulfonamido, sulfonyl, silyl, heterocyclyl, aryl, aralkyl, aromatic, and heteroaryl.

It will be understood that "substitution" or "substituted with" refers to such substitution that is in accordance with permitted valence of the substituted atom and the substituent. As used herein, the term "substituted" includes all permissible substituents.

In general, a compound may contain one or more chiral centers. Compounds containing one or more chiral centers may include those described as an "isomer," a "stereoisomer," a "diastereomer," an "enantiomer," an "optical isomer," or as a "racemic mixture." Conventions for stereochemical nomenclature, for example the stereoisomer naming rules of Cahn, Ingold and Prelog, as well as methods for the determination of stereochemistry and the separation of stereoisomers are known in the art. See, for example, Michael B. Smith and Jerry March, *March's Advanced Organic Chemistry*, 5th edition, 2001. The compounds and structures of this disclosure are meant to encompass all possible isomers, stereoisomers, diastereomers, enantiomers, and/or optical isomers that would be understood to exist for the specified compound or structure, including any mixture, racemic or otherwise, thereof.

This invention encompasses any and all tautomeric, solvated or unsolvated, hydrated or unhydrated forms, as well as any atom isotope forms of the compounds and compositions disclosed herein.

This invention encompasses any and all crystalline polymorphs or different crystalline forms of the compounds and compositions disclosed herein.

Additional Embodiments

All publications, references, patents, patent publications and patent applications cited herein are each hereby specifically incorporated by reference in their entirety for all purposes.

While this invention has been described in relation to certain embodiments, aspects, or variations, and many details have been set forth for purposes of illustration, it will be apparent to those skilled in the art that this invention includes additional embodiments, aspects, or variations, and that some of the details described herein may be varied considerably without departing from this invention. This invention includes such additional embodiments, aspects, and variations, and any modifications and equivalents thereof. In particular, this invention includes any combination of the features, terms, or elements of the various illustrative components and examples.

The use herein of the terms "a," "an," "the" and similar terms in describing the invention, and in the claims, are to be construed to include both the singular and the plural.

The terms "comprising," "having," "include," "including" and "containing" are to be construed as open-ended terms which mean, for example, "including, but not limited to." Thus, terms such as "comprising," "having," "include," "including" and "containing" are to be construed as being inclusive, not exclusive.

Recitation of a range of values herein refers individually to each and any separate value falling within the range as if it were individually recited herein, whether or not some of the values within the range are expressly recited. For example, the range "4 to 12" includes without limitation any whole, integer, fractional, or rational value greater than or equal to 4 and less than or equal to 12, as would be understood by those skilled in the art. Specific values employed herein will be understood as exemplary and not to limit the scope of the invention.

Recitation of a range of a number of atoms herein refers individually to each and any separate value falling within the range as if it were individually recited herein, whether or not some of the values within the range are expressly recited. For example, the term "C1-8" includes without limitation the species C1, C2, C3, C4, C5, C6, C7, and C8.

Definitions of technical terms provided herein should be construed to include without recitation those meanings associated with these terms known to those skilled in the art, and are not intended to limit the scope of the invention. Definitions of technical terms provided herein shall be construed to dominate over alternative definitions in the art or definitions which become incorporated herein by reference to the extent that the alternative definitions conflict with the definition provided herein.

The examples given herein, and the exemplary language used herein are solely for the purpose of illustration, and are not intended to limit the scope of the invention. All examples and lists of examples are understood to be non-limiting.

When a list of examples is given, such as a list of compounds, molecules or compositions suitable for this invention, it will be apparent to those skilled in the art that mixtures of the listed compounds, molecules or compositions may also be suitable.

EXAMPLES

Thermogravimetric analysis (TGA) was performed using a Q50 Thermogravimetric Analyzer (TA Instruments, New Castle, Del.). NMR data were recorded using a Varian 400 MHz spectrometer.

Example 1

A solar cell was made by the following process.

A first ink was prepared by dissolving the Cu-enriched CIGS polymeric precursor compound $\{Cu_{1.1}In_{0.7}Ga_{0.3}(Se^tBu)_{1.1}(Se''Bu)_{3.0}\}$ with 0.5 at % Na supplied via NaIn$(Se''Bu)_4$ in heptane, 50% polymeric precursor content, by weight, followed by dilution with cyclohexane to about 25% polymeric precursor content, by weight, in an inert atmosphere glove box. The resulting ink was filtered through a 0.2 μm PTFE syringe filter prior to use.

A second ink was made prepared by dissolving the Cu-deficient CIGS polymeric precursor compound $\{Cu_{0.85}In_{0.7}Ga_{0.3}(Se^tBu)_{0.85}(Se''Bu)_{3.0}\}$ with 0.5 at % Na supplied via NaIn$(Se''Bu)_4$ in heptane, 25% polymeric precursor content, by weight, in an inert atmosphere glove box. The resulting ink was filtered through a 0.2 μm PTFE syringe filter prior to use.

An 0.04 mL aliquot of the first ink was deposited onto a piece of 2 inch by 2 inch square Mo-coated sodalime glass substrate using a knife coater (RK Instruments) in an inert nitrogen atmosphere glove box with a knife speed of 10 mm/s. The wet substrate was transferred to a pre-heated 300° C. hot plate for 5 minutes to dry and convert the polymeric precursor to a Cu-enriched CIGS material. The resulting Cu-enriched CIGS film was annealed at 550° C. for 15 minutes in a pre-heated furnace.

An 0.04 mL aliquot of the second ink was deposited onto the Cu-enriched CIGS film on the substrate using the knife coater under the same conditions. The wet substrate was transferred to a pre-heated 300° C. hot plate for 5 minutes to dry and convert the polymeric precursor to a Cu-deficient CIGS material. Following this, 20 layers of the second ink were deposited and converted in a like manner. The substrate was then heated in a pre-heated furnace at 550° C. for 5 minutes while the Cu-deficient CIGS thin film on the substrate was exposed to Se vapor. The Cu-deficient CIGS thin film was exposed to Se vapor by placing the surface of the substrate in an enclosure, and generating Se vapor in the enclosure within the furnace. The resulting Cu-deficient CIGS thin film on the substrate had a thickness of about 1.5 μm.

The solar cell was finished by first treating the substrate with a chemical bath deposition (CBD) of $In_2Se_3$. 100 mL of an aqueous stock solution of 0.025 M $InCl_3$ and 100 mL of an aqueous stock solution of 0.5 M thioacetamide were diluted in 300 mL DI water and quickly transferred to a pre-heated 65° C. 500 mL CBD vessel. The substrate was quickly transferred to the CBD vessel and soaked for 15 min at 65° C. Substrates were then washed with water 3 times.

A buffer layer of CdS was made shortly thereafter by chemical bath deposition. The substrates were placed in a 500 mL CBD vessel and pre-heated to 65° C. 366 mL DI water and 62.5 mL ammonium hydroxide were added to the vessel. 50 mL of a stock solution of 0.015 M $CdSO_4$ and 25 mL of a stock solution of 1.5 M thiourea were added with stirring. The substrate was soaked for 16 min at 65° C. Substrates were then rinsed with DI water and 2-propanol, and blown dry with nitrogen.

A TCO layer of Al:ZnO (AZO) was next deposited by sputtering in vacuum. A ZnO (iZO) layer was also used. Metal contacts were deposited on the TCO layer by sputtering.

Figure 14:
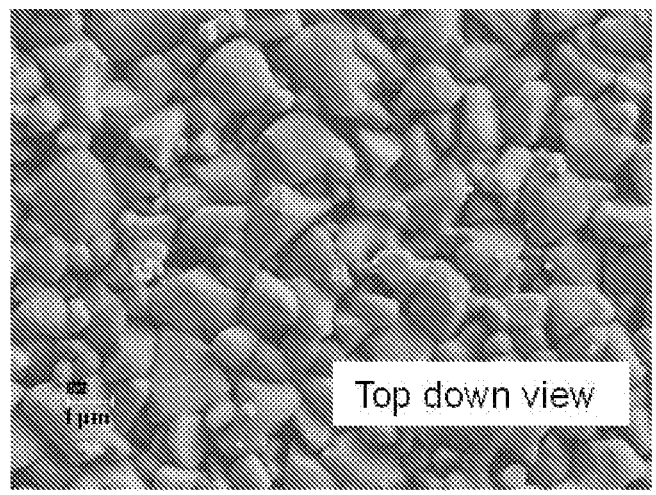
FIG. 14.

FIG. 14 shows a top view micrograph of the CIGS thin film of the solar cell. FIG. 14 illustrates superior grain size, morphology and overall density and dispersion.

Figure 15:
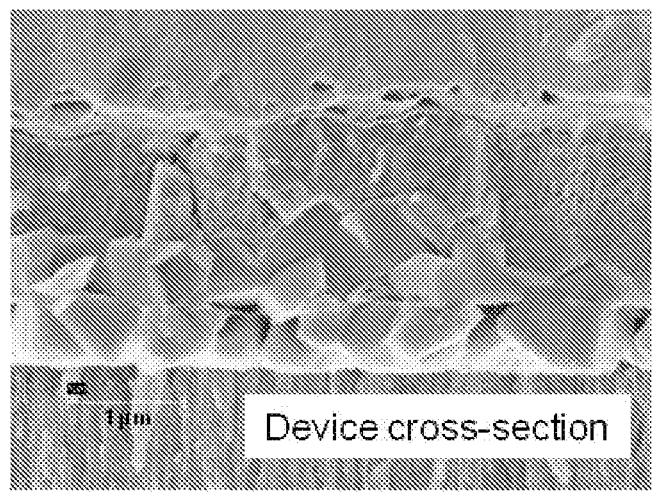
FIG. 15.

FIG. 15 shows a cross sectional view micrograph of the finished solar cell embodiment.

Figure 16:
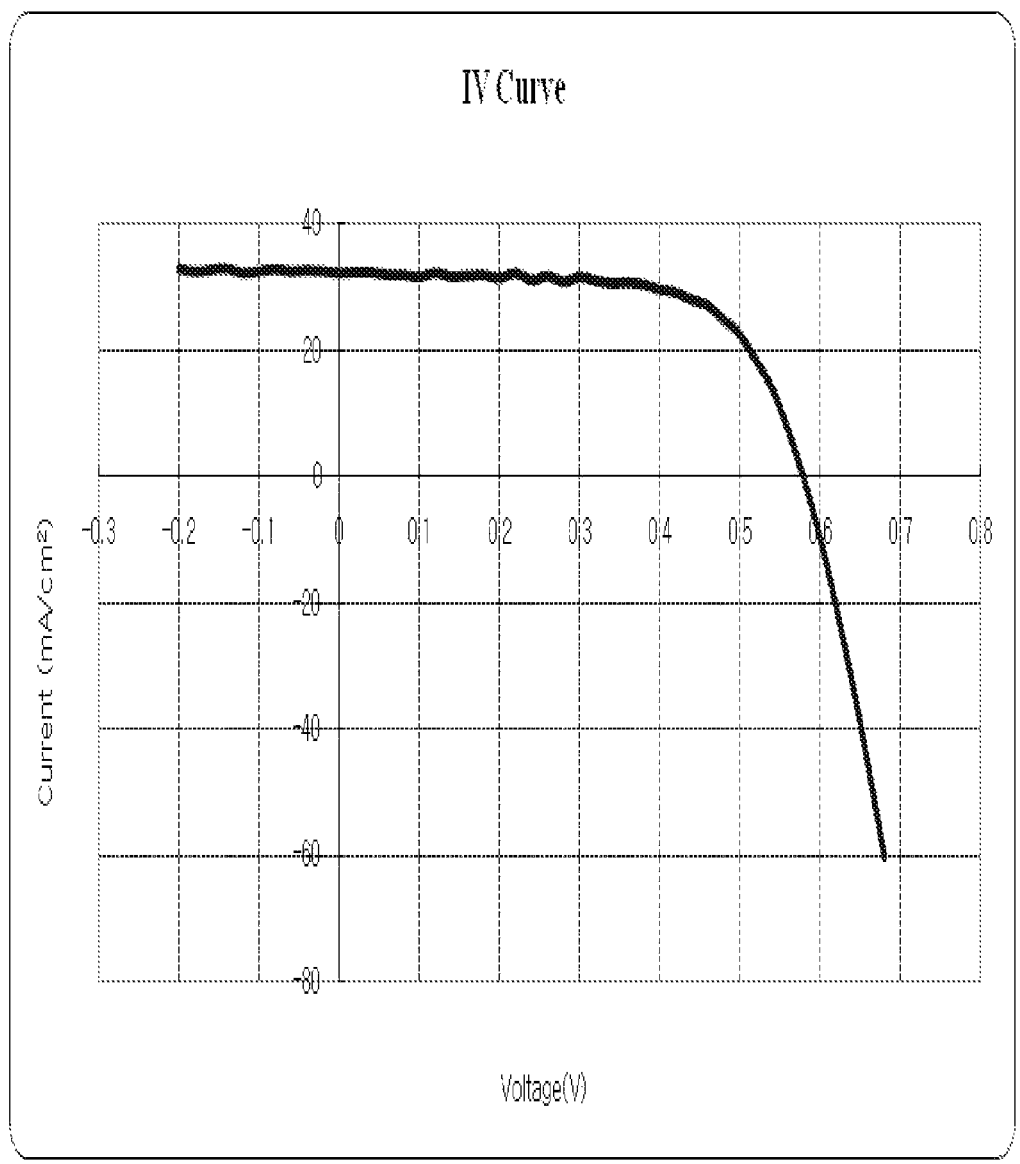
FIG. 16.

The solar cell current-voltage curve is shown in FIG. 16. The efficiency of the solar cell was 12.5%, and the I-V performance parameters are shown in Table 2. Measurements were made under simulated AM1.5G sunlight at 1000 W/m$^2$ and 25° C.

TABLE 2

Performance of CIGS thin film solar cell

| Parameter | Value |
|---|---|
| $V_{OC}$ | 0.579 V |
| $I_{SC}$ | 10.96 mA |
| $J_{SC}$ | 32.2 mA/cm$^2$ |
| Fill Factor | 66.9% |
| $I_{max}$ | 9.22 mA |
| $V_{max}$ | 0.46 V |
| $P_{max}$ | 4.24 mW |
| Efficiency | 12.5% |

Example 2

A solar cell was made by the following process.

A first ink was prepared by dissolving the Cu-enriched CIGS polymeric precursor compound $\{Cu_{1.1}In_{0.7}Ga_{0.3}(Se^tBu)_{1.1}(Se''Bu)_{3.0}\}$ with 0.5 at % Na supplied via NaIn$(Se''Bu)_4$ in heptane, 50% polymer content, by weight, followed by dilution with cyclohexane to about 25% polymer content, by weight, in an inert atmosphere glove box. The resulting ink was filtered through a 0.2 μm PTFE syringe filter prior to use.

A second ink was made prepared by dissolving the Cu-deficient CIGS polymeric precursor compound $\{Cu_{0.85}In_{0.7}Ga_{0.3}(Se^tBu)_{0.85}(Se''Bu)_{3.0}\}$ with 0.5 at % Na supplied via $NaIn(Se''Bu)_4$ in heptane, 25% polymer content, by weight, in an inert atmosphere glove box. The resulting ink was filtered through a 0.2 μm PTFE syringe filter prior to use.

An 0.04 mL aliquot of the first ink was deposited onto a piece of 2 inch by 2 inch square Mo-coated sodalime glass substrate using a knife coater (Global Instrument) in an inert nitrogen atmosphere glove box with a knife speed of 5 mm/s. The wet substrate was transferred to a pre-heated 300° C. hot plate for 5 minutes to dry and convert the polymer to a Cu-enriched CIGS thin film. The substrate was heated at 550° C. for 15 minutes in a pre-heated furnace.

An 0.04 mL aliquot of the second ink was deposited onto the Cu-enriched CIGS thin film with a knife speed of 20 mm/s. The wet polymer film was transferred to a pre-heated 300° C. hot plate for 5 minutes to dry and convert the polymer to a Cu-deficient CIGS thin film material. Following this, 13 additional layers of the second ink were deposited and converted in like manner. The substrate was then heated in a pre-heated furnace at 550° C. for 5 minutes while the Cu-deficient CIGS thin film on the substrate was exposed to Se vapor. The Cu-deficient CIGS thin film was exposed to Se vapor by enclosing the surface of the substrate in an enclosure, and generating Se vapor in the enclosure within the furnace. The resulting Cu-deficient CIGS thin film on the substrate had a thickness of about 1.5 μm.

The solar cell was finished as in the previous example.

Example 3

A solar cell was made by the following process.

A first ink was prepared by dissolving $\{Cu_{1.1}In_{0.7}Ga_{0.3}(Se^tBu)_{1.1}(Se''Bu)_{3.0}\}$ with 0.5 at % Na supplied via $NaIn(Se''Bu)_4$ in heptane, 25% polymer content, by weight, in an inert atmosphere glove box. The resulting ink was filtered through a 0.2 μm PTFE syringe filter prior to use.

A second ink was made prepared by dissolving $\{Cu_{0.85}In_{0.7}Ga_{0.3}(Se^tBu)_{0.85}(Se''Bu)_{3.0}\}$ with 0.5 at % Na supplied via $NaIn(Se''Bu)_4$ in heptane, 25% polymer content, by weight, in an inert atmosphere glove box. The resulting ink was filtered through a 0.2 μm PTFE syringe filter prior to use.

An 0.04 mL aliquot of the first ink was deposited onto a piece of 2 inch by 2 inch square Mo-coated sodalime glass substrate using a knife coater (RK Instruments) in an inert nitrogen atmosphere glove box with a knife speed of 20 mm/s. The wet polymer film on the substrate was transferred to a pre-heated 300° C. hot plate for 5 minutes to dry and convert the polymer to a Cu-enriched CIGS material. The resulting Cu-enriched CIGS film was annealed at 550° C. for 15 minutes in a pre-heated furnace.

An 0.04 mL aliquot of the second ink was deposited onto the above piece of 2 inch by 2 inch square Cu-enriched coated Mo/glass substrate using a knife coater under the same conditions. The wet polymer film on the substrate was transferred to a pre-heated 300° C. hot plate for 3 minutes to dry and convert the polymer to a Cu-deficient CIGS material. This deposition process (coat/convert) was repeated to give a total of 13 layers of the second ink and a CIGS material with overall Cu-deficient stoichiometry. The final deposition/conversion was followed by annealing in a pre-heated furnace at 550° C. for 5 minutes in the presence of Se vapor. The thin film was exposed to Se vapor by enclosing the surface of the substrate in an enclosure, and generating Se vapor in the enclosure within the furnace. The resulting Cu-deficient CIGS thin film on the substrate had a thickness of about 1.5 nm.

The solar cell was finished as in the previous example.

Example 4

Example processes 1-52 for making thin film photovoltaic cells are shown below in Tables 3-6. The layers were deposited and treated in the order Table 3, first, Table 4, second, Table 5, third, and Table 6, last.

In these examples, the layers were deposited by knife coating. The knife coating gap ranged from 5 to 500 microns, and was sometimes 100 microns. Knife coating speeds ranged from 1 to 100 mm/s, and sometimes ranged from 5 to 20 mm/s. Knife coating was performed at room temperature in an inert atmosphere glove box.

The number of layers deposited by knife coating can be from 1 to 30, or more.

For examples 1-8, 11, 13-42, 44 and 48-52, as shown in Table 3, one or more layers of an ink containing a CIGS polymeric precursor compound that was enriched in Cu were first deposited and treated directly on 25 $cm^2$ square pieces of a Mo/glass substrate. The CIGS polymeric precursor compound was dissolved in an ink with solvent heptane or cyclohexane/heptane. The concentration of the CIGS polymeric precursor compound in the ink was from 20 to 30 weight percent.

For examples 9-10, 12, 43 and 45-47, as shown in Table 3, one or more layers of an ink containing a CIGS polymeric precursor compound that was deficient in Cu were first deposited and treated directly on 25 $cm^2$ square pieces of a Mo/glass substrate.

Sodium ions were provided in certain inks of examples 1-52, as shown in Table 4. Except for the examples listed below, the concentration of sodium ions was 0.5 atom percent. Sodium ions were provided by dissolving the equivalent amount of $NaIn(Se''Bu)_4$ in the ink. For examples 4, 21, 27, 36, 37, and 50, as shown in Table 4, the concentration of sodium ions was 1.0, 0.1, 3.0, 0.1, 1.0, and 7.0 atom percent, respectively.

Each layer of the CIGS polymeric precursor compound deposited on the substrate was converted and annealed to a material before depositing the next layer.

Annealing was done in an inert atmosphere by placing the substrate in a preheated furnace.

As shown in Table 4, one or more layers of a CIGS polymeric precursor compound that was deficient in Cu were next deposited and treated directly on the corresponding substrates from Table 3.

For examples 9, 10, 12, 43 and 45-47, as shown in Table 4, annealing was done in the presence of selenium vapor in an enclosure.

As shown in Table 5, in some cases, either the corresponding substrate from Table 4 was annealed in the presence of selenium in an enclosure, or one or more layers of a CIGS polymeric precursor compound that was deficient in Cu were deposited and treated on the corresponding substrate from Table 4.

As shown in Table 6, in some cases, either the corresponding substrate from Table 5 was annealed in the presence of selenium in an enclosure, or one or more layers of a CIGS polymeric precursor compound that was deficient in Cu were deposited and treated on the corresponding substrate from Table 5. For example 32, as shown in Table 6, a layer of $In(S^sBu)_3$ was deposited and treated.

TABLE 3

Example processes for solar cells

| | Component | # of layers | Conv. T/t °C./min | Anneal T/t °C./min |
|---|---|---|---|---|
| 1 | $[Cu_{1.1}In_{0.7}Ga_{0.3}(Se''Bu)_3(Se^tBu)_{1.1}]_n$/Na | 1 | 300/5 | 550/15 |
| 2 | $[Cu_{1.1}In_{0.7}Ga_{0.3}(Se''Bu)_3(Se^tBu)_{1.1}]_n$/Na | 1 | 300/5 | 550/15 |
| 3 | $[Cu_{1.1}In_{0.7}Ga_{0.3}(Se''Bu)_3(Se^tBu)_{1.1}]_n$/Na | 1 | 300/5 | 550/15 |
| 4 | $[Cu_{1.1}In_{0.7}Ga_{0.3}(Se''Bu)_3(Se^tBu)_{1.1}]_n$/Na | 1 | 300/5 | 550/15 |
| 5 | $[Cu_{1.1}In_{0.7}Ga_{0.3}(Se''Bu)_3(Se^tBu)_{1.1}]_n$/Na | 1 | 300/5 | 550/15 |
| 6 | $[Cu_{1.1}In_{0.7}Ga_{0.3}(Se''Bu)_3(Se^tBu)_{1.1}]_n$/Na | 1 | 300/5 | 550/15 |
| 7 | $[Cu_{1.1}In_{0.7}Ga_{0.3}(Se''Bu)_3(Se^tBu)_{1.1}]_n$/Na | 1 | 300/5 | 550/15 |
| 8 | $[Cu_{1.1}In_{0.7}Ga_{0.3}(Se''Bu)_3(Se^tBu)_{1.1}]_n$/Na | 1 | 300/5 | 550/15 |
| 9 | $[Cu_{0.85}In_{0.7}Ga_{0.3}(Se''Bu)_3(Se^tBu)_{0.9}]_n$/Na | 20 | 300/5 | N/A |
| 10 | $[Cu_{0.85}In_{0.7}Ga_{0.3}(Se''Bu)_3(Se^tBu)_{0.9}]_n$/Na | 20 | 300/5 | N/A |
| 11 | $[Cu_{1.1}In_{0.7}Ga_{0.3}(Se''Bu)_3(Se^tBu)_{1.1}]_n$/Na | 1 | 300/5 | 550/15 |
| 12 | $[Cu_{0.85}In_{0.7}Ga_{0.3}(Se''Bu)_3(Se^tBu)_{0.9}]_n$/Na | 20 | 300/2 | N/A |
| 13 | $[Cu_{1.1}In_{0.7}Ga_{0.3}(Se''Bu)_3(Se^tBu)_{1.1}]_n$/Na | 1 | 300/5 | 550/15 |
| 14 | $[Cu_{1.1}In_{0.7}Ga_{0.3}(Se''Bu)_3(Se^tBu)_{1.1}]_n$/Na | 1 | 300/5 | 550/15 |
| 15 | $[Cu_{1.1}In_{0.7}Ga_{0.3}(Se''Bu)_3(Se^tBu)_{1.1}]_n$/Na | 2 | 300/5 | 550/15 |
| 16 | $[Cu_{1.1}In_{0.7}Ga_{0.3}(Se''Bu)_3(Se^tBu)_{1.1}]_n$/Na | 1 | 300/5 | 550/15 |
| 17 | $[Cu_{1.1}In_{0.7}Ga_{0.3}(Se''Bu)_3(Se^tBu)_{1.1}]_n$/Na | 1 | 300/5 | 550/15 |
| 18 | $[Cu_{1.1}In_{0.7}Ga_{0.3}(Se''Bu)_3(Se^tBu)_{1.1}]_n$/Na | 1 | 300/5 | 550/15 |
| 19 | $[Cu_{1.1}In_{0.7}Ga_{0.3}(Se''Bu)_3(Se^tBu)_{1.1}]_n$/Na | 1 | 300/5 | 550/15 |
| 20 | $[Cu_{1.1}In_{0.7}Ga_{0.3}(Se''Bu)_3(Se^tBu)_{1.1}]_n$/Na | 1 | 300/5 | 550/15 |
| 21 | $[Cu_{1.1}In_{0.7}Ga_{0.3}(Se''Bu)_3(Se^tBu)_{1.1}]_n$/Na | 1 | 300/5 | 550/15 |
| 22 | $[Cu_{1.1}In_{0.7}Ga_{0.3}(Se''Bu)_3(Se^tBu)_{1.1}]_n$/Na | 1 | 300/5 | 550/15 |
| 23 | $[Cu_{1.1}In_{0.7}Ga_{0.3}(Se''Bu)_3(Se^tBu)_{1.1}]_n$/Na | 1 | 300/5 | 550/15 |
| 24 | $[Cu_{1.1}In_{0.7}Ga_{0.3}(Se''Bu)_3(Se^tBu)_{1.1}]_n$/Na | 1 | 300/5 | 550/15 |
| 25 | $[Cu_{1.1}In_{0.7}Ga_{0.3}(Se''Bu)_3(Se^tBu)_{1.1}]_n$/Na | 1 | 300/5 | 550/15 |
| 26 | $[Cu_{1.1}In_{0.7}Ga_{0.3}(Se''Bu)_3(Se^tBu)_{1.1}]_n$/Na | 1 | 300/5 | 550/15 |
| 27 | $[Cu_{1.1}In_{0.7}Ga_{0.3}(Se''Bu)_3(Se^tBu)_{1.1}]_n$/Na | 1 | 300/5 | 550/15 |
| 28 | $[Cu_{1.1}In_{0.7}Ga_{0.3}(Se''Bu)_3(Se^tBu)_{1.1}]_n$/Na | 1 | 300/5 | 550/15 |
| 29 | $[Cu_{1.1}In_{0.7}Ga_{0.3}(Se''Bu)_3(Se^tBu)_{1.1}]_n$/Na | 1 | 300/5 | 550/15 |
| 30 | $[Cu_{1.1}In_{0.7}Ga_{0.3}(Se''Bu)_3(Se^tBu)_{1.1}]_n$/Na | 1 | 300/5 | 550/15 |
| 31 | $[Cu_{1.1}In_{0.7}Ga_{0.3}(Se''Bu)_3(Se^tBu)_{1.1}]_n$/Na | 1 | 300/5 | 550/15 |
| 32 | $[Cu_{1.1}In_{0.7}Ga_{0.3}(Se''Bu)_3(Se^tBu)_{1.1}]_n$/Na | 1 | 300/5 | 550/15 |
| 33 | $[Cu_{1.1}In_{0.7}Ga_{0.3}(Se''Bu)_3(Se^tBu)_{1.1}]_n$/Na | 1 | 300/5 | 550/15 |
| 34 | $[Cu_{1.1}In_{0.7}Ga_{0.3}(Se''Bu)_3(Se^tBu)_{1.1}]_n$/Na | 1 | 300/5 | 550/15 |
| 35 | $[Cu_{1.1}In_{0.7}Ga_{0.3}(Se''Bu)_3(Se^tBu)_{1.1}]_n$/Na | 1 | 300/5 | 550/15 |
| 36 | $[Cu_{1.1}In_{0.7}Ga_{0.3}(Se''Bu)_3(Se^tBu)_{1.1}]_n$/Na | 1 | 300/5 | 550/15 |
| 37 | $[Cu_{1.1}In_{0.7}Ga_{0.3}(Se''Bu)_3(Se^tBu)_{1.1}]_n$/Na | 1 | 300/5 | 550/15 |
| 38 | $[Cu_{1.1}In_{0.7}Ga_{0.3}(Se''Bu)_3(Se^tBu)_{1.1}]_n$/Na | 1 | 300/5 | 550/15 |
| 39 | $[Cu_{1.1}In_{0.7}Ga_{0.3}(Se''Bu)_3(Se^tBu)_{1.1}]_n$/Na | 1 | 300/5 | 550/15 |
| 40 | $[Cu_{1.1}In_{0.7}Ga_{0.3}(Se''Bu)_3(Se^tBu)_{1.1}]_n$/Na | 1 | 300/5 | 550/15 |
| 41 | $[Cu_{1.1}In_{0.7}Ga_{0.3}(Se''Bu)_3(Se^tBu)_{1.1}]_n$/Na | 1 | 300/5 | 550/15 |
| 42 | $[Cu_{1.1}In_{0.7}Ga_{0.3}(Se''Bu)_3(Se^tBu)_{1.1}]_n$/Na | 1 | 300/5 | 550/15 |
| 43 | $[Cu_{0.85}In_{0.70}Ga_{0.30}(Se''Bu)_3(Se^tBu)_{0.9}]_n$/Na | 14 | 300/5 | N/A |
| 44 | $[Cu_{1.1}In_{0.7}Ga_{0.3}(Se''Bu)_3(Se^tBu)_{1.1}]_n$/Na | 1 | 300/5 | 550/15 |
| 45 | $[Cu_{0.85}In_{0.70}Ga_{0.30}(Se''Bu)_3(Se^tBu)_{0.9}]_n$/Na | 14 | 300/5 | N/A |
| 46 | $[Cu_{0.85}In_{0.70}Ga_{0.30}(Se''Bu)_3(Se^tBu)_{0.9}]_n$/Na | 14 | 300/1 | 300/14 |
| 47 | $[Cu_{0.85}In_{0.70}Ga_{0.30}(Se''Bu)_3(Se^tBu)_{0.9}]_n$/Na | 14 | 300/1 | N/A |
| 48 | $[Cu_{1.1}In_{0.7}Ga_{0.3}(Se''Bu)_3(Se^tBu)_{1.1}]_n$/Na | 1 | 300/5 | 550/15 |
| 49 | $[Cu_{1.1}In_{0.7}Ga_{0.3}(Se''Bu)_3(Se^tBu)_{1.1}]_n$/Na | 1 | 300/5 | 550/15 |
| 50 | $[Cu_{1.1}In_{0.7}Ga_{0.3}(Se''Bu)_3(Se^tBu)_{1.1}]_n$/Na | 1 | 300/5 | 550/15 |
| 51 | $[Cu_{1.1}In_{0.7}Ga_{0.3}(Se''Bu)_3(Se^tBu)_{1.1}]_n$/Na | 1 | 300/5 | 550/15 |
| 52 | $[Cu_{1.1}In_{0.7}Ga_{0.3}(Se''Bu)_3(Se^tBu)_{1.1}]_n$/Na | 1 | 300/5 | 550/15 |

TABLE 4

Example processes for solar cells

| | Component | # of layers | Conv. T/t °C./min | Anneal T/t °C./min |
|---|---|---|---|---|
| 1 | $[Cu_{0.9}In_{0.7}Ga_{0.3}(Se''Bu)_3(Se^tBu)_{0.9}]_n$/Na | 20 | 300/5 | N/A |
| 2 | $[Cu_{0.9}In_{0.7}Ga_{0.3}(Se''Bu)_3(Se^tBu)_{0.9}]_n$/Na | 20 | 300/5 | 450/5 |
| 3 | $[Cu_{0.85}In_{0.7}Ga_{0.3}(Se''Bu)_3(Se^tBu)_{0.9}]_n$/Na | 20 | 300/5 | N/A |
| 4 | $[Cu_{0.9}In_{0.7}Ga_{0.3}(Se''Bu)_3(Se^tBu)_{0.9}]_n$/Na | 20 | 300/5 | N/A |
| 5 | $[Cu_{0.80}In_{0.7}Ga_{0.3}(Se''Bu)_3(Se^tBu)_{0.9}]_n$/Na | 20 | 300/5 | N/A |
| 6 | $[Cu_{0.85}In_{0.7}Ga_{0.3}(Se''Bu)_3(Se^tBu)_{0.9}]_n$/Na | 20 | 300/40s | N/A |
| 7 | $[Cu_{0.85}In_{0.7}Ga_{0.3}(Se''Bu)_3(Se^tBu)_{0.9}]_n$/Na | 20 | 300/5 | N/A |
| 8 | $[Cu_{0.85}In_{0.7}Ga_{0.3}(Se''Bu)_3(Se^tBu)_{0.9}]_n$/Na | 20 | 300/5 | N/A |
| 9 | Se (enclosure) | 1 | 190/5 | N/A |
| 10 | Se (enclosure) | 1 | 190/5 | 525/5 |
| 11 | $[Cu_{0.85}In_{0.7}Ga_{0.3}(Se''Bu)_3(Se^tBu)_{0.9}]_n$/Na | 20 | 300/2 | N/A |
| 12 | Se (enclosure) | 1 | 190/5 | 565/5 |
| 13 | $[Cu_{0.85}In_{0.7}Ga_{0.3}(Se''Bu)_3(Se^tBu)_{0.9}]_n$/Na | 20 | 300/5 | N/A |
| 14 | $[Cu_{0.85}In_{0.7}Ga_{0.3}(Se''Bu)_3(Se^tBu)_{0.9}]_n$/Na | 20 | 300/5 | N/A |
| 15 | $[Cu_{0.85}In_{0.7}Ga_{0.3}(Se''Bu)_3(Se^tBu)_{0.9}]_n$/Na | 19 | 300/5 | N/A |
| 16 | $[Cu_{0.85}In_{0.7}Ga_{0.3}(Se''Bu)_3(Se^tBu)_{0.9}]_n$/Na | 20 | 300/5 | N/A |
| 17 | $[Cu_{0.85}In_{0.7}Ga_{0.3}(Se''Bu)_3(Se^tBu)_{0.9}]_n$/Na | 20 | 300/5 | N/A |
| 18 | $[Cu_{0.85}In_{0.7}Ga_{0.3}(Se''Bu)_3(Se^tBu)_{0.9}]_n$/Na | 20 | 300/5 | N/A |
| 19 | $[Cu_{0.85}In_{0.7}Ga_{0.3}(Se''Bu)_3(Se^tBu)_{0.9}]_n$/Na | 20 | 300/5 | N/A |
| 20 | $[Cu_{0.9}In_{0.7}Ga_{0.3}(Se''Bu)_3(Se^tBu)_{0.9}]_n$/Na | 10 | 300/5 | N/A |
| 21 | $[Cu_{0.9}In_{0.7}Ga_{0.3}(Se''Bu)_3(Se^tBu)_{0.9}]_n$/Na | 10 | 300/5 | N/A |
| 22 | $[Cu_{0.9}In_{0.7}Ga_{0.3}(Se''Bu)_3(Se^tBu)_{0.9}]_n$/Na | 10 | 300/5 | N/A |
| 23 | $[Cu_{0.85}In_{0.7}Ga_{0.3}(Se''Bu)_3(Se^tBu)_{0.9}]_n$/Na | 16 | 300/5 | N/A |
| 24 | $[Cu_{0.85}In_{0.7}Ga_{0.3}(Se''Bu)_3(Se^tBu)_{0.9}]_n$/Na | 14 | 300/5 | N/A |
| 25 | $[Cu_{0.85}In_{0.7}Ga_{0.3}(Se''Bu)_3(Se^tBu)_{0.9}]_n$/Na | 14 | 300/5 | N/A |
| 26 | $[Cu_{0.85}In_{0.7}Ga_{0.3}(Se''Bu)_3(Se^tBu)_{0.9}]_n$/Na | 14 | 300/2 | N/A |
| 27 | $[Cu_{0.85}In_{0.7}Ga_{0.3}(Se''Bu)_3(Se^tBu)_{0.9}]_n$/Na | 1 | 300/5 | N/A |
| 28 | $[Cu_{0.85}In_{0.7}Ga_{0.3}(Se''Bu)_3(Se^tBu)_{0.9}]_n$/Na | 18 | 300/5 | N/A |
| 29 | $[Cu_{0.85}In_{0.60}Ga_{0.40}(Se''Bu)_3(Se^tBu)_{0.9}]_n$/Na | 14 | 300/2 | N/A |
| 30 | $[Cu_{0.85}In_{0.7}Ga_{0.3}(Se''Bu)_3(Se^tBu)_{0.9}]_n$/Na | 14 | 300/5 | N/A |
| 31 | $[Cu_{0.85}In_{0.7}Ga_{0.3}(Se''Bu)_3(Se^tBu)_{0.9}]_n$/Na | 14 | 300/5 | N/A |
| 32 | $[Cu_{0.85}In_{0.7}Ga_{0.3}(Se''Bu)_3(Se^tBu)_{0.9}]_n$/Na | 14 | 300/5 | N/A |
| 33 | $[Cu_{0.85}In_{0.7}Ga_{0.3}(Se''Bu)_3(Se^tBu)_{0.9}]_n$/Na | 14 | 300/5 | N/A |
| 34 | $[Cu_{0.85}In_{0.7}Ga_{0.3}(Se''Bu)_3(Se^tBu)_{0.9}]_n$/Na | 14 | 300/5 | N/A |
| 35 | $[Cu_{0.85}In_{0.7}Ga_{0.3}(Se''Bu)_3(Se^tBu)_{0.9}]_n$/Na | 14 | 300/5 | N/A |
| 36 | $[Cu_{0.9}In_{0.7}Ga_{0.3}(Se''Bu)_3(Se^tBu)_{0.9}]_n$/Na | 10 | 300/5 | N/A |
| 37 | $[Cu_{0.9}In_{0.7}Ga_{0.3}(Se''Bu)_3(Se^tBu)_{0.9}]_n$/Na | 10 | 300/5 | N/A |
| 38 | $[Cu_{0.9}In_{0.7}Ga_{0.3}(Se''Bu)_3(Se^tBu)_{0.9}]_n$/Na | 11 | 300/5 | N/A |
| 39 | $[Cu_{0.9}In_{0.85}Ga_{0.15}(Se''Bu)_3(Se^tBu)_{0.9}]_n$/Na | 18 | 300/5 | N/A |
| 40 | $[Cu_{0.85}In_{0.70}Ga_{0.30}(Se''Bu)_3(Se^tBu)_{0.9}]_n$/Na | 15 | 300/5 | N/A |
| 41 | $[Cu_{0.85}In_{0.70}Ga_{0.30}(Se''Bu)_3(Se^tBu)_{0.9}]_n$/Na | 18 | 300/2 | N/A |
| 42 | $[Cu_{0.85}In_{0.70}Ga_{0.30}(Se''Bu)_3(Se^tBu)_{0.9}]_n$/Na | 18 | 300/2 | N/A |
| 43 | Se (enclosure) | 1 | 190/5 | 525/5 |
| 44 | $[Cu_{0.85}Ga_{1.0}(Se''Bu)_3(Se^tBu)_{0.9}]_n$/Na | 5 | 300/2 | N/A |
| 45 | Se (enclosure) | 1 | 190/5 | 525/1 |
| 46 | Se (enclosure) | 1 | 190/5 | 525/5 |
| 47 | Se (enclosure) | 1 | 190/5 | 525/5 |
| 48 | $[Cu_{0.85}In_{0.70}Ga_{0.30}(Se''Bu)_3(Se^tBu)_{0.9}]_n$/Na | 18 | 300/5 | N/A |
| 49 | $[Cu_{0.85}In_{0.70}Ga_{0.30}(Se''Bu)_3(Se^tBu)_{0.9}]_n$/Na | 18 | 300/5 | N/A |
| 50 | $[Cu_{0.85}In_{0.70}Ga_{0.30}(Se''Bu)_3(Se^tBu)_{0.9}]_n$/Na | 1 | 300/5 | N/A |
| 51 | $[Cu_{0.85}In_{0.70}Ga_{0.30}(Se''Bu)_3(Se^tBu)_{0.9}]_n$/Na | 13 | 300/3 | N/A |
| 52 | $[Cu_{0.85}In_{0.70}Ga_{0.30}(Se''Bu)_3(Se^tBu)_{0.9}]_n$/Na | 13 | 300/3 | N/A |

TABLE 5

Example processes for solar cells

| | Component | # of layers | Conv. T/t °C./min | Anneal T/t °C./min |
|---|---|---|---|---|
| 1 | Se (enclosure) | 1 | 190/5 | 450/5 |
| 2 | Se (enclosure) | 1 | 190/5 | 575/2 |
| 3 | Se (enclosure) | 1 | 190/5 | 450/5 |
| 4 | Se (enclosure) | 1 | 190/5 | 450/5 |
| 5 | Se (enclosure) | 1 | 190/5 | 525/5 |
| 6 | Se (enclosure) | 1 | N/A | 525/5 |
| 7 | Se (enclosure) | 1 | N/A | 525/5 |
| 8 | Se (enclosure) | 1 | 190/5 | N/A |
| 9 | Se (enclosure) | 1 | N/A | 525/5 |
| 10 | — | — | — | — |
| 11 | Se (enclosure) | 1 | N/A | 525/5 |
| 12 | — | — | — | — |
| 13 | Se (enclosure) | 1 | 190/5 | 490/5 |
| 14 | Se (enclosure) | 1 | 190/5 | 525/5 |
| 15 | Se (enclosure) | 1 | 190/5 | 525/5 |
| 16 | Se (enclosure) | 1 | 190/5 | 525/5 |

TABLE 5-continued

Example processes for solar cells

| | Component | # of layers | Conv. T/t °C./min | Anneal T/t °C./min |
|---|---|---|---|---|
| 17 | Se (enclosure) | 1 | 190/5 | 525/5 |
| 18 | Se (enclosure) | 1 | 190/5 | 525/5 |
| 19 | Se (enclosure) | 2 | 190/5 | 525/5 |
| 20 | Se (enclosure) | 1 | 190/5 | 550/5 |
| 21 | Se (enclosure) | 1 | 190/5 | 550/5 |
| 22 | Se (enclosure) | 1 | 190/5 | 450/5 |
| 23 | Se (enclosure) | 1 | 190/5 | 525/5 |
| 24 | Se (enclosure) | 1 | 190/5 | 525/5 |
| 25 | Se (enclosure) | 1 | 190/5 | 525/5 |
| 26 | Se (enclosure) | 1 | 190/5 | 525/5 |
| 27 | $[Cu_{0.85}In_{0.7}Ga_{0.3}(Se''Bu)_3(Se^rBu)_{0.9}]_n$/Na | 14 | 300/5 | N/A |
| 28 | Se (enclosure) | 1 | 190/5 | 525/5 |
| 29 | Se (enclosure) | 1 | 190/5 | 525/5 |
| 30 | Se (enclosure) | 1 | 190/5 | 525/5 |
| 31 | Se (enclosure) | 1 | 190/5 | 525/5 |
| 32 | Se (enclosure) | 1 | 190/5 | 525/5 |
| 33 | Se (enclosure) | 1 | 190/5 | 525/5 |
| 34 | Se (enclosure) | 2 | 190/5 | 525/5 |
| 35 | Se (enclosure) | 2 | 190/5 | 525/5 |
| 36 | Se (enclosure) | 1 | 190/5 | 450/5 |
| 37 | Se (enclosure) | 1 | 190/5 | 450/5 |
| 38 | Se (enclosure) | 1 | 190/5 | 450/5 |
| 39 | Se (enclosure) | 1 | 190/5 | 525/5 |
| 40 | Se (enclosure) | 1 | 190/5 | 525/5 |
| 41 | Se (enclosure) | 1 | 190/5 | 525/5 |
| 42 | Se (enclosure) | 1 | 190/5 | 525/5 |
| 43 | — | — | — | — |
| 44 | $[Cu_{0.85}In_{0.70}Ga_{0.30}(Se''Bu)_3(Se^rBu)_{0.9}]_n$/Na | 9 | 300/2 | N/A |
| 45 | — | — | — | — |
| 46 | — | — | — | — |
| 47 | — | — | — | — |
| 48 | Se (enclosure) | 2 | 190/5 | 530/5 |
| 49 | Se (enclosure) | 2 | 190/5 | 535/5 |
| 50 | $[Cu_{0.85}In_{0.70}Ga_{0.30}(Se''Bu)_3(Se^rBu)_{0.9}]_n$ | 14 | 300/5 | N/A |
| 51 | Se (enclosure) | N/A | N/A | 525/5 |
| 52 | Se (enclosure) | N/A | N/A | 525/5 |

TABLE 6

Example processes for solar cells

| | Component | # of layers | Conv. T/t °C./min | Anneal T/t °C./min |
|---|---|---|---|---|
| 1 | Se (enclosure) | 1 | 190/5 | 575/2 |
| 2 | Se (enclosure) | 1 | 190/5 | 575/2 |
| 3 | Se (enclosure) | 1 | 190/5 | 575/2 |
| 4 | Se (enclosure) | 1 | 190/5 | 525/5 |
| 5 | | | | |
| 6 | | | | |
| 7 | | | | |
| 8 | Se (enclosure) | 1 | N/A | 525/5 |
| 9 | | | | |
| 10 | | | | |
| 11 | | | | |
| 12 | | | | |
| 13 | | | | |
| 14 | | | | |
| 15 | | | | |
| 16 | | | | |
| 17 | | | | |
| 18 | | | | |
| 19 | | | | |
| 20 | Se (enclosure) | 1 | 190/5 | 575/2 |
| 21 | Se (enclosure) | 1 | 190/5 | 575/2 |
| 22 | Se (enclosure) | 1 × 2 | 190/5 | 575/2 |
| 23 | | | | |
| 24 | $[Cu_{0.85}In_{0.7}Ga_{0.3}(Se''Bu)_3(Se^rBu)_{0.9}]_n$/Na | 2 | 300/5 | N/A |
| 25 | | | | |
| 26 | | | | |
| 27 | Se (enclosure) | 1 | 190/5 | 525/5 |
| 28 | | | | |
| 29 | | | | |
| 30 | Se (enclosure) | 1 | N/A | 525/5 |
| 31 | Se (enclosure) | 1 | N/A | 525/5 |
| 32 | In(S$^s$Bu)$_3$ | 1 | 300/5 | N/A |
| 33 | | | | |
| 34 | | | | |
| 35 | | | | |
| 36 | Se (enclosure) | 1 | 190/5 | 575/2 |
| 37 | Se (enclosure) | 1 | 190/5 | 575/2 |
| 38 | Se (enclosure) | 2 | 190/5 | 575/2 |
| 39 | | | | |
| 40 | $[Cu_{0.85}In_{0.70}Ga_{0.30}(Se''Bu)_3(Se^rBu)_{0.9}]_n$/Na | 3 | 300/5 | N/A |
| 41 | | | | |
| 42 | | | | |
| 43 | | | | |
| 44 | Se (enclosure) | 1 | 190/5 | 525/5 |
| 45 | | | | |
| 46 | | | | |
| 47 | | | | |
| 48 | | | | |
| 49 | | | | |
| 50 | Se (enclosure) | 2 | 190/5 | 525/5 |
| 51 | | | | |
| 52 | | | | |

Example 5

Photovoltaic absorber layer thin films 1-63 were prepared as shown below in Tables 7-10. The absorber layers were constructed by knife coating the layers described in Tables 7-10. The order in which the layers were applied to a substrate to construct the thin films 1-63 were: layers in Table 7 first, layers in Table 8 second, layers in Table 9 third, and layers in Table 10 fourth.

The knife coating gap ranged from 5 to 500 microns, and was sometimes 100 microns. Knife coating speeds ranged from 1 to 50 mm/s, and sometimes ranged from 5 to 10 mm/s Knife coating was performed at room temperature in a glove box.

For films 1-23, 26-53, 55, 56 and 58-63, as shown in Table 7, one or more layers of a CIGS polymeric precursor were first deposited and treated directly on 26 cm$^2$ square pieces of a Mo/glass substrate. The CIGS polymeric precursors were deposited using an ink with solvent cyclohexane/heptane. The concentration of polymeric precursor in the ink was about 20 to 30 weight percent. Sodium, if present, was provided in the ink at a concentration of about 0.5 atom percent by dissolving the equivalent amount of NaIn(Se''Bu)$_4$.

Each layer of polymeric precursor that was deposited was converted to a material before depositing the next layer. The polymeric precursor layer was converted to a material by heating the substrate on a hot plate. In some cases, the final layer was annealed.

For films 24, 25, 54 and 57, as shown in Table 7, six layers of Ga(Se''Bu)$_3$ or In(Se$^s$Bu)$_3$ were first deposited and treated directly on 26 cm$^2$ square pieces of a Mo/glass substrate.

Each layer of Ga(Se''Bu)$_3$ or In(Se$^s$Bu)$_3$ that was deposited was converted to a material before depositing the next layer. The layer was converted to a material by heating the substrate on a hot plate.

In Table 7, after all layers were deposited and converted to a material, in some cases the material was annealed in an inert atmosphere by placing the substrate in a preheated furnace or by using a rapid thermal processing system (Solaris 75 RTA, Surface Science Integration, El Mirage, Ariz.).

For films 1-17, 36, 54 and 60-63, as shown in Table 8, one or more layers of a CIGS polymeric precursor were next deposited and treated directly on the corresponding substrates from Table 7. In Table 8, after all layers were deposited and converted to a material, the material was annealed.

TABLE 7

Layered substrates for films

| | Component | # of layers | Conv. T/t °C./min | Anneal T/t °C./min |
|---|---|---|---|---|
| 1 | $[Cu_{1.1}In_{0.7}Ga_{0.3}(Se''Bu)_3(Se^tBu)_{1.1}]_n$ | 1 | 350/5 | 550/60 |
| 2 | $[Cu_{1.1}In_{0.5}Ga_{0.5}(Se''Bu)_3(Se^tBu)_{1.1}]_n$ | 1 | 350/5 | 550/2 |
| 3 | $[Cu_{1.1}In_{0.7}Ga_{0.3}(Se''Bu)_3(Se^tBu)_{1.1}]_n$ | 1 | 350/5 | 550/2 |
| 4 | $[Cu_{1.1}In_{0.7}Ga_{0.3}(Se''Bu)_3(Se^tBu)_{1.1}]_n$ | 1 | 350/5 | 550/2 |
| 5 | $[Cu_{1.1}In_{0.7}Ga_{0.3}(Se''Bu)_3(Se^tBu)_{1.1}]_n$ | 1 | 350/5 | 550/2 |
| 6 | $[Cu_{1.1}In_{0.7}Ga_{0.3}(Se''Bu)_3(Se^tBu)_{1.1}]_n$ | 1 | 350/5 | 550/2 |
| 7 | $[Cu_{1.1}In_{0.7}Ga_{0.3}(Se''Bu)_3(Se^tBu)_{1.1}]_n$ | 1 | 350/5 | 550/2 |
| 8 | $[Cu_{1.1}In_{0.7}Ga_{0.3}(Se''Bu)_3(Se^tBu)_{1.1}]_n$ | 1 | 350/5 | 550/2 |
| 9 | $[Cu_{1.1}In_{0.7}Ga_{0.3}(Se''Bu)_3(Se^tBu)_{1.1}]_n$ | 1 | 350/5 | 550/2 |
| 10 | $[Cu_{1.1}In_{0.7}Ga_{0.3}(Se''Bu)_3(Se^tBu)_{1.1}]_n$ | 1 | 350/5 | 550/2 |
| 11 | $[Cu_{1.1}In_{0.7}Ga_{0.3}(Se''Bu)_3(Se^tBu)_{1.1}]_n$ | 1 | 350/5 | 550/2 |
| 12 | $[Cu_{1.1}In_{0.7}Ga_{0.3}(Se''Bu)_3(Se^tBu)_{1.1}]_n$ | 1 | 300/5 | 550/2 |
| 13 | $[Cu_{1.1}In_{0.9}Ga_{0.1}(Se''Bu)_3(Se^tBu)_{1.1}]_n$/Na | 1 | 300/5 | 550/2 |
| 14 | $[Cu_{1.1}In_{0.9}Ga_{0.1}(Se''Bu)_3(Se^tBu)_{1.1}]_n$/Na | 1 | 300/5 | 550/2 |
| 15 | $[Cu_{1.1}In_{0.9}Ga_{0.1}(Se''Bu)_3(Se^tBu)_{1.1}]_n$/Na | 1 | 300/5 | 550/2 |
| 16 | $[Cu_{1.1}In_{0.9}Ga_{0.1}(Se''Bu)_3(Se^tBu)_{1.1}]_n$/Na | 1 | 300/5 | 550/2 |
| 17 | $[Cu_{1.1}In_{0.9}Ga_{0.1}(Se''Bu)_3(Se^tBu)_{1.1}]_n$/Na | 1 | 300/5 | 550/2 |
| 18 | $[Cu_{1.1}In_{0.9}Ga_{0.1}(Se''Bu)_3(Se^tBu)_{1.1}]_n$ | 25 | 350/5 | 550/60 |
| 19 | $[Cu_{1.1}In_{0.9}Ga_{0.1}(Se''Bu)_3(Se^tBu)_{1.1}]_n$ | 16 | 350/5 | 550/60 |
| 20 | $[Cu_{1.1}In_{0.9}Ga_{0.1}(Se''Bu)_3(Se^tBu)_{1.1}]_n$/Na | 25 | 350/5 | 550/60 |
| 21 | $[Cu_{1.1}In_{0.9}Ga_{0.1}(Se''Bu)_3(Se^tBu)_{1.1}]_n$/Na | 25 | 350/5 | 550/60 |
| 22 | $[Cu_{1.1}In_{0.9}Ga_{0.1}(Se''Bu)_3(Se^tBu)_{1.1}]_n$/Na | 25 | 350/5 | 550/60 |
| 23 | $[Cu_{1.1}In_{0.9}Ga_{0.1}(Se''Bu)_3(Se^tBu)_{1.1}]_n$/Na | 25 | 350/5 | |
| 24 | $Ga(Se''Bu)_3$ | 6 | 350/5 | |
| 25 | $Ga(Se''Bu)_3$ | 6 | 350/5 | |
| 26 | $[Cu_{1.0}In_{0.9}Ga_{0.1}(Se''Bu)_3(Se^tBu)_{1.0}]_n$/Na | 15 | 300/5 | 550/15 |
| 27 | $[Cu_{1.02}In_{0.9}Ga_{0.1}(Se''Bu)_3(Se^tBu)_{1.02}]_n$/Na | 15 | 300/5 | 550/15 |
| 28 | $[Cu_{1.05}In_{0.9}Ga_{0.1}(Se''Bu)_3(Se^tBu)_{1.05}]_n$/Na | 15 | 300/5 | 550/15 |
| 29 | $[Cu_{1.1}In_{0.9}Ga_{0.1}(Se''Bu)_3(Se^tBu)_{1.1}]_n$/Na | 15 | 350/5 | |
| 30 | $[Cu_{1.1}In_{0.9}Ga_{0.1}(Se''Bu)_3(Se^tBu)_{1.1}]_n$/Na | 15 | 350/5 | |
| 31 | $[Cu_{1.1}In_{0.9}Ga_{0.1}(Se''Bu)_3(Se^tBu)_{1.1}]_n$/Na | 15 | 350/5 | |
| 32 | $[Cu_{1.1}In_{0.9}Ga_{0.1}(Se''Bu)_3(Se^tBu)_{1.1}]_n$/Na | 15 | 350/5 | |
| 33 | $[Cu_{1.02}In_{0.9}Ga_{0.1}(Se''Bu)_3(Se^tBu)_{1.02}]_n$/Na | 25 | 350/5 | |
| 34 | $[Cu_{1.1}In_{0.7}Ga_{0.3}(Se''Bu)_3(Se^tBu)_{1.1}]_n$ | 25 | 350/5 | |
| 35 | $[Cu_{1.1}In_{0.9}Ga_{0.1}(Se''Bu)_3(Se^tBu)_{1.1}]_n$/Na | 10 | 300/5 | |
| 36 | $[Cu_{1.1}In_{0.7}Ga_{0.3}(Se''Bu)_3(Se^tBu)_{1.1}]_n$ | 1 | 350/5 | 550/2 |
| 37 | $[Cu_{1.1}In_{0.9}Ga_{0.1}(Se''Bu)_3(Se^tBu)_{1.1}]_n$/Na | 20 | 350/5 | |
| 38 | $[Cu_{1.1}In_{0.9}Ga_{0.1}(Se''Bu)_3(Se^tBu)_{1.1}]_n$/Na | 20 | 350/5 | |
| 39 | $[Cu_{1.02}In_{0.9}Ga_{0.1}(Se''Bu)_3(Se^tBu)_{1.02}]_n$/Na | 25 | 350/5 | |
| 40 | $[Cu_{1.05}In_{0.9}Ga_{0.1}(Se''Bu)_3(Se^tBu)_{1.05}]_n$/Na | 20 | 300/5 | |
| 41 | $[Cu_{1.1}In_{0.9}Ga_{0.1}(Se''Bu)_3(Se^tBu)_{1.1}]_n$ | 15 | 300/5 | |
| 42 | $[Cu_{1.1}In_{0.9}Ga_{0.1}(Se''Bu)_3(Se^tBu)_{1.1}]_n$/Na | 12 | 300/5 | |
| 43 | $[Cu_{1.1}In_{0.9}Ga_{0.1}(Se''Bu)_3(Se^tBu)_{1.1}]_n$ | 12 | 300/5 | |
| 44 | $[Cu_{1.1}In_{1.0}(Se''Bu)_3(Se^tBu)_{1.1}]_n$/Na | 20 | 300/5 | |
| 45 | $[Cu_{1.1}In_{0.7}Ga_{0.3}(Se''Bu)_3(Se^tBu)_{1.1}]_n$/Na | 20 | 300/5 | |
| 46 | $[Cu_{1.1}In_{1.0}(Se''Bu)_3(Se^tBu)_{1.1}]_n$/Na | 25 | 300/5 | |
| 46 | $[Cu_{1.1}In_{1.0}(Se''Bu)_3(Se^tBu)_{1.1}]_n$/Na | 25 | 300/5 | |
| 47 | $[Cu_{1.1}In_{0.7}Ga_{0.3}(Se''Bu)_3(Se^tBu)_{1.1}]_n$/Na | 15 | 300/5 | |
| 48 | $[Cu_{1.1}In_{0.7}Ga_{0.3}(Se''Bu)_3(Se^tBu)_{1.1}]_n$/Na | 15 | 300/5 | |
| 49 | $[Cu_{1.1}In_{0.7}Ga_{0.3}(Se''Bu)_3(Se^tBu)_{1.1}]_n$/Na | 20 | 300/5 | |
| 50 | $[Cu_{1.1}In_{0.7}Ga_{0.3}(Se''Bu)_3(Se^tBu)_{1.1}]_n$/Na | 20 | 300/5 | |
| 51 | $[Cu_{1.1}In_{0.9}Ga_{0.1}(Se''Bu)_3(Se^tBu)_{1.1}]_n$/Na | 10 | 300/5 | |
| 52 | $[Cu_{1.1}In_{0.9}Ga_{0.1}(Se''Bu)_3(Se^tBu)_{1.1}]_n$/Na | 10 | 300/5 | |
| 53 | $[Cu_{1.1}In_{0.9}Ga_{0.1}(Se''Bu)_3(Se^tBu)_{1.1}]_n$ | 10 | 300/5 | |
| 54 | $In(Se^sBu)_3$ | 6 | 400/5 | |
| 55 | $[Cu_{1.02}In_{0.9}Ga_{0.1}(Se''Bu)_3(Se^tBu)_{1.02}]_n$ | 15 | 300/5 | |
| 56 | $[Cu_{1.02}In_{0.9}Ga_{0.1}(Se''Bu)_3(Se^tBu)_{1.02}]_n$ | 15 | 300/5 | |
| 57 | $In(Se^sBu)_3$ | 6 | 450/5 | |
| 58 | $[Cu_{1.1}In_{0.9}Ga_{0.1}(Se''Bu)_3(Se^tBu)_{1.1}]_n$/Na | 20 | 300/5 | |

TABLE 7-continued

Layered substrates for films

| | Component | # of layers | Conv. T/t °C./min | Anneal T/t °C./min |
|---|---|---|---|---|
| 59 | $[Cu_{1.1}In_{0.9}Ga_{0.1}(Se''Bu)_3(Se^tBu)_{1.1}]_n$/Na | 20 | 300/5 | |
| 60 | $[Cu_{1.1}In_{0.9}Ga_{0.1}(Se''Bu)_3(Se^tBu)_{1.1}]_n$/Na | 5 | 300/5 | 550/15 |
| 61 | $[Cu_{1.1}In_{0.9}Ga_{0.1}(Se''Bu)_3(Se^tBu)_{1.1}]_n$ | 1 | 300/5 | 550/15 |
| 62 | $[Cu_{1.1}In_{0.7}Ga_{0.3}(Se''Bu)_3(Se^tBu)_{1.1}]_n$ | 1 | 300/5 | 550/15 |
| 63 | $[Cu_{1.1}In_{0.7}Ga_{0.3}(Se''Bu)_3(Se^tBu)_{1.1}]_n$ | 1 | 300/5 | 550/15 |

TABLE 8

Layered substrates for films

| | Component | # of layers | Conv. T/t °C./min | Anneal T/t °C./min |
|---|---|---|---|---|
| 1 | $[Cu_{0.9}In_{0.7}Ga_{0.3}(Se''Bu)_3(Se^tBu)_{0.9}]_n$ | 15 | 300/5 | 550/15 |
| 2 | $[Cu_{0.9}In_{0.7}Ga_{0.3}(Se''Bu)_3(Se^tBu)_{0.9}]_n$/Na | 15 | 300/5 | |
| 3 | $[Cu_{0.9}In_{0.7}Ga_{0.3}(Se''Bu)_3(Se^tBu)_{0.9}]_n$/Na | 15 | 300/5 | |
| 4 | $[Cu_{0.9}In_{0.7}Ga_{0.3}(Se''Bu)_3(Se^tBu)_{0.9}]_n$/Na | 15 | 300/5 | |
| 5 | $[Cu_{0.9}In_{0.7}Ga_{0.3}(Se''Bu)_3(Se^tBu)_{0.9}]_n$/Na | 15 | 300/5 | |
| 6 | $[Cu_{0.9}In_{0.7}Ga_{0.3}(Se''Bu)_3(Se^tBu)_{0.9}]_n$/Na | 15 | 300/5 | |
| 7 | $[Cu_{0.9}In_{0.7}Ga_{0.3}(Se''Bu)_3(Se^tBu)_{0.9}]_n$/Na | 15 | 300/5 | |
| 8 | $[Cu_{0.9}In_{0.7}Ga_{0.3}(Se''Bu)_3(Se^tBu)_{0.9}]_n$/Na | 15 | 300/5 | |
| 9 | $[Cu_{0.9}In_{0.7}Ga_{0.3}(Se''Bu)_3(Se^tBu)_{0.9}]_n$/Na | 15 | 300/5 | 550/2 |
| 10 | $[Cu_{0.9}In_{0.7}Ga_{0.3}(Se''Bu)_3(Se^tBu)_{0.9}]_n$/Na | 23 | 300/5 | |
| 11 | $[Cu_{0.9}In_{0.7}Ga_{0.3}(Se''Bu)_3(Se^tBu)_{0.9}]_n$/Na | 30 | 300/5 | |
| 12 | $[Cu_{0.9}In_{0.7}Ga_{0.3}(Se''Bu)_3(Se^tBu)_{0.9}]_n$/Na | 15 | 300/5 | 550/15 |
| 13 | $[Cu_{0.9}In_{1.0}(Se''Bu)_3(Se^tBu)_{0.9}]_n$/Na | 15 | 300/5 | 550/15 |
| 14 | $[Cu_{0.9}In_{1.0}(Se''Bu)_3(Se^tBu)_{0.9}]_n$/Na | 15 | 300/5 | |
| 15 | $[Cu_{0.9}In_{1.0}(Se''Bu)_3(Se^tBu)_{0.9}]_n$/Na | 13 | 300/5 | |
| 16 | $[Cu_{0.9}In_{1.0}(Se''Bu)_3(Se^tBu)_{0.9}]_n$/Na | 13 | 300/5 | 550/15 |
| 17 | $[Cu_{0.9}In_{1.0}(Se''Bu)_3(Se^tBu)_{0.9}]_n$/Na | 23 | 300/5 | 550/15 |
| 18 | $Ga(Se''Bu)_3$ | 4 | 400/5 | 550/60 |
| 19 | $Ga(Se''Bu)_3$ | 4 | 400/5 | 550/60 |
| 20 | $Ga(Se''Bu)_3$ | 4 | 350/5 | 550/60 |
| 21 | | | | |
| 22 | $Ga(Se''Bu)_3$ | 6 | 400/5 | |
| 23 | Se | 2 | 170/5 | 550/15 |
| 24 | Se | 1 | 170/5 | 550/15 |
| 25 | Se | 1 | 170/5 | |
| 26 | $Ga(Se''Bu)_3$ | 2 | 400/5 | 550/30 |
| 27 | $Ga(Se''Bu)_3$ | 2 | 400/5 | 550/30 |
| 28 | $Ga(Se''Bu)_3$ | 2 | 400/5 | 550/30 |
| 29 | Se | 2 | 170/5 | 550/1 |
| 30 | Se | 2 | 170/5 | 550/2 |
| 31 | Se | 2 | 170/5 | 550/5 |
| 32 | Se | 2 | 170/5 | 550/10 |
| 33 | Se | 2 | 170/5 | 550/2 |
| 34 | Se | 2 | 170/5 | 550/2 |
| 35 | Se | 2 | 170/5 | 550/10 |
| 36 | $[Cu_{1.1}In_{0.9}Ga_{0.1}(Se''Bu)_3(Se^tBu)_{1.1}]_n$/Na | 10 | 300/5 | 550/10 |
| 37 | Se | 2 | 170/5 | 550/15 |
| 38 | Se | 2 | 170/5 | 550/15 |
| 39 | Se | 5 | 170/5 | 550/15 |
| 40 | Se | 2 | 170/5 | 550/15 |
| 41 | Se | 2 | 170/5 | 550/15 |
| 42 | Se | 2 | 170/5 | 550/15 |
| 43 | Se | 2 | 170/5 | 550/15 |
| 44 | Se | 2 | 170/5 | 550/15 |
| 45 | Se | 1 | 170/5 | 550/5 |
| 46 | Se | 2 | 170/5 | 550/15 |
| 46 | Se | 2 | 170/5 | 550/15 |
| 47 | Se | 2 | 170/5 | 550/15 |
| 48 | Se | 2 | 170/5 | 550/15 |
| 49 | Se | 1 | 170/10 | 550/5 |
| 50 | Se | 1 | 225/5 | 550/5 |
| 51 | Se | 1 | 170/5 | 550/15 |
| 52 | Se | 1 | 170/5 | 550/15 |
| 53 | Se | 1 | 170/5 | 550/15 |
| 54 | $[Cu_{1.5}In_{1.0}(Se''Bu)_3(Se^tBu)_{1.5}]_n$ | 8 | 300/5 | 550/5 |

TABLE 8-continued

Layered substrates for films

| | Component | # of layers | Conv. T/t °C./min | Anneal T/t °C./min |
|---|---|---|---|---|
| 55 | Se | 4 | 170/5 | 550/2 |
| 56 | Se | 4 | 170/5 | 550/15 |
| 57 | Se | 2 | 170/5 | |
| 58 | Se (cover) | 1 | 170/5 | 525/2 |
| 59 | Se (cover) | 1 | 170/5 | 525/2 |
| 60 | $[Cu_{1.1}In_{0.9}Ga_{0.1}(Se''Bu)_3(Se^tBu)_{1.1}]_n$/Na | 10 | 300/5 | N/A |
| 61 | $[Cu_{0.9}In_{0.7}Ga_{0.3}(Se''Bu)_3(Se^tBu)_{0.9}]_n$/Na | 2 × 7 | 300/5 | |
| 62 | $[Cu_{0.9}In_{0.7}Ga_{0.3}(Se''Bu)_3(Se^tBu)_{0.9}]_n$/Na/$^tBu_2Se_2$ | 15 | UV/5 + 300/5 | 550/15 |
| 63 | $[Cu_{0.9}In_{0.7}Ga_{0.3}(Se''Bu)_3(Se^tBu)_{0.9}]_n$/Na/$^tBu_2Se_2$ | 15 | 300/5 | 550/15 |

TABLE 9

Layered substrates for films

| | Component | # of layers | Conv. T/t °C./min | Anneal T/t °C./min |
|---|---|---|---|---|
| 1 | | | | |
| 2 | Se | 2 | 170/5 | 550/2 |
| 3 | Se | 4 | 170/2 | 550/2 |
| 4 | Se | 2 | 170/5 | 525/1 |
| 5 | Se | 4 | 170/5 | 550/2 |
| 6 | Se | 2 | 170/5 | 550/1 |
| 7 | Se | 2 | 170/5 | 550/10 |
| 8 | Se | 2 | 170/5 | 550/45 |
| 9 | | | | |
| 10 | Se | 2 | 170/5 | 550/2 |
| 11 | Se | 2 | 170/5 | 550/15 |
| 12 | | | | |
| 13 | | | | |
| 14 | Se | 2 | 170/5 | 550/15 |
| 15 | $[Cu_{0.9}In_{0.7}Ga_{0.3}(Se''Bu)_3(Se^tBu)_{0.9}]_n$/Na | 2 | 300/5 | 550/15 |
| 16 | $[Cu_{0.9}In_{0.7}Ga_{0.3}(Se''Bu)_3(Se^tBu)_{0.9}]_n$/Na | 2 | 300/5 | 550/5 |
| 17 | | | | |
| 18 | | | | |
| 19 | | | | |
| 20 | | | | |
| 21 | | | | |
| 22 | Se | 1 | 170/5 | 525/15 |
| 23 | $Ga(Se''Bu)_3$ | 6 | 400/5 | |
| 24 | $[Cu_{1.1}In_{0.9}Ga_{0.1}(Se''Bu)_3(Se^tBu)_{1.1}]_n$/Na | 25 | 350/5 | |
| 25 | $[Cu_{1.1}In_{0.9}Ga_{0.1}(Se''Bu)_3(Se^tBu)_{1.1}]_n$/Na | 25 | 350/5 | |
| 26 | | | | |
| 27 | | | | |
| 28 | | | | |
| 29 | | | | |
| 30 | | | | |
| 31 | | | | |
| 32 | | | | |
| 33 | $Ga(Se''Bu)_3$ | 1 | 400/5 | |
| 34 | $0.3\ Ga(Se''Bu)_3 + 0.7\ In(Se''Bu)_3$ | 6 | 400/5 | |
| 35 | | | | |
| 36 | $[Cu_{0.5}In_{0.7}Ga_{0.3}(Se''Bu)_3(Se^tBu)_{0.5}]_n$/Na | 5 | 300/5 | 550/10 |
| 37 | $0.3\ Ga(Se''Bu)_3 + 0.7\ In(Se''Bu)_3$ | 6 | 400/5 | 550/15 |
| 38 | $Ga(Se''Bu)_3$ | 6 | 400/5 | 550/15 |
| 39 | $Ga(Se''Bu)_3$ | 2 | 400/5 | |
| 40 | $0.3\ Ga(Se''Bu)_3 + 0.7\ In(Se''Bu)_3$ | 4 | 400/5 | |
| 41 | $[Cu_{0.5}In_{0.7}Ga_{0.3}(Se''Bu)_3(Se^tBu)_{0.5}]_n$/Na | 8 | 300/5 | |
| 42 | $[Cu_{1.1}In_{0.9}Ga_{0.1}(Se''Bu)_3(Se^tBu)_{1.1}]_n$/Na | 8 | 300/5 | |
| 43 | $[Cu_{1.1}In_{0.9}Ga_{0.1}(Se''Bu)_3(Se^tBu)_{1.1}]_n$ | 8 | 300/5 | |
| 44 | | | | |
| 45 | Se | 1 | 170/5 | 550/5 |
| 46 | $Ga(Se''Bu)_3$ | 6 | 400/5 | |
| 46 | $Ga(Se''Bu)_3$ | 6 | 400/5 | |
| 47 | $0.3\ Ga(Se''Bu)_3 + 0.7\ In(Se''Bu)_3$ | 8 | 400/5 | |
| 48 | $[Cu_{0.5}In_{0.7}Ga_{0.3}(Se''Bu)_3(Se^tBu)_{0.5}]_n$/Na | 9 | 300/5 | |

TABLE 9-continued

Layered substrates for films

| | Component | # of layers | Conv. T/t °C./min | Anneal T/t °C./min |
|---|---|---|---|---|
| 49 | Se | 1 | 170/10 | 550/5 |
| 50 | Se | 1 | 225/5 | 550/5 |
| 51 | $[Cu_{0.5}In_{1.0}(Se''Bu)_3(Se^tBu)_{0.5}]_n$ | 1 × 4 | 300/5 | |
| 52 | $[Cu_{0.5}In_{1.0}(Se''Bu)_3(Se^tBu)_{0.5}]_n$ | 1 × 4 | 300/5 | |
| 53 | $[Cu_{0.5}In_{1.0}(Se''Bu)_3(Se^tBu)_{0.5}]_n$ | 1 × 4 | 300/5 | |
| 54 | Se | 2 | 170/3 | 550/5 |
| 55 | | | | |
| 56 | | | | |
| 57 | $[Cu_{1.5}In_{1.0}(Se''Bu)_3(Se^tBu)_{1.5}]_n$ | 9 | 300/5 | 550/15 |
| 58 | $In(Se''Bu)_3$ | 4 | 300/5 | |
| 59 | $In(Se^sBu)_3$ | 2 | 300/5 | |
| 60 | Se (cover) | 1 | 170/5 | 550/5 |
| 61 | $^tBu_2Se_2$ ink | 1 × 7 | UV/5 | 550/15 |
| 62 | | | | |
| 63 | | | | |

TABLE 10

Layered substrates for films

| | Component | # of layers | Conv. T/t °C./min | Anneal T/t °C./min |
|---|---|---|---|---|
| 1 | | | | |
| 2 | | | | |
| 3 | | | | |
| 4 | | | | |
| 5 | | | | |
| 6 | | | | |
| 7 | | | | |
| 8 | | | | |
| 9 | | | | |
| 10 | | | | |
| 11 | | | | |
| 12 | | | | |
| 13 | | | | |
| 14 | | | | |
| 15 | | | | |
| 16 | | | | |
| 17 | | | | |
| 18 | | | | |
| 19 | | | | |
| 20 | | | | |
| 21 | | | | |
| 22 | | | | |
| 23 | Se | 1 | 170/5 | 550/15 |
| 24 | Se | 2 | 170/5 | 550/15 |
| 25 | Se | 2 | 170/5 | 550/15 |
| 26 | | | | |
| 27 | | | | |
| 28 | | | | |
| 29 | | | | |
| 30 | | | | |
| 31 | | | | |
| 32 | | | | |
| 33 | Se | 2 | 170/5 | 550/2 |
| 34 | Se | 2 | 170/5 | 550/2 |
| 35 | | | | |
| 36 | | | | |
| 37 | | | | |
| 38 | | | | |
| 39 | Se | 2 | 170/5 | 550/15 |
| 40 | Se | 2 | 170/5 | 550/15 |
| 41 | Se | 5 | 170/5 | 550/15 |
| 42 | Se | 2 | 170/5 | 550/15 |
| 43 | Se | 2 | 170/5 | 550/15 |
| 44 | | | | |
| 45 | Se | 1 | 170/5 | 550/5 |
| 46 | Se | 2 | 170/5 | 550/2 |
| 46 | Se | 2 | 170/5 | 550/15 |

TABLE 10-continued

Layered substrates for films

| | Component | # of layers | Conv. T/t °C./min | Anneal T/t °C./min |
|---|---|---|---|---|
| 47 | Se | 2 | 170/5 | 550/15 |
| 48 | Se | 2 | 170/5 | 550/15 |
| 49 | Se | 1 | 170/10 | 550/5 |
| 50 | Se | 1 | 225/5 | 550/5 |
| 51 | Se | 1 × 3 | 170/5 | 550/15 |
| 52 | Se | 1 × 3 | 170/5 | 550/15 |
| 53 | Se | 1 × 3 | 170/5 | 550/15 |
| 54 | | | | |
| 55 | | | | |
| 56 | | | | |
| 57 | | | | |
| 58 | Se (cover) | 1 | 170/5 | 525/2 |
| 59 | Se (cover) | 1 | 170/5 | 525/2 |
| 60 | $In(Se^sBu)_3$ | 2 × 2 | 300/5 | 550/5 |
| 61 | | | | |
| 62 | | | | |
| 63 | | | | |

Example 6

Preparation of Monomer Compounds

A monomer compound represented by the formula $Ga(Se''Bu)_3$ was synthesized using the following procedure.

To a 500-mL round bottom Schlenk flask in an inert atmosphere glove box was added $NaSe''Bu$ (28 g, 176 mmol) and THF (200 mL). The flask was then transferred to a Schlenk line and a solution of $GaCl_3$ (10.3 g, 59 mmol) in 20 mL of benzene was then added. The reaction mixture was stirred for 12 h and the volatiles were removed under reduced pressure. The residue was extracted with toluene and filtered. The volatiles from the filtrate were then removed under reduced pressure leaving a colorless oil (23 g, 48 mmol, 83% yield).

NMR: (1H; C6D6): 0.85 (t, $J_{HH}$=7.2 Hz, 9H, $CH_3$); 1.40 (m, 6H, —$CH_2$—); 1.77 (m, 6H, —$CH_2$—); 3.03 (br s, 6H, $SeCH_2$—).

Example 7

A monomer compound represented by the formula $In(Se''Bu)_3$ was synthesized using the following procedure.

To a 500-mL round bottom Schlenk flask in an inert atmosphere glove box was added $InCl_3$ (6.95 g, 31 mmol), $NaSe''Bu$ (15 g, 94 mmol), and THF (200 mL). The reaction mixture was transferred to a Schlenk line and stirred for 12 h. The volatiles were subsequently removed under reduced pressure. The remaining solid residue was dissolved in hot toluene and filtered. The volatiles from the filtrate were removed under reduced pressure and the resulting solid was washed with pentane. The final colorless solid was dried under reduced pressure and isolated (15 g, 29 mmol, 92% yield).

NMR: (1H; C6D6): 0.913 (t, $J_{HH}$=7.2 Hz, 9H, $CH_3$); 1.43 (m, 6H, —$CH_2$—); 1.72 (m, 6H, —$CH_2$—); 2.90 (t, $J_{HH}$=7.2 Hz, 6H, $SeCH_2$—).

Example 8

A range of polymeric molecular precursors shown in Table 11 were synthesized in an inert atmosphere according to the following general procedure. A Schlenk tube was charged in an inert atmosphere glovebox with $M^B(ER)_3$ and $Cu(ER)$. A solvent, typically toluene or benzene, was then added. The Schlenk tube was transferred to a Schlenk line and the reaction mixture was stirred at 25° C. for 1 h. In some cases, the reaction mixture was stirred at about 80° C. for up to 12 h. The solvent was removed under reduced pressure and the product was extracted with pentane. The pentane extract was filtered and the solvent was removed under reduced pressure to afford a yellow to yellow-orange product. The products ranged from being an oil, to being a semi-solid, to being a solid. Yields of 90% or greater were typical.

TABLE 11

Examples of polymeric molecular precursors

| Polymeric Molecular Precursor | Material Target | TGa Yield % | Target % |
|---|---|---|---|
| $[Cu_{1.0}In_{1.0}(Se^sBu)_4]_n$ | $Cu_{1.0}In_{1.0}Se_2$ | 46.6 | 46.5 |
| $[Cu_{1.0}In_{0.9}Ga_{0.1}(Se^sBu)_4]_n$ | $Cu_{1.0}In_{0.9}Ga_{0.1}Se_2$ | 46.3 | 46.2 |
| $[Cu_{1.0}In_{0.8}Ga_{0.2}(Se^sBu)_4]_n$ | $Cu_{1.0}In_{0.8}Ga_{0.2}Se_2$ | 45.2 | 45.9 |
| $[Cu_{0.85}In_{0.7}Ga_{0.3}(Se^sBu)_{3.85}]_n$ | $Cu_{0.85}In_{0.7}Ga_{0.3}Se_2$ | 46.7 | 46.1 |
| $[Cu_{0.90}In_{0.7}Ga_{0.3}(Se^sBu)_{3.90}]_n$ | $Cu_{0.90}In_{0.7}Ga_{0.3}Se_2$ | 47.8 | 45.9 |
| $[Cu_{0.95}In_{0.7}Ga_{0.3}(Se^sBu)_{3.95}]_n$ | $Cu_{0.95}In_{0.7}Ga_{0.3}Se_2$ | 47.4 | 45.7 |
| $[Cu_{1.0}In_{0.9}Ga_{0.1}(Se''Hex)_4]_n$ | $Cu_{1.0}In_{0.9}Ga_{0.1}Se_2$ | 42.8 | 40.0 |
| $[Cu_{1.0}In_{0.7}Ga_{0.3}(Se''Hex)_4]_n$ | $Cu_{1.0}In_{0.7}Ga_{0.3}Se_2$ | 39.5 | 39.3 |
| $[Cu_{1.0}In_{0.3}Ga_{0.7}(Se''Hex)_4]_n$ | $Cu_{1.0}In_{0.3}Ga_{0.7}Se_2$ | 38.0 | 37.9 |
| $[Cu_{1.0}Ga_{1.0}(Se''Hex)_4]_n$ | $Cu_{1.0}Ga_{1.0}Se_2$ | 38.3 | 36.9 |
| $[Cu_{0.85}In_{0.7}Ga_{0.3}(Se''Hex)_{3.85}]_n$ | $Cu_{0.85}In_{0.7}Ga_{0.3}Se_2$ | 40.7 | 39.8 |
| $[Cu_{0.90}In_{0.7}Ga_{0.3}(Se''Hex)_{3.90}]_n$ | $Cu_{0.90}In_{0.7}Ga_{0.3}Se_2$ | 40.3 | 39.6 |
| $[Cu_{1.0}In_{1.0}(Se''Bu)_4]_n$ | $Cu_{1.0}In_{1.0}Se_2$ | 47.2 | 46.5 |
| $[Cu_{1.0}In_{0.7}Ga_{0.3}(Se''Bu)_4]_n$ | $Cu_{1.0}In_{0.7}Ga_{0.3}Se_2$ | 43.8 | 45.5 |
| $[Cu_{1.0}Ga_{1.0}(Se''Bu)_4]_n$ | $Cu_{1.0}Ga_{1.0}Se_2$ | 43.8 | 43.0 |
| $[Cu_{1.0}In_{1.0}(Se''Bu)_3(Se^tBu)]_n$ | $Cu_{1.0}In_{1.0}Se_2$ | 48.8 | 46.6 |
| $[Cu_{1.0}In_{0.9}Ga_{0.1}(Se''Bu)_3(Se^tBu)]_n$ | $Cu_{1.0}In_{0.9}Ga_{0.1}Se_2$ | 49.3 | 46.2 |
| $[Cu_{1.0}In_{0.75}Ga_{0.25}(Se''Bu)_3(Se^tBu)]_n$ | $Cu_{1.0}In_{0.75}Ga_{0.25}Se_2$ | 47.3 | 45.7 |
| $[Cu_{0.85}In_{0.7}Ga_{0.3}(Se''Bu)_3(Se^tBu)_{0.85}]_n$ | $Cu_{0.85}In_{0.7}Ga_{0.3}Se_2$ | 46.4 | 46.1 |
| $[Cu_{0.90}In_{0.7}Ga_{0.3}(Se''Bu)_3(Se^tBu)_{0.90}]_n$ | $Cu_{0.90}In_{0.7}Ga_{0.3}Se_2$ | 46.5 | 45.9 |
| $[Cu_{1.0}Ga_{1.0}(Se^tBu)_{4.0}]_n$ | $Cu_{1.0}Ga_{1.0}Se_2$ | 46.7 | 43.0 |
| $[Cu_{0.95}Ga_{1.0}(Se^sBu)_{3.95}]_n$ | $Cu_{0.95}Ga_{1.0}Se_2$ | 46.9 | 43.1 |
| $[Cu_{1.0}In_{1.0}(Se^sBu)_3(Se^tBu)]_n$ | $Cu_{1.0}In_{1.0}Se_2$ | 45.4 | 46.5 |
| $[Ag_{1.0}In_{0.7}Ga_{0.3}(Se^sBu)_{3.0}(Se^tBu)]_n$ | $Ag_{1.0}In_{0.7}Ga_{0.3}Se_2$ | 50.5 | 47.5 |
| $[Ag_{1.0}In_{1.0}(Se''Hex)_4]_n$ | $Ag_{1.0}In_{1.0}Se_2$ | 44.5 | 43.3 |
| $[Cu_{0.5}Ag_{0.5}In_{1.0}(Se^sBu)_4]_n$ | $Cu_{0.5}Ag_{0.5}In_{1.0}Se_2$ | 49.6 | 48.1 |
| $[Cu_{0.7}Ag_{0.1}In_{0.7}Ga_{0.3}(Se^sBu)_{3.8}]_n$ | $Cu_{0.7}Ag_{0.1}In_{0.7}Ga_{0.3}Se_2$ | 51.0 | 47.2 |

TABLE 11-continued

Examples of polymeric molecular precursors

| Polymeric Molecular Precursor | Material Target | TGa Yield % | Target % |
|---|---|---|---|
| $[Cu_{0.8}Ag_{0.2}In_{1.0}(Se^sBu)_4]_n$ | $Cu_{0.8}Ag_{0.2}In_{1.0}Se_2$ | 46.2 | 47.2 |
| $[Cu_{0.2}Ag_{0.8}In_{1.0}(Se^sBu)_4]_n$ | $Cu_{0.2}Ag_{0.8}In_{1.0}Se_2$ | 50.2 | 49.0 |
| $[Cu_{0.5}Ag_{0.5}In_{0.5}Ga_{0.5}(Se^sBu)_4]_n$ | $Cu_{0.5}Ag_{0.5}In_{0.5}Ga_{0.5}Se_2$ | 47.8 | 46.5 |
| $[Cu_{0.85}Ag_{1.1}In_{0.7}Ga_{0.3}(Se^sBu)_{3.95}]_n$ | $Cu_{0.85}Ag_{0.1}In_{0.7}Ga_{0.3}Se_2$ | 46.8 | 46.1 |
| $[Cu_{0.5}Ag_{0.5}In_{0.7}Ga_{0.3}(Se^sBu)_4]_n$ | $Cu_{0.5}Ag_{0.5}In_{0.7}Ga_{0.3}Se_2$ | 48.5 | 47.2 |
| $[Cu_{0.8}Ag_{0.05}In_{0.7}Ga_{0.3}(Se^sBu)_{3.85}]_n$ | $Cu_{0.8}Ag_{0.05}In_{0.7}Ga_{0.3}Se_2$ | 46.0 | 46.3 |
| $[Ag_{1.0}Al_{1.0}(Se^sBu)_4]_n$ | $Ag_{1.0}Al_{1.0}Se_2$ | 41.4 | 43.2 |
| $[Ag_{1.0}In_{0.7}Al_{0.3}(Se^sBu)_4]_n$ | $Ag_{1.0}In_{0.7}Al_{0.3}Se_2$ | 50.3 | 47.9 |
| $[Cu_{0.9}Ga_{0.7}Al_{0.3}(Se^sBu)_{3.9}]_n$ | $Cu_{0.9}Ga_{0.7}Al_{0.3}Se_2$ | 41.0 | 42.2 |
| $[Cu_{1.0}Al_{1.0}(Se^sBu)_4]_n$ | $Cu_{1.0}Al_{1.0}Se_2$ | 38.2 | 39.2 |
| $[Cu_{0.5}Ag_{0.5}In_{0.7}Al_{0.3}(Se^sBu)_4]_n$ | $Cu_{0.5}Ag_{0.5}In_{0.7}Al_{0.3}Se_2$ | 46.0 | 46.3 |
| $[Cu_{0.7}Ag_{0.25}In_{0.3}Ga_{0.4}Al_{0.3}(Se^sBu)_{3.95}]_n$ | $Cu_{0.7}Ag_{0.25}In_{0.3}Ga_{0.4}Al_{0.3}Se_2$ | 41.8 | 44.2 |
| $[Cu_{0.9}In_{0.8}Al_{0.2}(Se^sBu)_{3.9}]_n$ | $Cu_{0.9}In_{0.8}Al_{0.2}Se_2$ | 46.5 | 45.6 |
| $[Cu_{1.3}In_{1.0}(Se^nBu)_3(Se^tBu)_{1.3}]_n$ | $Cu_{1.3}In_{1.0}Se_{2.15}$ | 47.5 | 46.9 |

Example 9

Targeting the Stoichiometry of Photovoltaic Absorbers

Figure 17:
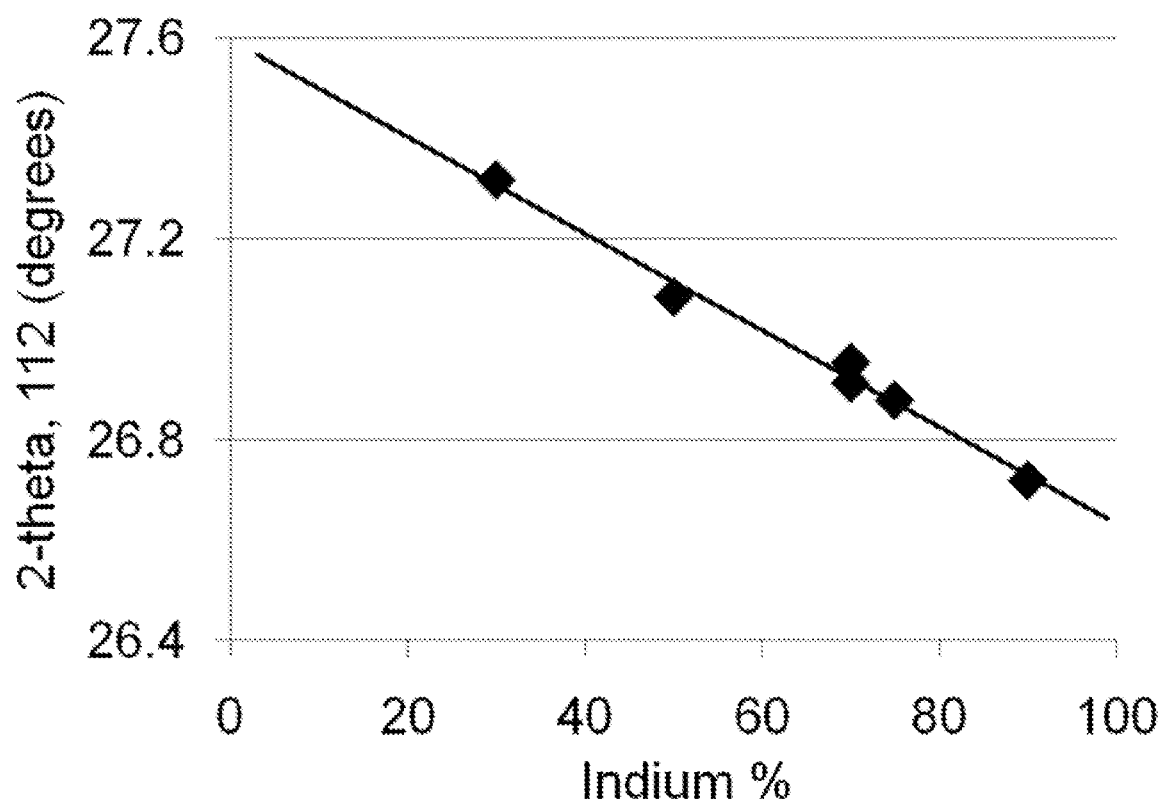
FIG. 17.

Using polymeric precursors of this disclosure, the stoichiometry of a thin film CIGS photovoltaic absorber can be precisely controlled. FIG. 17 shows results of methods for controlling the stoichiometry of the composition of a bulk, crystalline CIGS material. In these results, the ratio of indium to gallium was controlled. FIG. 17 shows an analysis by X-ray diffraction of the structure of the crystalline phase of bulk CIGS materials made with various polymeric precursors. The ratio of indium to gallium in the crystals of CIGS materials was detected by the relative positions of the 2-theta-(112) peaks in the X-ray diffraction patterns. The CIGS materials were each made from a polymeric precursor having a percent indium corresponding to the value on the x-axis, where percent indium is 100*In/(In+Ga). In other words, the data shows that the stoichiometry of the polymeric precursor can be used to control the stoichiometry of the resulting CIGS material prepared directly from the polymeric precursor. Thus, the stoichiometry of a CIGS thin film solar cell absorber can be targeted with a polymeric precursor.

What is claimed is:

1. A process for making a thin film solar cell on a substrate comprising:
   (a) providing a thin film coated on a first substrate;
   (b) depositing a selenium layer onto a second substrate, wherein the selenium layer is formed by depositing elemental selenium or a selenium-containing compound;
   (c) arranging the first and second substrates so that the thin film is parallel to, and facing the selenium layer, wherein the thin film and the selenium layer are spaced apart, and wherein the space between the thin film and the selenium layer is occupied by vacuum or a gas; and
   (d) heating the first and second substrates.

2. The process of claim 1, wherein the thin film is CIS or CIGS.

3. The process of claim 1, wherein the thin film is CIGS film that is deficient in copper atoms.

4. The process of claim 1, wherein the thin film is CIGS film that contains sodium ions.

5. The process of claim 1, wherein the thin film is spaced apart from the selenium layer by a distance of from 10 to 3000 micrometers.

6. The process of claim 1, wherein the thin film is spaced apart from the selenium layer by a distance of from 10 to 500 micrometers.

7. The process of claim 1, wherein the thin film is spaced apart from the selenium layer by a distance of from 50 to 150 micrometers.

8. The process of claim 1, wherein the selenium layer is deposited by vapor deposition.

9. The process of claim 1, wherein the selenium layer is deposited by spraying, printing or coating a selenium-containing ink.

10. The process of claim 1, wherein the heating step is at a temperature of from 300° C. to 650° C.

11. The process of claim 1, wherein the heating step is at a temperature of from 300° C. to 650° C. for a time period of from 10 seconds to 10 minutes.

12. The process of claim 1, wherein the heating step is at a temperature of from 450° C. to 550° C. for a time period of from 30 seconds to five minutes.

13. The process of claim 1, wherein the heating step anneals the thin film.

14. The process of claim 1, wherein the thin film contains from 0.01 to 2.0 atom percent alkali ions.

15. The process of claim 1, wherein the thin film contains from 0.1 to 1.0 atom percent alkali ions.

16. The process of claim 1, wherein the space between the thin film and the selenium layer is enclosed.

17. The process of claim 1, wherein the thin film is crystalline.

18. The process of claim 1, wherein the thin film is coated on a back contact that contains molybdenum.

19. The process of claim 1, wherein the back contact is conducting.

* * * * *